United States Patent [19]
Akiyama et al.

[11] Patent Number: 6,008,877
[45] Date of Patent: Dec. 28, 1999

[54] LIQUID CRYSTAL DISPLAY HAVING MULTILAYERED ELECTRODES WITH A LAYER ADHESIVE TO A SUBSTRATE FORMED OF INDIUM TIN OXIDE

[75] Inventors: Hisashi Akiyama; Mitsuhiro Shigeta, both of Kashiwa; Kazuyuki Kishimoto, Tenri; Shuji Miyoshi, Kashiwa, all of Japan

[73] Assignee: Sharp Kabushiki Kaisha, Osaka, Japan

[21] Appl. No.: 08/976,241

[22] Filed: Nov. 21, 1997

[30] Foreign Application Priority Data

Nov. 28, 1996 [JP] Japan .................................. 8-318262
Nov. 28, 1996 [JP] Japan .................................. 8-318283

[51] Int. Cl.⁶ .......................... G02F 1/1343; H01L 23/48
[52] U.S. Cl. .......................... 349/147; 349/148; 349/139; 257/753
[58] Field of Search .................................. 349/147, 148, 349/152, 139; 257/753, 757

[56] References Cited

U.S. PATENT DOCUMENTS

| | | |
|---|---|---|
| 4,728,176 | 3/1988 | Tsuboyama et al. . |
| 5,163,220 | 11/1992 | Zeto et al. . |
| 5,252,196 | 10/1993 | Sonnenberg et al. ............ 205/296 |
| 5,348,828 | 9/1994 | Murata et al. ............ 349/148 |
| 5,358,810 | 10/1994 | Yoshino ............ 349/148 |
| 5,467,882 | 11/1995 | Ahn . |
| 5,783,316 | 7/1998 | Colella et al. ............ 428/660 |
| 5,847,793 | 12/1998 | Itoh ............ 349/148 |

FOREIGN PATENT DOCUMENTS

| | | |
|---|---|---|
| 0445881 | 9/1991 | European Pat. Off. . |
| 0720038 | 7/1996 | European Pat. Off. . |
| 0795776 | 9/1997 | European Pat. Off. . |
| 57-060313 | 4/1982 | Japan . |
| 62-034130 | 2/1987 | Japan . |
| 1-280724 | 11/1989 | Japan . |
| 2-063019 | 3/1990 | Japan . |
| 7005450 | 1/1995 | Japan . |

OTHER PUBLICATIONS

Homma et al., J. Electrochem. Soc., vol. 140, No. 8, Aug. 1993, pp. 2410–2414, "A Selective SiO₂ Film–Formation Technology Using Liquid–Phase Deposition for Fully Planarized Multilevel Interconnections".

Clark et al., Applied Physics Letters 36(11), Jun. 1, 1980, pp. 899–901, "Submicrosecond Bistable Electro–Optic Switching in Liquid Crystals".

U.S. Patent application No. 08/744,171; filed on Nov. 5, 1996; entitled: "Liquid Crystal Display Apparatus and Fabrication Process Thereof".

European Search Report related to European Patent Application No. 97309628.2 dated Nov. 19, 1998.

*Primary Examiner*—William L. Sikes
*Assistant Examiner*—Kari M. Horney
*Attorney, Agent, or Firm*—Renner, Otto, Boisselle & Sklar, P.L.L.

[57] ABSTRACT

A liquid crystal display element comprising a light transmissive substrate (#34), insulating films (#52) formed on the substrate and transparent electrodes (#5) arranged to form predetermined patterns on the insulating films. Conductive lines (#51) are conductively in contact with the transparent electrodes, and each conductive line includes a first layer (#51a) made of indium tin oxide which is adhesive to the substrates. The conductive lines are arranged between the insulating films to form a plane surface with the insulating films.

16 Claims, 29 Drawing Sheets

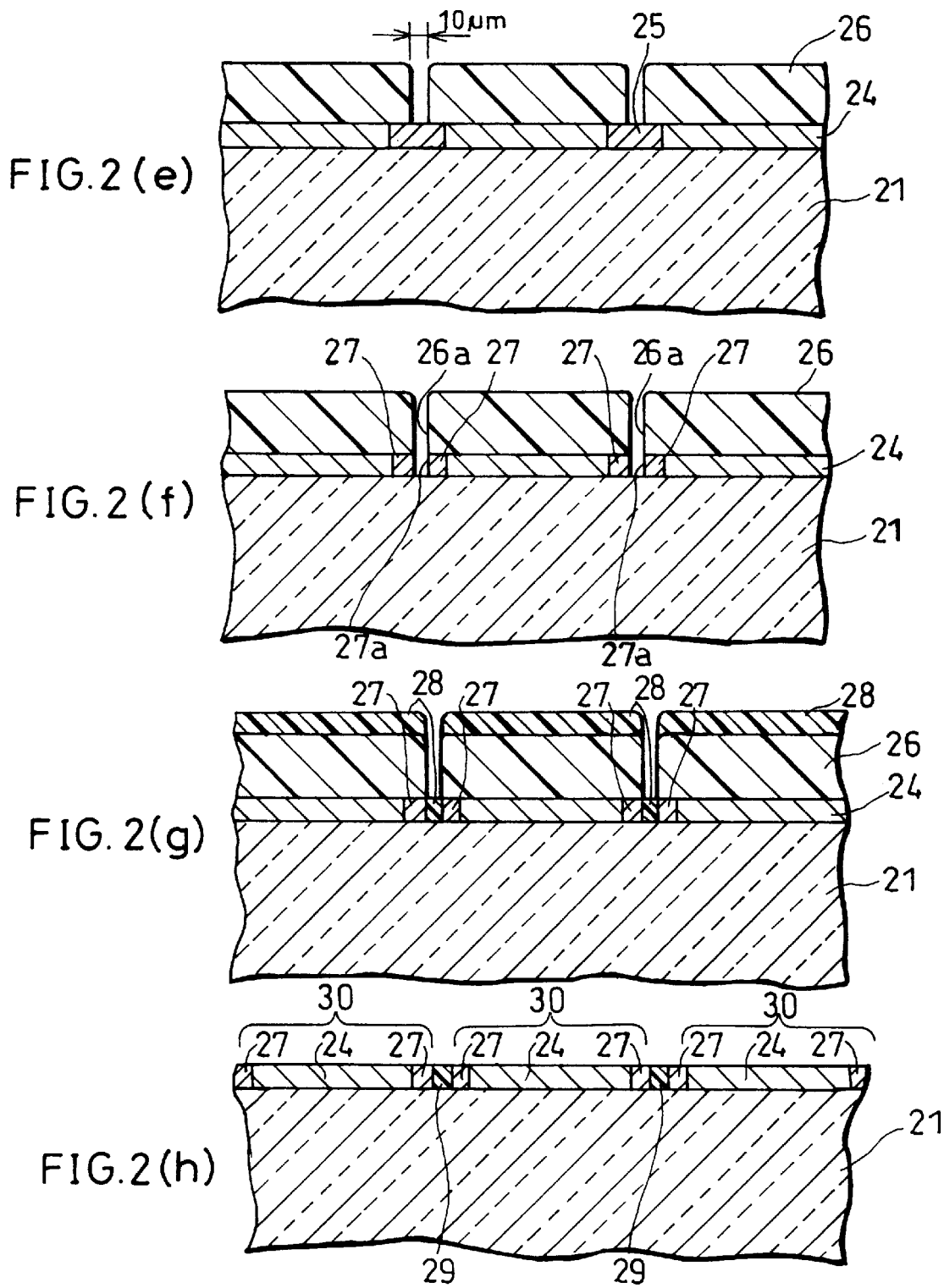

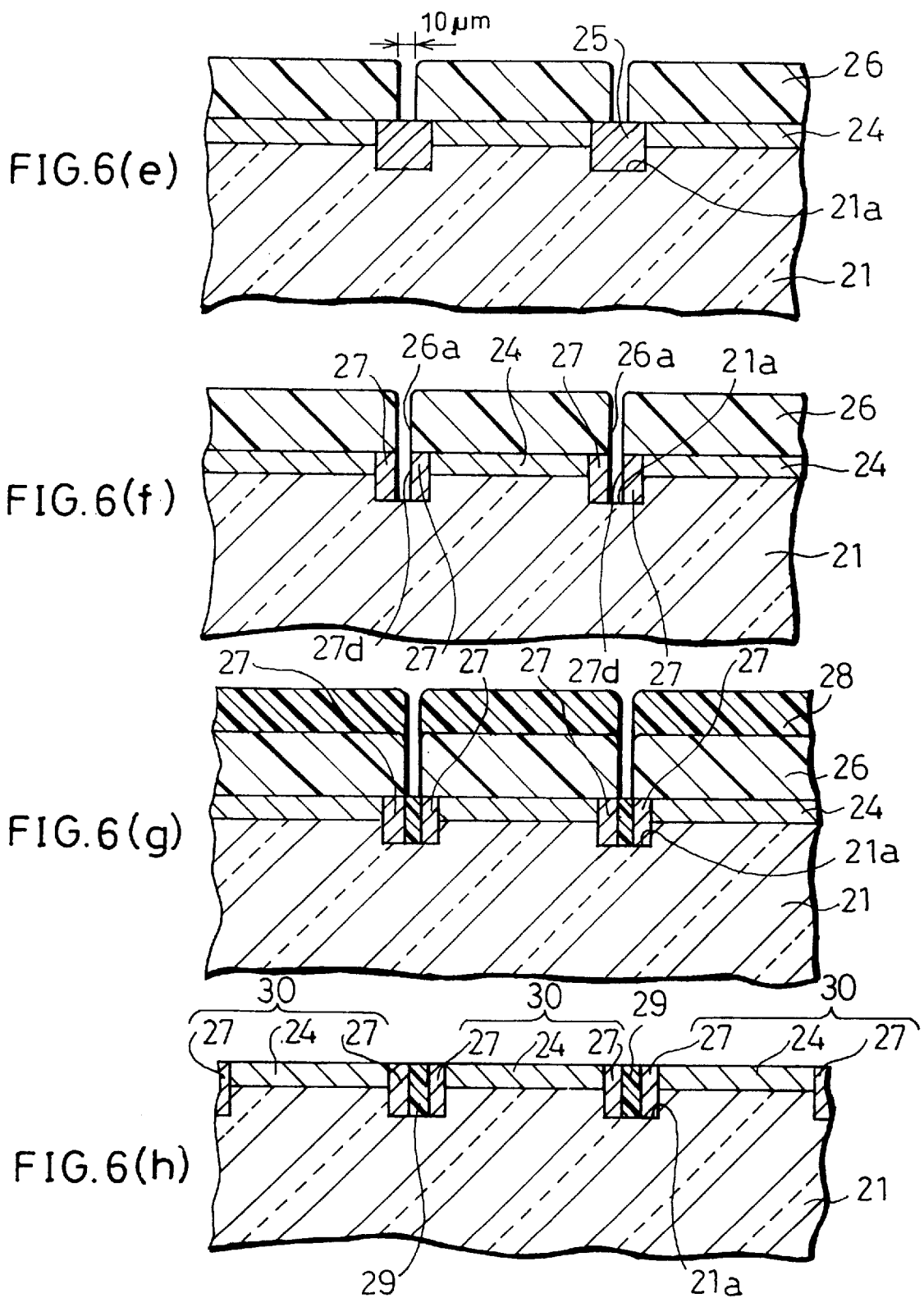

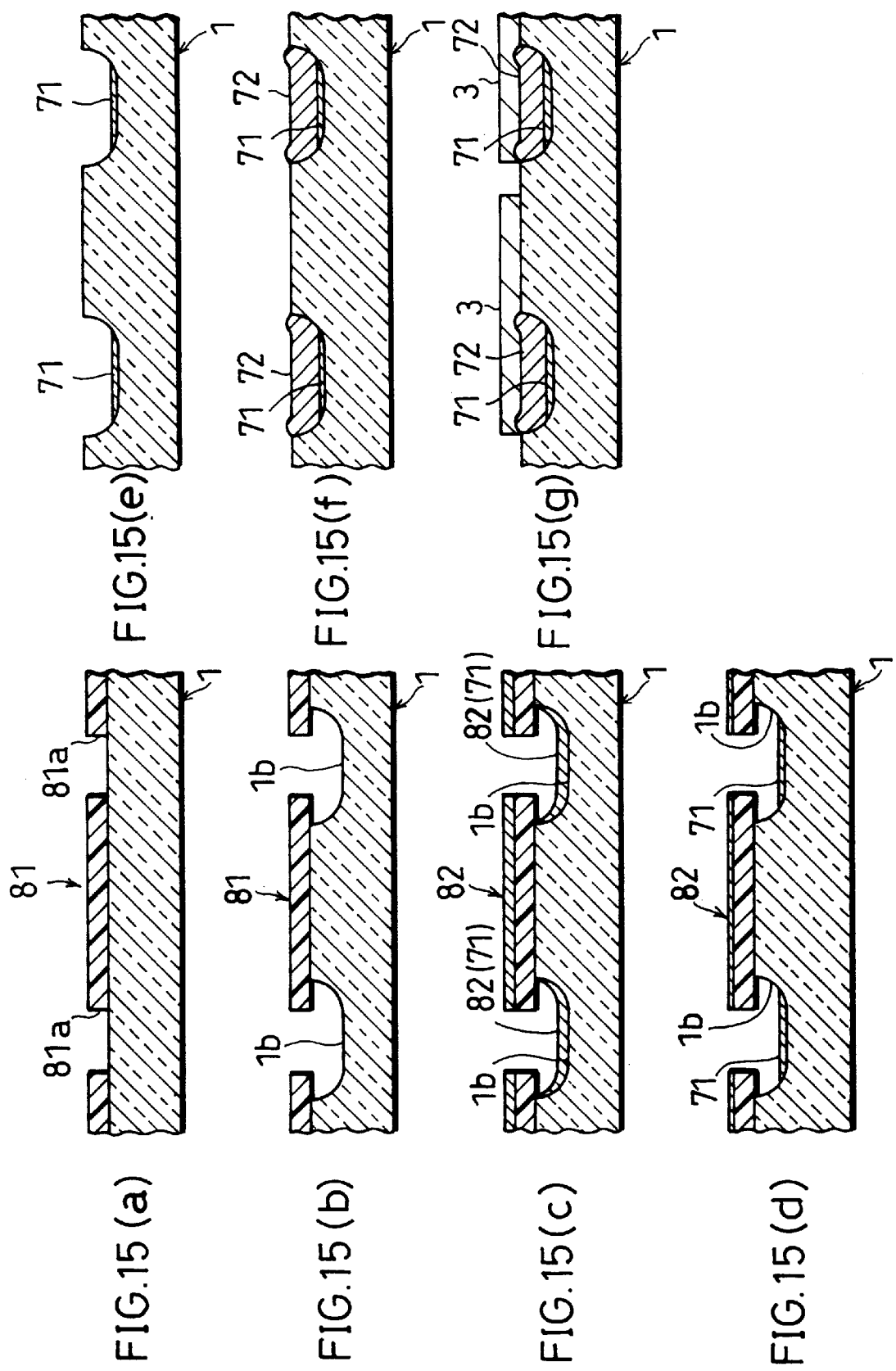

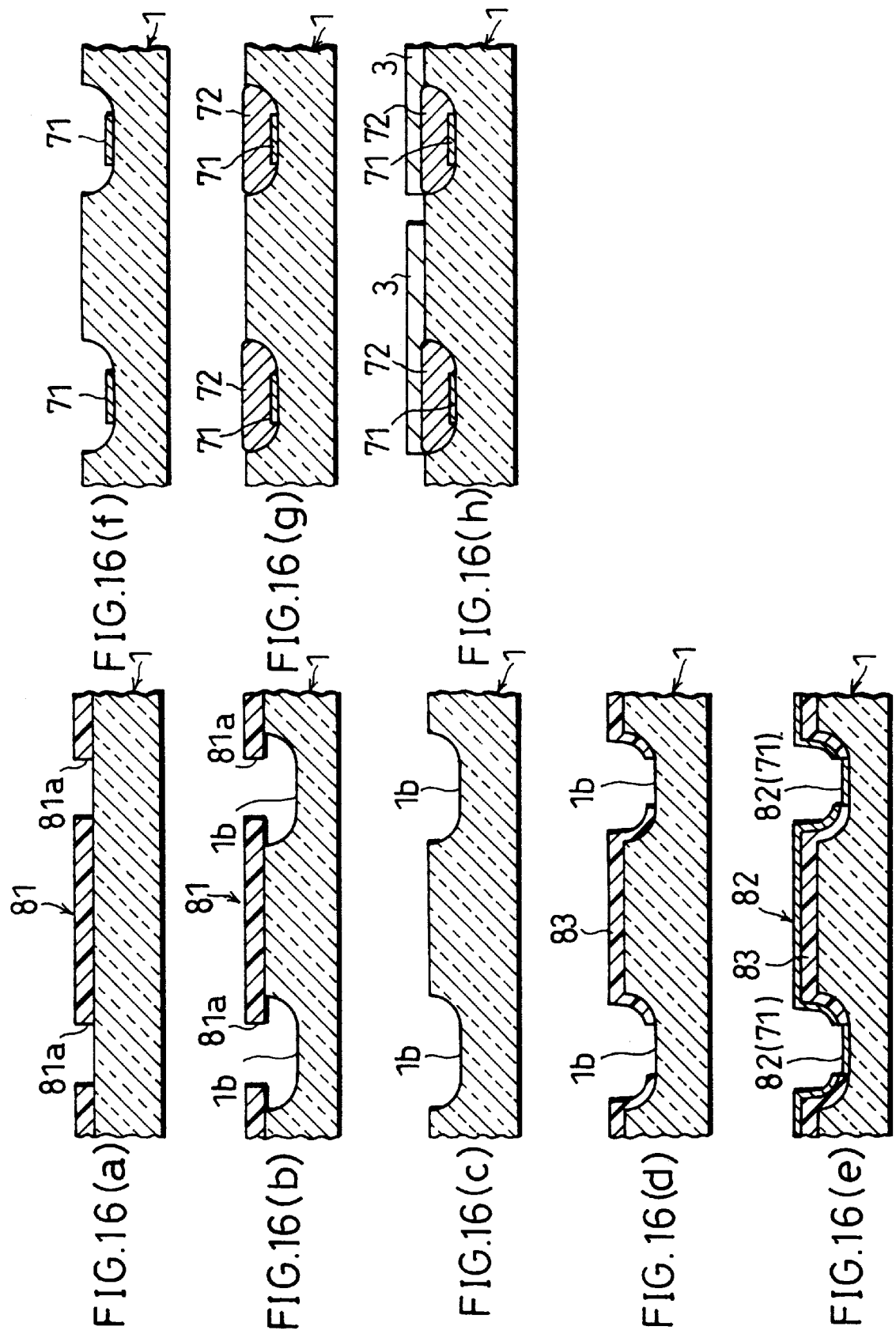

LIQUID CRYSTAL DISPLAY HAVING MULTILAYERED ELECTRODES WITH A LAYER ADHESIVE TO A SUBSTRATE FORMED OF INDIUM TIN OXIDE

FIELD OF THE INVENTION

The present invention relates to liquid crystal display elements having conductive lines for lowering the wiring resistance of electrodes for applying a voltage to pixels, and more particularly to liquid crystal display elements capable of providing a large-capacity high-definition display, and a method of fabricating a light-transmissive electrode substrate suitable for use in such liquid crystal display elements.

BACKGROUND OF THE INVENTION

In general, a liquid crystal display device includes a liquid crystal cell formed by a pair of light-transmissive substrates placed to face each other and a liquid crystal layer formed between the light-transmissive substrates. Each light-transmissive substrate is provided with transparent electrodes arranged to form predetermined patterns, for applying a voltage to the liquid crystal layer.

The use of such a liquid crystal display device as the display of visual equipment such as television sets and information devices like computers is on the increase. Accordingly, there is a great demand for large-area displays recently, and developments of such a display have been actively carried out.

Liquid crystal display devices employing the STN (super-twisted nematic) mode and the TN (twisted nematic) mode have been known. In resent years, as a liquid crystal display device capable of achieving a display of higher definition and larger capacity, liquid crystal display devices using ferroelectric liquid crystals have been the focus of attention.

As taught by N. A. Clark and S. T. Lagerwall in Applied Physics Letters 36, pp. 899–901 (1980), ferroelectric liquid crystals have excellent characteristics, including a memory effect, high-speed response, and wide viewing angle. Moreover, ferroelectric liquid crystals achieve a high-definition, large-capacity display by a simple matrix system which is used in conventional TN-mode liquid crystal display devices and STN-mode liquid crystal display devices. The simple matrix system is used with a known structure where an electrode substrate having scanning electrodes formed by arranging transparent conductive films to form stripe patterns on a light-transmissive substrate and an electrode substrate having signal electrodes formed by producing stripe patterns using transparent conductive films on a light-transmissive substrate are disposed to face each other so that the scanning electrodes and the signal electrodes form a matrix pattern.

FIG. 18 is a sectional view showing the structure of a liquid crystal display element (liquid crystal cell) used in a conventional liquid crystal display device using a ferroelectric liquid crystal. As illustrated in FIG. 18, the conventional liquid crystal cell includes two pieces of glass substrates 171, 172 as opposed light-transmissive substrates. On a surface of the glass substrate 171, a plurality of transparent signal electrodes 173 made of a material like ITO (indium tin oxide) are arranged parallel to each other as transparent conductive films. Formed on the signal electrode 173 is a transparent insulating film 174 made of a material like silicone dioxide ($SiO_2$).

On the other hand, on a surface of the glass substrate 172, a plurality of scanning electrodes 175 made of a material like ITO are placed parallel to each other as transparent conductive films so that the scanning electrodes 175 cross at right angles with the signal electrodes 173. The scanning electrode 175 is covered with an insulating film 176 formed from a material like $SiO_2$. Alignment films 177, 178 which have undergone a uniaxial aligning treatment, for example, rubbing, are placed on the insulating films 174, 176, respectively.

The glass substrates 171, 172 are fastened together with a sealing material 180, and the space formed therebetween is filled with a ferroelectric liquid crystal 179. The ferroelectric liquid crystal 179 is injected through an inlet (not shown) formed in the sealing material 180, and the inlet is closed with a closing material 184 after the injection of the ferroelectric liquid crystal 179.

The glass substrates 171, 172 are sandwiched between polarizing plates 181, 182 which are positioned so that the polarization axes thereof cross each other at right angles. Moreover, spacers 183 are placed between the alignment films 177, 178, if necessary.

As illustrated in FIG. 19, a ferroelectric liquid crystal molecule 91 has a spontaneous polarization 92 in a direction orthogonal to the molecular long axis direction. The molecule 91 receives a force proportional to the vector product of the spontaneous polarization 92 and an electric field produced by a drive voltage that is applied across the signal electrode 173 and the scanning electrode 175, and moves on the surface of a conical locus 93.

Therefore, a viewer sees as if the molecule 91 switches between positions $P_a$ and $P_b$ of the axes of a liquid crystal locus as shown in FIG. 20. For example, if the polarizing plates 181, 182 are disposed so that their polarization axes coincide with the A–A' line and the B–B' line shown by the arrows in FIG. 20, respectively, a dark viewing field is obtained when the molecule 91 is in the position $P_a$, and a bright viewing field is produced by double refraction when the molecule 91 is in the position $P_b$.

The alignment states of the molecule 91 in the positions $P_a$ and $P_b$ are equivalent in elastic energy. Therefore, when the molecules 91 are aligned in a state, i.e., either the position $P_a$ or $P_b$, by the application of an electric field, an optical state corresponding to the alignment state, i.e., a dark viewing field or a bright viewing field, is maintained even after the removal of the electric field. This is called a "memory effect". The memory effect is a unique characteristic of ferroelectric liquid crystal and is not associated with nematic liquid crystal.

Consequently, a display with higher definition and larger capacity can be provided by a simple matrix liquid crystal display device using ferroelectric liquid crystal having the memory effect and the high-speed response characteristic produced by the spontaneous polarization 92.

However, when adopting the ferroelectric liquid crystal into the simple matrix system, if a large-capacity, high-definition ferroelectric liquid crystal display device is fabricated by forming electrodes using only transparent conductive films of a material like ITO, the length of the electrode formed by the transparent conductive film becomes longer as the display area increases, resulting in a higher electrode resistance. Consequently, driving problems, such as generation of heat, delay of signals, rounding of the waveform of a signal applied to the pixel area, occur.

In short, the conventional TN liquid crystal display devices and STN liquid crystal display devices employ a multiplexing driving scheme in which a high-contrast display is obtained by scanning a plurality of frames with the periodical application of drive voltage. Therefore, degradation of display quality due to the delay of the applied voltage causes a little problem. However, in the case of a ferroelectric liquid crystal display device, it is necessary to form a high-contrast display by scanning one frame. Thus, the delay of the applied voltage would cause a problem.

For the reasons mentioned above, a large-area ferroelectric liquid crystal display device has been fabricated according to a method in which the overall electrode resistance is lowered by forming metal electrodes using a low-resistant metal film in a longitudinal direction of the scanning electrodes 175 and of the signal electrodes 173 made of transparent conductive films.

The requirements to be satisfied by the metal electrodes are that the metal electrodes are formed along the longitudinal direction of the transparent electrodes (the scanning electrodes 175 and the signal electrodes 173) which are formed by arranging the transparent conductive films to form stripe patterns, and that the metal electrodes are in contact with the transparent electrodes. The methods used for the formation of the metal electrodes are roughly classified into two types.

A first method is a method in which transparent electrodes are arranged to form stripe patterns on a transparent substrate (light-transmissive substrate), and metal electrodes are formed on the transparent electrodes so that the metal electrodes and the transparent electrodes are closely connected to each other. Three examples of the first method are as follows. (1) As shown in FIG. 21, a metal electrode 103 is formed on each of transparent electrodes 102, which are disposed to form stripe patterns on a light-transmissive substrate 101, along a side edge 102b of an upper surface 102a of the transparent electrode 102. (2) As shown in FIG. 22, a metal electrode 103 is formed on each of the transparent electrodes 102 so as to cover the side edge 102b of the upper surface 102a of the transparent electrode 102 and a side face 102c of the transparent electrode 102 (see Japanese Publication of Unexamined Patent Application No. 1-280724/1989). (3) As shown in FIG. 23, the transparent electrodes 102 are brought into contact with the metal electrodes 103 formed on an insulating film 104 coating the transparent electrodes 102, through long thin through-holes 105 produced in the insulating film 104 (see Japanese Publication of Unexamined Patent Application No. 1-280724/1989).

However, in the methods of (1) to (3), the metal electrode 103 protrudes from the upper surface 102a of the transparent electrode 102 by at least an amount equal to the thickness thereof.

When a ferroelectric liquid crystal element is used for a large-area panel, a necessary thickness of the metal electrode 103 as a low-resistant conductive film for reducing the delay of the applied voltage is preferably not less than 0.1 $\mu$m, and more preferably not less than 0.4 $\mu$m. Therefore, the thickness of the protruding portion of the metal electrode 103 from the upper surface 102a of the transparent electrode 102 needs to be at least 0.1 $\mu$m, and increased with an increase in the area of the panel.

In order to realize a surface stabilized ferroelectric liquid crystal element, it is preferred to arrange the space between the facing electrode substrates to be about 1.0 $\mu$m to 3 $\mu$m. Hence, as the panel becomes larger in size, the possibility that the metal electrode 103 protruding from the upper surface 102a of the transparent electrode 102 comes into contact with the metal electrode 103 on the opposite electrode substrate increases.

Moreover, since the metal electrode 103 protrudes from the upper surface 102a of the transparent electrode 102, the surfaces of the insulating film and the alignment film covering the metal electrode 103 become uneven. As a result, the alignment of liquid crystal is disordered at the uneven surfaces, and the display characteristics lack uniformity.

In the second method, metal electrodes are arranged to form stripe patterns on a transparent substrate, and then transparent electrodes are formed on the metal electrodes so that the transparent electrodes and the metal electrodes are conductively in contact with each other. An example of the second method is as follows. As shown in FIG. 24, the metal electrodes 103 are arranged to form stripe patterns on the transparent substrate 101, and then the transparent electrodes 102 are disposed to form stripe patterns with the insulating film 104 between the metal electrodes 103 and the transparent electrodes 102 so that the metal electrodes 103 and the transparent electrodes 102 are in contact with each other through the through-holes 105 formed in the insulating film 104 (Japanese Publication of Unexamined Patent Application No. 63019/1990 (Tokukaihei 2-63019). In this method, since the thickness of the metal electrodes 103 can be increased compared to the first method, it is possible to further lower the electrode resistance.

However, the second method requires the processes of forming the insulating film 104 between the metal electrodes 103 and the transparent electrodes 102, and forming in the insulating film 104 the through-holes 105 for connecting the metal electrodes 103 and transparent electrodes 102.

Moreover, when the second method is adopted, the metal electrode 103 functions as a black matrix. In this case, regions A shown by cross hatching are covered with the metal electrodes 103 to prevent leakage of light from the spaces between adjacent transparent electrodes 102. Therefore, for the formation of the metal electrodes 103, it is necessary to consider pattern errors, and produce metal electrodes 103 wider than the regions A. As a result, overlapped sections where the transparent electrodes 102 overlap the metal electrodes 103 through the insulating film 104 are present. Therefore, although the insulating film 104 is present between the metal electrodes 103 and the transparent electrodes 102, the second method suffers from a problem that there is a strong possibility of a leakage current flowing between a metal electrode 103 and a transparent electrode 102 which is located next to a transparent electrode 102 corresponding to the metal electrode 103.

It would be possible to solve the drawbacks of the first and second methods by burying metal lines in the light-transmissive substrate. For example, Japanese Publication of Unexamined Patent Application No. 127494/1997 (U.S. patent application Ser. No. 08/744,171) discloses forming grooves on the light-transmissive substrate by etching, and burying conductors in the grooves to form a plane surface with the light-transmissive substrate. By burying metal lines as the conductors in the light-transmissive substrate, it is possible to overcome the above-mentioned drawbacks.

However, when burying the metal lines in the light-transmissive substrate using the technique disclosed in the Japanese Publication of Unexamined Patent Application No. 127494/1997, the thickness of the metal line is at most 1 $\mu$m. In this case, the resistance is too high and the thickness of the metal lines is too small for the fabrication of large-area liquid crystal panel.

In either case, in order to drive a large liquid crystal display at high speeds, it is necessary to lower the electrode resistance so as to prevent a decrease of the voltage applied to liquid crystal in the pixel area. Therefore, the thickness of the metal electrodes 103 needs to made as thick as possible. However, when metal lines with a thickness of not less than 1 μm are formed only by sputtering or vacuum evaporation, a peeled-off layer occurs and the metal surface becomes cloudy. Additionally, with regard to the deposition rate and cost, these methods are not suitable for practical applications.

In order to avoid the above-mentioned problems, it is necessary to add a process for increasing the film thickness, for example, plating. By employing a plating process, it is possible to increase the thickness of the metal lines. However, when the plating process is employed, it is extremely difficult to bury the metal lines in the light-transmissive substrate so as to form a plane surface with the light-transmissive substrate of Japanese Publication of Unexamined Patent Application No. 127494/1997. Meanwhile, in the structures shown in FIGS. 21 to 23, the metal electrodes 103 are formed on the transparent electrodes 102. In this case, when the thickness of the metal electrodes 103 is increased, it is more difficult to produce an electrode substrate with a flat surface.

Moreover, since the metal line is used as an auxiliary line of the transparent electrode, adhesion between the metal line and the light-transmissive substrate made of, for example, glass, and transparent electrode is required. Furthermore, for example, when other layer like a color-filter layer is provided on the light-transmissive substrate, adhesion between the metal line and the color-filter layer is required. However, when the metal line is made of a so-called low-resistant metal such as Cu (copper) and Al (aluminum), the adhesion between such a metal and the light-transmissive substrate and color-filter layer is not good. Therefore, a peeled-off layer that is a cause of a disconnection of the metal lines and a leakage current tends to occur at the contact sections of the metal lines and the light-transmissive substrate or the color-filter layer.

In addition, since the metal lines are exposed to various chemicals during etching and the development process of photoresist, the front face and side faces of the metal electrode 103 are readily oxidized or etched. This may cause conducting defects and disconnection of the metal lines. When the metal line is treated at high temperatures, the oxidation of the metal line further proceeds. Moreover, the low-resistant metals such as Cu and Al have extensibility, and are readily scratched in the rubbing process. Such scratches prevent good displays with uniform characteristics.

In order to achieve the above-mentioned structure where the metal lines are buried in the light-transmissive substrate, as illustrated in FIG. 25(*a*), a light-transmissive substrate 111 made of a material like glass and plastic is etched. However, since the light-transmissive substrate 111 does not have a crystalline structure, the light-transmissive substrate 111 is etched in an isotropic manner. Therefore, each of grooves 111*a* formed on the light-transmissive substrate 111 has a curved (tapered) surface on both sides thereof.

When depositing a metal in the grooves 111*a*, since a metal film grows according to the shape of the groove 111*a*, the resultant metal line 112 has protrusions 112*a* at the edges on both sides thereof as shown in FIG. 25(*b*). Namely, it is impossible to produce the metal lines 112 to form a flat surface with the light-transmissive substrate 111.

Furthermore, in this method, as the depth of the grooves 111*a* is increased to form the metal lines 112 with an increased thickness, the tapered faces of the grooves 111*a* become larger. As a result, the protrusions 112*a* also increase.

As a method of solving the problems of the first and second methods, a method proposed in J. Electrochem, Soc., 140, No. 8, August 1993, pp. 2410–2414 may be adopted. In this method, after patterning metal lines on a substrate, $SiO_2$ is deposited on the substrate except the portions where the metal lines are formed by the LPD (liquid-phase deposition) technique so as to flattening the surface of the substrate.

However, in this method, although flat metal lines can be formed, the deposition rate of $SiO_2$ is extremely low (20 nm/h). Therefore, it takes 100 hours to form, for example, a 2-μm-thick film. In addition, since the film grows through a chemical reaction, the temperature of a solution and the concentration of each component of the solution affect the deposition rate. Hence, there is a need to strictly manage the solution used for the formation of the film.

SUMMARY OF THE INVENTION

It is an object of the present invention to provide a liquid crystal display element having a light-transmissive substrate including low-resistant metal lines which form a flat surface with a surface of the light-transmissive substrate without causing unevenness of surfaces that is a cause of disorderly alignment of liquid crystal and are firmly fixed to the light-transmissive substrate, and a method of fabricating transparent electrodes and metal lines on the light-transmissive substrate.

In order to achieve the above object, a first liquid crystal display element of the present invention includes:

a pair of light-transmissive substrates placed to face each other, each of the light-transmissive substrates having thereon transparent electrodes arranged to form stripe patterns and conductive lines which are conductively in contact with the transparent electrodes; and a liquid crystal layer formed between the light-transmissive substrates, wherein each of the conductive lines includes a lowest layer made of a conductive material adhesive to the light-transmissive substrate, and is placed between adjacent transparent electrodes on the light-transmissive substrates so that only a longitudinal side face of the conductive line is in contact with a longitudinal side face of one of the adjacent transparent electrodes.

In this structure, since each conductive line is formed so that only a longitudinal side face of the conductive line is in contact with a longitudinal side face of one of adjacent transparent electrodes, there is no overlapped portion where the conductive line and the transparent electrode are placed one upon another unlike a structure where the conductive line is formed on the transparent electrode. Consequently, the unevenness of the transparent electrode surface and the conductive line surface decreases, thereby reducing the disorderly alignment of liquid crystal caused by such unevenness. As a result, good displays with uniform characteristics are realized, and the display quality is improved significantly.

Moreover, since the lowest layer of the conductive line is made of a conductive material adhesive to the light-transmissive substrate, the conductive line is firmly fixed to the light-transmissive substrate. It is therefore possible to prevent a peeled-off layer at the contact of the light-transmissive substrate and the conductive line.

A method of fabricating an electrode substrate of the first liquid crystal display element, i.e., a light-transmissive substrate having the above-mentioned transparent electrodes and conductive lines, includes steps:

(1) forming a transparent conductive film on a light-transmissive substrate;

(2) depositing a photoresist on the transparent conductive film and patterning the photoresist to form stripe patterns;

(3) etching the transparent conductive film to form transparent electrodes in stripes;

(4) forming on the light-transmissive substrate a conductive material film including a layer adhesive to the light-transmissive substrate without removing the photoresist from the transparent electrodes;

(5) removing the photoresist together with the conductive material film thereon; and (6) forming conductive lines in stripes using another photoresist by etching the conductive material film remaining between the transparent electrodes to form stripe patterns so that each conductive line is in contact with one of adjacent transparent electrodes.

In this method, the transparent electrodes are formed in stripes using a photoresist in steps (2) and (3), and then a metal is deposited on the light-transmissive substrate without removing the photoresist and conductive lines are formed by a lift-off process in step (4). Therefore, pattern errors can never occur. Moreover, with this method, it is possible to fabricate an electrode substrate on which a conductive line is formed between adjacent transparent electrodes so that only a side face of the conductive line is in contact with a side face of one of the adjacent transparent electrodes.

In order to achieve the above object, a second liquid crystal display element of the present invention includes:

a pair of light-transmissive substrates;

insulating films formed discretely on the light-transmissive substrates;

transparent electrodes arranged to form predetermined patterns on the insulating films;

conductive lines which are conductively in contact with the transparent electrodes, each conductive line including a lowest layer made of a conductive material adhesive to the light-transmissive substrate and being arranged between the insulating films so as to form a plane surface with the insulating films; and a liquid crystal layer formed between the light-transmissive substrates placed to face each other.

In this structure, since each conductive line is formed between the insulating films, the unevenness of surface due to the formation of the conductive line is can be reduced. It is therefore possible to reduce the disorderly alignment of liquid crystal caused by such unevenness and significantly improve the display quality. Moreover, since the lowest layer of the conductive line is made of a conductive material adhesive to the light-transmissive-substrate, the conductive line is firmly fixed to the light-transmissive substrate. It is thus possible to prevent a peeled-off layer at the contact between the conductive line and the light-transmissive substrate.

A method of fabricating an electrode substrate of the second liquid crystal display element, i.e., a light-transmissive substrate having the above-mentioned transparent electrodes and conductive lines, includes steps:

(1) forming a film of an insulating material on a light-transmissive substrate;

(2) depositing a photoresist on the insulating material film and patterning the photoresist to form stripe patterns;

(3) etching the insulating material films to form insulating films in stripes;

(4) forming on the light-transmissive substrate a conductive material film including a layer adhesive to the light-transmissive substrate without removing the photoresist from the transparent electrode so that the thickness of the conductive material film is equal to the thickness of the insulating film;

(5) removing the photoresist together with the conductive material film thereon so as to produce conductive lines formed from the conductive material film remaining between the insulating films which are separated from each other; and (6) forming a transparent conductive film on the insulating films and the conductive lines; and (7) forming transparent electrodes in stripes by etching the transparent conductive film using another photoresist so that the transparent conductive film is divided on the insulating films for each of the conductive lines.

In this method, after forming the insulating films in stripes using a photoresist in steps (1) and (2), a metal film is formed on the light-transmissive substrate without removing the photoresist, and conductive films are formed by a lift-off process in step (3). Therefore, pattern errors can never occur. Moreover, with this method, it is possible to form a conductive line between the discrete insulating films so that the surface of the conductive line and the surfaces of the insulating films form a plane surface. As a result, an electrode substrate having a structure in which there is no unevenness of surface due to the formation of the conductive lines. Thus, a liquid crystal display element including this electrode substrate prevents disorderly alignment of liquid crystal from being caused by such unevenness and a short circuit, thereby providing good displays with uniform characteristics.

In order to achieve the above object, a third liquid crystal display element of the present invention includes:

a pair of light-transmissive substrates having grooves formed in predetermined patterns;

transparent electrodes formed in predetermined patterns on the light-transmissive substrates;

metal lines formed in the grooves by metal plating so as to be in contact with the transparent electrodes;

a flat conductive intermediate layer made of a material adhesive to the light-transmissive substrate and the metal line on a bottom face of each groove; and a liquid crystal layer formed between the light-transmissive substrates placed to face each other.

In this structure, since the metal line is formed on the flat conductive intermediate layer by metal plating, the metal line does not have great protrusions on both edges. It is thus possible to form the metal line so that the metal line and the light-transmissive substrate form a plane surface. Furthermore, since the conductive intermediate layer is made of a material adhesive to the light-transmissive substrate and metal line, the metal line can be firmly fixed to the light-transmissive substrate.

A method of fabricating an electrode substrate of the third liquid crystal display element, i.e., the light-transmissive substrate having the above-mentioned transparent electrodes and metal lines, includes steps:

(1) forming grooves in predetermined patterns on the light-transmissive substrate;

(2) forming the conductive intermediate layer only in the grooves;

(3) flattening the conductive intermediate layer;

(4) forming the metal lines on the flattened conductive intermediate layer in the grooves by metal plating; and (5) forming transparent electrodes which are in contact with the metal lines, respectively, by forming a transparent conductive film on the light-transmissive substrate and patterning the transparent conductive film.

In this method, the conductive intermediate layer formed in step (2) is flattened in step (3) in the groove formed in (step 1). In this fabrication steps, the both edges of the metal line formed by plating in step (4) can never protrude greatly, thereby producing a metal line with substantially a flat surface. It is thus possible to form the metal line to form a plane surface with the light-transmissive substrate.

Moreover, since the deposition rate of plating is higher than that of sputtering or evaporation, the costs of the facility and material are low. Therefore, plating is suitable for forming a metal line required to have a relatively large thickness. Consequently, with this fabrication method, it is possible to form flat low-resistant metal lines on the light-transmissive substrate in a short time.

For a fuller understanding of the nature and advantages of the invention, reference should be made to the ensuing detailed description taken in conjunction with the accompanying drawings.

BRIEF DESCRIPTION OF THE DRAWINGS

FIGS. 2(a) to 2(h) are flow diagrams showing the steps of fabricating an electrode substrate of the liquid crystal display element of FIG. 1.

FIGS. 6(a) to 6(h) are flow diagrams showing the steps of fabricating an electrode substrate of the liquid crystal display element of FIG. 5.

FIGS. 15(a) to 15(g) are flow diagrams showing a process of forming the conductive intermediate layer and the metal line layer on a light-transmissive substrate of the liquid crystal display element of FIG. 13.

FIGS. 16(a) to 16(h) are flow diagrams showing another process of forming the conductive intermediate layer and the metal line layer on the light-transmissive substrate of the liquid crystal display element of FIG. 13.

DESCRIPTION OF THE PREFERRED EMBODIMENTS

Embodiment 1

The following description will discuss first embodiment of the present invention with reference to FIGS. 1 to 4.

Figure 1:
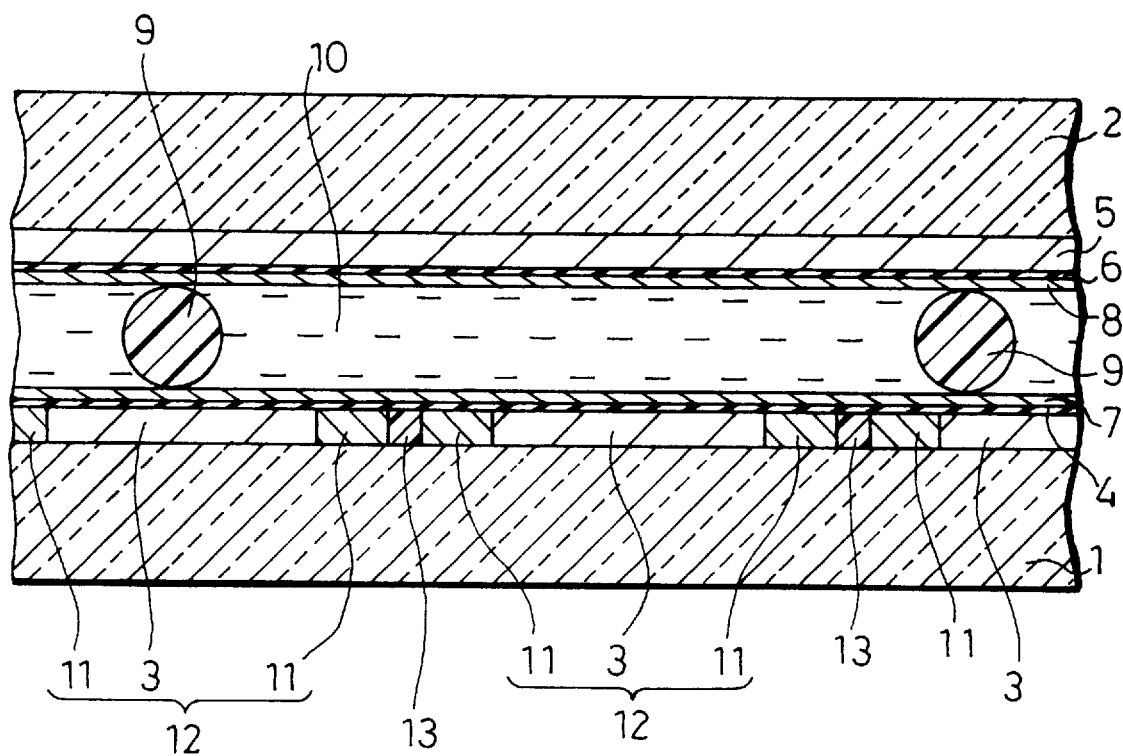
FIG. 1 is a sectional view showing the structure of essential sections of a liquid crystal display element according to Embodiment 1 of the present invention.

As illustrated in FIG. 1, a liquid crystal display element of this embodiment includes two pieces of light-transmissive substrates 1, 2 which are made of a transparent material and positioned to face each other. For example, glass substrates or substrates made of a resin like polymethacrylate are used for the light-transmissive substrates 1, 2. Polarizing plates, not shown, are placed so that the polarization axes thereof cross at right angles with each other, and attached to the outer surfaces of the light-transmissive substrates 1, 2 to sandwich the light-transmissive substrates 1 and 2.

Transparent signal electrodes 3 as transparent electrodes made of an electrode material, for example, ITO (indium tin oxide) are arranged parallel to each other to produce stripe patterns on a surface of the light-transmissive substrate 1, that faces the light-transmissive substrate 2. Further, a transparent insulating film 4 made of, for example, $SiO_2$ (silicone oxide) or SiN (silicone nitride) is layered on the signal electrodes 3.

On the other hand, on a surface of the light-transmissive substrate 2 that faces the light-transmissive substrate 1, transparent scanning electrodes 5 as transparent electrodes made of an electrode material, for example, ITO, are arranged parallel to each other to produce stripe patterns so that the scanning electrodes 5 and the signal electrodes 3 cross each other at right angles. The scanning electrodes 5 are coated with a transparent insulating film 6 made of, for example, $SiO_2$ and SiN.

Formed on the insulating films 4, 6 are alignment films 7 and 8, respectively, which have undergone a uniaxial aligning treatment such as rubbing. Examples of the alignment films 7 and 8 are films of organic polymers such as polyimides, nylon and polyvinyl alcohols, and a $SiO_2$ oblique evaporation film. When organic polymer films are used as the alignment films 7, 8, an aligning treatment is usually applied so that liquid crystal molecules are aligned in a direction substantially parallel to the electrode substrates.

The light-transmissive substrates 1 and 2 are placed with spacers 9 therebetween to keep a predetermined space therebetween, and fastened together with a sealing material (not shown) at the periphery thereof. The space between the light-transmissive substrates 1 and 2 is filled with a liquid crystal material, for example, ferroelectric liquid crystal, to form a liquid crystal layer 10. The ferroelectric liquid crystal can display large-capacity high-definition images because of its excellent characteristics including a high-speed response and memory effect.

Regions where the signal electrodes 3 and the scanning electrodes 5 face each other serve as pixel areas (not shown). In such a pixel area, when a voltage is applied to the signal electrode 3 and the scanning electrode 5, the aligned state of the molecules of the ferroelectric liquid crystal is switched, and the display state is switched between bright and dark, thereby providing a display.

Additionally, in order to lower the electrode resistance of each signal electrode 3, a conductive line 11 made of a metal whose resistance is lower than that of the signal electrode 3 is provided between adjacent signal electrodes 3 so that only a longitudinal side face of the conductive line 11 is in contact with a longitudinal side face of one of the adjacent signal electrodes 3. As a result, the signal electrode 3 and the conductive line 11 are conductively in contact with each other on the longitudinal side face of the signal electrode 3. Moreover, the signal electrode 3 is sandwiched between a pair of conductive lines 11. The conductive lines 11 also function as light-blocking films because the metal has good light blocking properties.

The conductive lines 11 can be formed by not only a single metal, but also a plurality of layers of different conductive materials like conductive lines of a liquid crystal display element of Embodiment 3, to be described later (see FIG. 8).

Furthermore, an insulating light-blocking member 13 made of, for example, silicone, is provided between hybrid electrodes 12 so as to cover the space between the hybrid electrodes 12. Each hybrid electrode 12 is formed by a signal electrode 3, and conductive lines 11 located on each side of the signal electrode 3. The surface of the light-blocking member 13 is formed so that its surface is level with the surface of the hybrid electrodes 12.

Like metals, when silicone is used, since the film thickness can be easily controlled by vapor evaporation or sputtering, silicone realizes a flat film and functions as a black matrix. Since the specific resistivity of silicone is $3 \times 10^5$ Ωcm in the vicinity of room temperature, the insulating property thereof is lower than that of insulating materials like $SiO_2$, but is not so low as to cause vicious effects on the driving characteristics of the liquid crystal display. The material for the light-blocking member 13 is not limited to silicone. Suitable materials for the light-blocking member 13 are those which allow vapor evaporation or sputtering and have insulating and light-blocking properties.

Thus, the insulating light-blocking member 13 is provided to cover the space between the hybrid electrodes 12 so that the side face of the light-blocking member 13 is in contact with the side faces of the hybrid electrodes 12. In this structure, it is possible to prevent a failure of driving the liquid crystal display element due to a flow of a leakage current in adjacent hybrid electrodes 12, without providing another insulator between the conductive line 11 and the signal electrode 3. Therefore, it is possible to eliminate the step of forming such an insulator.

Furthermore, the light-blocking members 13 block light passing through non-display areas other than the pixel areas, and function as black matrices together with the conductive lines 11.

The signal electrodes 3, the conductive lines 11 and the light-blocking members 13 are juxtaposed so that their surfaces form substantially a plane surface, and achieve a structure in which there is no unevenness of surfaces of the respective elements.

On the other hand, although not shown in any of the drawings, on the light-transmissive substrate 2, conductive lines like the conductive lines 11 are arranged parallel to each other. Each of the conductive lines is placed between adjacent scanning electrodes 5 so that only a longitudinal side face of the conductive line is in contact with a longitudinal side face of one of the adjacent scanning electrodes 5. Additionally, a light-blocking member like the light-blocking member 13 is provided between hybrid electrodes formed by the scanning electrode 5 and the conductive lines to fill the space between the hybrid electrodes.

The following description will explain the fabrication of an electrode substrate in the process of fabricating the liquid crystal display element.

Figure 2A:
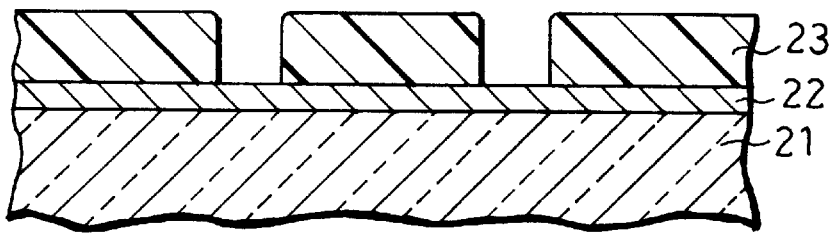
Figure 2B:
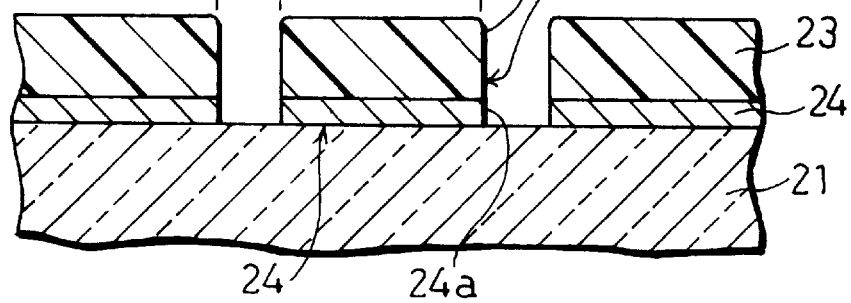
Figure 2C:
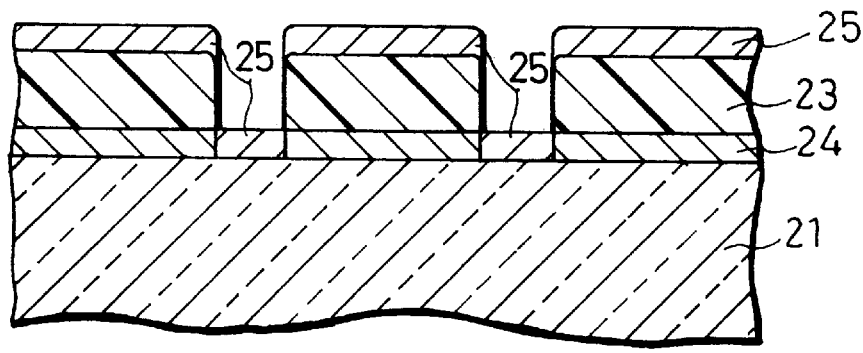
Figure 2D:
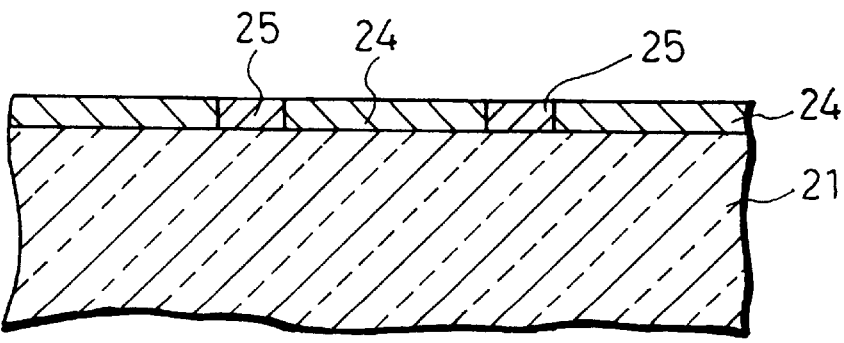

First, as illustrated in FIG. 2(a), an ITO film 22 as a transparent conductive film is deposited in a thickness of 500 nm over the entire surface of the light-transmissive substrate 21 (light-transmissive substrate 1, 2) by sputtering or EB (electron beam) evaporation. The size of light-transmissive substrate 21 is 152 mm×152 mm×1.11 mm, and a "7059 glass substrate" available from Corning Inc. is used.

Next, after applying a photoresist 23 (TSMR-8800 of Tokyo Ohka Kogyo Co., Ltd) onto the ITO film 22 by spincoating, the photoresist 23 is patterned to form stripe patterns by a photolithography using a photomask for forming ITO electrodes (transparent electrodes) and an ultraviolet-ray exposure device.

Subsequently, the ITO film 22 is etched by immersing the light-transmissive substrate 21 having the ITO film 22 and the photoresist 23 formed thereon in a hydrobromic acid (aqueous solution containing 47% by weight of HBr (hydrogen bromide)) whose temperature has been adjusted at 35° C. for 10 minutes. Consequently, as illustrated in FIG.

2(*b*), transparent electrodes 24 (signal electrodes 3 and scanning electrodes 5) are formed in stripe patterns from the ITO film 22. In the above-mentioned process, a post-bake of the photoresist 23 is not performed. The transparent electrode 24 is 100 μm in pattern width, and 96 mm in length in the pixel area. The width of the etched ITO film 22, i.e., the interval between adjacent transparent electrodes 24 is 30 μm.

Thereafter, ultraviolet rays are applied to the entire surface of the photoresist 23 on the transparent electrodes 24, and then a post-bake is performed in a clean oven at 130° C. for 20 minutes. The application of ultraviolet rays to the photoresist 23 is performed using the ultraviolet-ray exposure device under the conditions of 2 J/cm$^2$.

By performing the post-bake with the application of ultraviolet rays to the entire surface of the photoresist 23, the following effects are produced.

Specifically, the photoresist 23 after etching the ITO film 22 slightly protrudes from a longitudinal side face 24*a* of the resultant transparent electrode 24 because the ITO film 22 is over etched by an amount about 0.5 μm to 1.0 μm.

Therefore, even when a metal is deposited on the transparent electrodes 24 in such a state by evaporation or sputtering, the photoresist 23 protruding from the side face 24*a* functions as a mask. Therefore, the metal cannot be sufficiently deposited on the boundary between an area where the transparent electrode 24 is formed and an area where the transparent electrode 24 is not formed. Consequently, a gap (an exposed section of the light-transmissive substrate 21) is produced at the boundary between the area where the transparent electrode 24 is formed and the area where the transparent electrode 24 is not formed. Therefore, sufficient electrical contact of the transparent electrode 24 and the conductive line, to be described later, may not be achieved.

In order to solve such a problem, when application of ultraviolet rays to the photoresist 23 and a post-bake are performed, the photoresist 23 shrinks, thereby eliminating the unevenness of the side face 24*a* of the transparent electrode 24 and a longitudinal side face 23*a* of the photoresist 23. Namely, by performing the application of ultraviolet rays to the photoresist 23 and the post-bake before depositing a metal, it is possible to bring the transparent electrode 24 and the conductive line into conductively contact with each other without producing a gap between the area where the transparent electrode 24 is formed and the area where the transparent electrode 24 is not formed.

Thereafter, by depositing a metal on the light-transmissive substrate 21 and the photoresist 23 by evaporation using the electron-beam evaporation device, conductive material films 25 are formed as shown in FIG. 2(*c*). As the metal, for example, copper (with purity of 99.999 percent by weight, produced by Kojundo Chemical Laboratory Co., Ltd.) is used. The evaporation is carried out under the conditions: the evaporation temperature of the light-transmissive substrate 21 is between 100° C. and 120° C., and the deposition rate is between 30 nm/min and 50 nm/min. The deposition of the metal is controlled so that the thickness of the conductive material film 25 is substantially equal to the thickness (500 nm) of the transparent electrode 24. Here, care must be taken so that the thickness of the conductive material film 25 does not exceed the thickness of the transparent electrode 24.

Next, the light-transmissive substrate 21 having the conductive material film 25 formed thereon is immersed in an aqueous solution containing 3 percent by weight of sodium hydroxide, and an ultrasonic wave is applied to remove the photoresist 23. As a result, the conductive material film 25 on the photoresist 23 is lifted off. Consequently, as illustrated in FIG. 2(*d*), the conductive material film 25 is formed between adjacent transparent electrodes 24 so that only longitudinal side faces of the conductive material film 25 are in contact with longitudinal side faces of the transparent electrodes 24.

Next, as shown in FIG. 2(*e*), a photoresist 26 is deposited on the transparent electrodes 24 and the conductive material films 25 by spincoating. Then, the photoresist 26 is patterned to form stripe patterns with a 10-μm etching width of the conductive material film 25 by photolithography using the photomask and ultraviolet-ray exposure device.

Then, the conductive material film 25 is etched using a phosphoric-acid-based etching agent as an etchant. As a result, as shown in FIG. 2(*f*), the conductive material film 25 is divided between adjacent transparent electrodes 24 to produce metal electrodes 27 (conductive lines 11) arranged in stripes. In this process, a post-bake of the photoresist 26 is not performed.

Thereafter, application of ultraviolet rays to the entire surface of the photoresist 26, and post-bake are performed. Consequently, the unevenness of a longitudinal side face 27*a* of the metal electrode 27 and a longitudinal side face 26*a* of the photoresist 26 is eliminated, thereby preventing pattern errors. As a result, a light-blocking member, to be described later, is formed between the conductive lines 27 without producing a gap between an area where the conductive line 27 is formed and an area where the conductive line 27 is not formed. Here, the application of ultraviolet rays to the photoresist 26 is performed using the ultraviolet-ray exposure device under the conditions of 2 J/cm$^2$. The post-bake is performed in a clean oven at 130° C. for 20 minutes.

Thereafter, silicone 28 (with purity of 99.999 percent by weight, produced by Kojundo Chemical Laboratory Co., Ltd.) is deposited on the light-transmissive substrate 21 and the photoresist 26 by using the electron-beam evaporation device as shown in FIG. 2(*g*). In this case, the amount of silicone 28 to be deposited is controlled to be substantially equal to the thickness of the conductive line 27, i.e., the thickness (500 nm) of the transparent electrode 24. Here, care must be taken so that the thickness of the silicone 28 does not exceed the thickness of the transparent electrode 24.

Subsequently, the photoresist 26 is removed by immersing the light-transmissive substrate 21 having silicone 28 deposited thereon in an aqueous solution containing 3 percent by weight of sodium hydroxide and applying an ultrasonic wave. Consequently, silicone 28 on the photoresist 26 is lifted off. As a result, light-blocking members 29 (light-blocking members 13) made of silicone 28 are formed as shown in FIG. 2(*h*).

The light-blocking member 29 thus formed fills the space between hybrid electrodes 30 formed by the transparent electrode 24 and the conductive lines 27 so that only longitudinal side faces of the light-blocking member 29 are in contact with longitudinal side faces of the adjacent metal electrodes 27. Thus, the light-blocking members 29 are arranged so that the surfaces of the light-blocking members 29 form substantially a plane surface with the surfaces of the hybrid electrodes 30.

Figure 3:
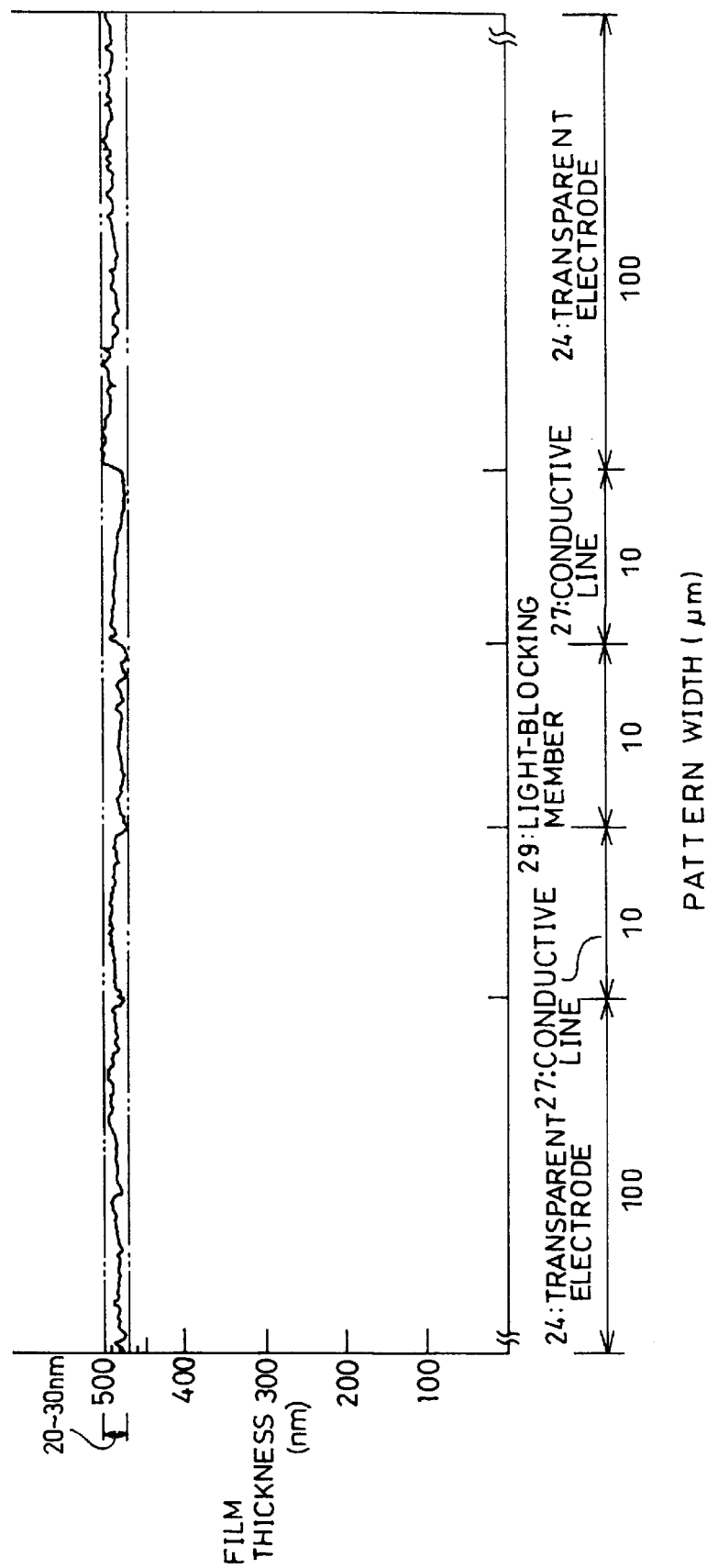
FIG. 3 is an explanatory view showing the results of measuring a surface of the electrode substrate fabricated through the fabrication steps of FIGS. 2(a) to 2(h) with a surface roughness tester.

The results of measuring the surface conditions of the transparent electrodes 24, conductive lines 27 and light-blocking members 29 with a surface roughness tester are shown in FIG. 3. It is understood from FIG. 3 that the unevenness of the surfaces of the transparent electrodes 24, conductive lines 27 and light-blocking members 29 is within a range of from 20 nm to 30 nm.

Such unevenness controls surfaces of the conductive line 27 and light-blocking member 29 to be lower than the surface of the transparent electrode 24, i.e., prevents the conductive line 27 and the light-blocking member 29 from protruding from the surface of the transparent electrode 24. This must be achieved to prevent the alignment of ferroelectric liquid crystal in the pixel areas from being disordered by the protrusion of the conductive line 27 and light-blocking member 29 from the surface of the transparent electrode 24.

Next, an insulating film (insulating film 4, 6) and a polyimide alignment film (alignment film 7, 8) are successively formed on the light-transmissive substrate 21, and a uniaxial aligning treatment is performed by rubbing the polyimide alignment film. By placing the above-mentioned electrode substrate (the light-transmissive substrate 21 having the hybrid electrodes 30 formed thereon) to face another piece of electrode substrate fabricated in the same manner as above and by injecting a ferroelectric liquid crystal therebetween, a liquid crystal display element is fabricated.

When a voltage was applied to the hybrid electrodes 30 of the resultant liquid crystal display element, a short circuit of the conductive lines did not occur between the electrode substrates, and there was little rounding in the waveform of a signal applied to the pixel area. In this liquid crystal display element, since the non-display area was shielded from light by the conductive line 27 and the light-blocking member 29, a uniform high-contrast display was obtained.

As described above, in this embodiment, since the photoresist 23 used for the formation of the transparent electrodes 24 is not removed when depositing the conductive material films 25 but is lifted off after the deposition of the conductive material films 25 on the light-transmissive substrate 21, pattern errors do not occur. Moreover, since the conductive material films 25 are deposited by vacuum evaporation or sputtering, it is easy to control the thickness of the conductive material film 25 so that the unevenness of the surfaces of the conductive line 27 and transparent electrode 24 is within 30 nm.

In addition, by forming the light-blocking member 29 using the same method, it is possible to form the transparent electrodes 24, conductive lines 27 and light-blocking members 29 so that the heights of their surfaces from the surface of the light-transmissive substrate 21 are equal to each other without causing pattern errors in forming the light-blocking members 29.

Furthermore, by performing the application of ultraviolet rays to the entire surface of the photoresist 23 and post-bake before depositing the conductive material film 25, it is possible to form the conductive material film 25 between adjacent transparent electrodes 24 without causing a gap between the conductive material film 25 and the transparent electrodes 24. Namely, it is possible to form the conductive line 27 between the adjacent transparent electrodes 24 without causing a gap between the conductive line 27 and the transparent electrodes 24.

Consequently, the conductive line 27 can be provided between adjacent transparent electrodes 24 so that only a longitudinal side of the conductive line 27 is in contact with a longitudinal side face of one of the adjacent transparent electrodes 24.

The liquid crystal display element of this embodiment includes a pair of light-transmissive substrates 1, 2 (21) placed to face each other, a liquid crystal layer 10 formed between the light-transmissive substrates 1, 2, a plurality of transparent electrodes 24 (signal electrodes 3 and scanning electrodes 5) arranged to form stripe patterns on each of the substrates 1, 2 so that the transparent electrodes 24 on one substrate 1 intersect the transparent electrodes 24 on the other substrate 2 and that a voltage is applied to the liquid crystal layer 10 at the intersections of the transparent electrodes 24, and a conductive line 11 (27) which is provided between the transparent electrodes 24 formed on a surface of, for example, the substrate 1 that faces the other substrate 2 so that only a longitudinal side face of the conductive line 11 (27) is in contact with a longitudinal side face of one of the adjacent transparent electrodes 24.

Unlike a structure in which the conductive line 27 is formed on the transparent electrode 24, in this structure, the conductive lines 27 and the transparent electrodes 24 do not overlap each other, thereby eliminating the unevenness of surfaces at the wired section of the conductive lines 27, i.e., the unevenness of the surfaces of the transparent electrodes 24 and the conductive lines 27. It is thus possible to significantly lower the electrode resistance without causing a short circuit, reduce the rounding of the waveform of a drive signal applied to the pixel area and a temperature variation in the cell, and suppress a lowering of the surface potential. Moreover, the above-mentioned structure can achieve a high-contrast display having uniform characteristics without causing vicious effects on the alignment and switching characteristics of ferroelectric liquid crystal.

Since the liquid crystal layer 10 is formed by the ferroelectric liquid crystal, this liquid crystal display element has excellent characteristics such as a memory effect, high-speed response and wide viewing angle, and provides a high-definition large-capacity display.

In the liquid crystal display element of this embodiment, since the height of the surface of the transparent electrode 24 is the same as the height of the surface of the conductive line 27, the electrode resistance can be decreased without deteriorating the flatness of the light-transmissive substrate 21. It is therefore possible to achieve a high-contrast display of uniform characteristics without causing vicious effects on the alignment and switching characteristics of liquid crystal.

Figure 4:
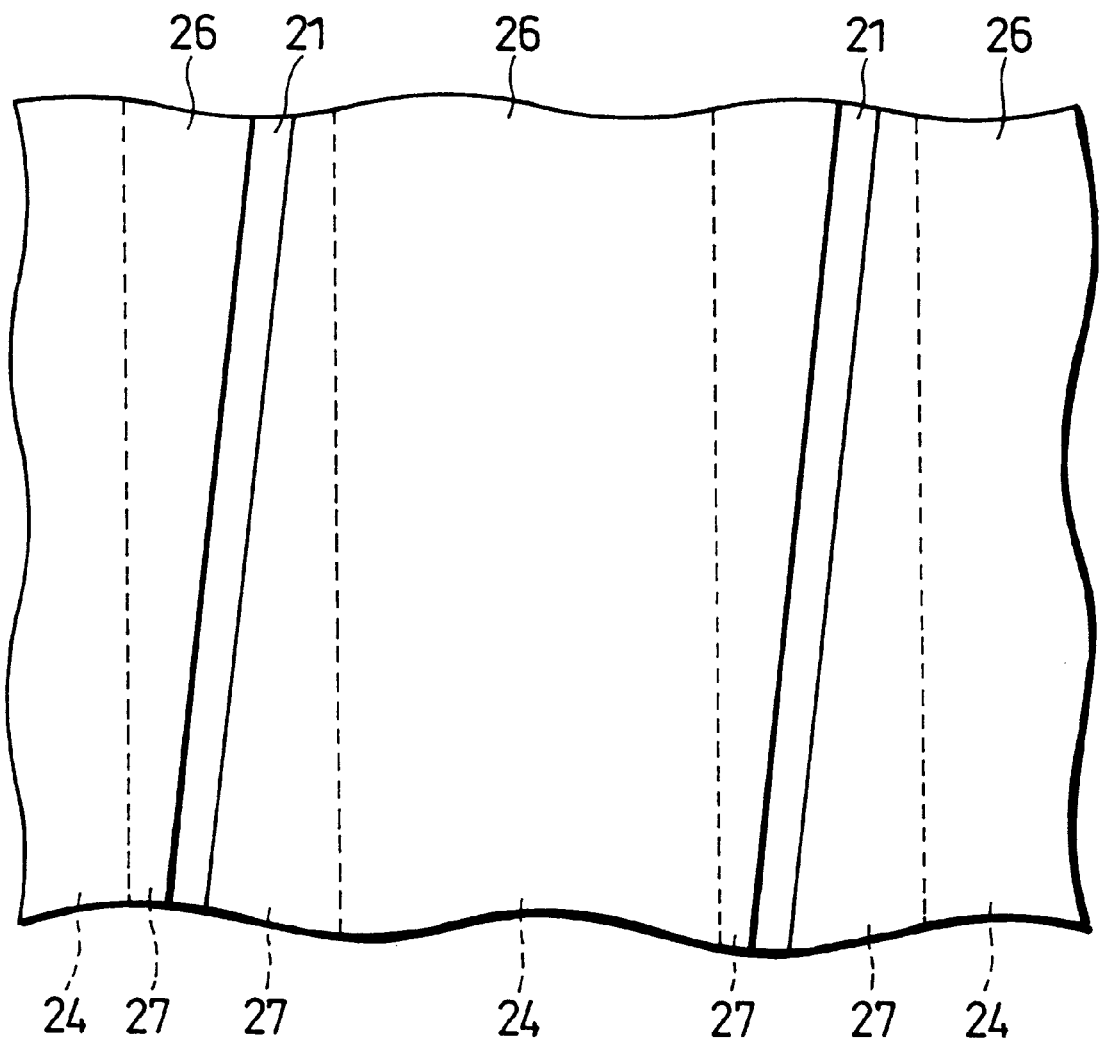
FIG. 4 is an explanatory view showing the advantages of the structure of the electrode substrate where conductive lines are formed on both sides of a transparent electrode.

Furthermore, in this embodiment, since the conductive lines 27 are provided on both sides of the transparent electrode 24 to be in contact with the transparent electrode 24, even when the conductive lines 27 are not made parallel to the transparent electrode 24 due to slight mask errors as shown in FIG. 4 in producing conductive lines 27 in stripe patterns by patterning the photoresist 26 as shown in FIGS. 2(e) and 2(f), the total amount of the metal forming the conductive lines 27 on both sides of any transparent electrode 24 is uniform. Consequently, the electrode resistance becomes uniform irrespectively of locations. It is therefore possible to provide a liquid crystal display element capable of providing good displays of uniform characteristics without requiring high patterning precision.

In this embodiment, the hybrid electrode 30 is formed by the transparent electrode 24 and the metal electrodes 27, and an insulating light-blocking member 29 is provided between the hybrid electrodes 30 so that the height of the surface of the light-blocking member 29 is the same as the height of the surface of the hybrid electrodes 30. Moreover, the conductive lines 27 and the light-blocking member 29 are arranged so as not to form a gap between the conductive line 27 and the transparent electrode 24 and between the light-blocking member 29 and the conductive line 27. In this arrangement, it is possible to perfectly block light passing between adjacent pixel areas, i.e., through a non-display area. It is therefore possible to prevent degradation of the image quality due to leakage of light in the non-pixel area. Consequently, a high-contrast display is provided. Furthermore, since the light-blocking member 29 does not produce unevenness of surface due to the formation of the hybrid electrodes 30, disorderly alignment of liquid crystal is not caused by such unevenness.

Comparative Example 1

The following description will explain a comparative example of Embodiment 1.

In this comparative example, a post-bake of the photoresist 23 is performed at 130° C. immediately after the patterning of the photoresist 23, and etching of the ITO film 22 is performed by immersing the light-transmissive substrate 21 having the ITO film 22 formed thereon into a hydrobromic acid which has been adjusted at 35° C. for 10 minutes when fabricating an electrode substrate according to Embodiment 1.

Moreover, the photoresist 26 is post-baked at 130° C. immediately after patterning the photoresist 26, and the conductive line 27 is etched using a phosphate-based etchant. With the exceptions mentioned above, an electrode substrate is fabricated through the same fabrication steps as in Embodiment 1.

On the surface of the electrode substrate thus formed, there were gaps between the transparent electrode 24 and the conductive line 27, and between the conductive line 27 and the light-blocking member 29. The alignment of liquid crystal of Comparative Example 1 was not as good as the alignment of liquid crystal of Embodiment 1 because of these gaps.

Embodiment 2

Figure 5:
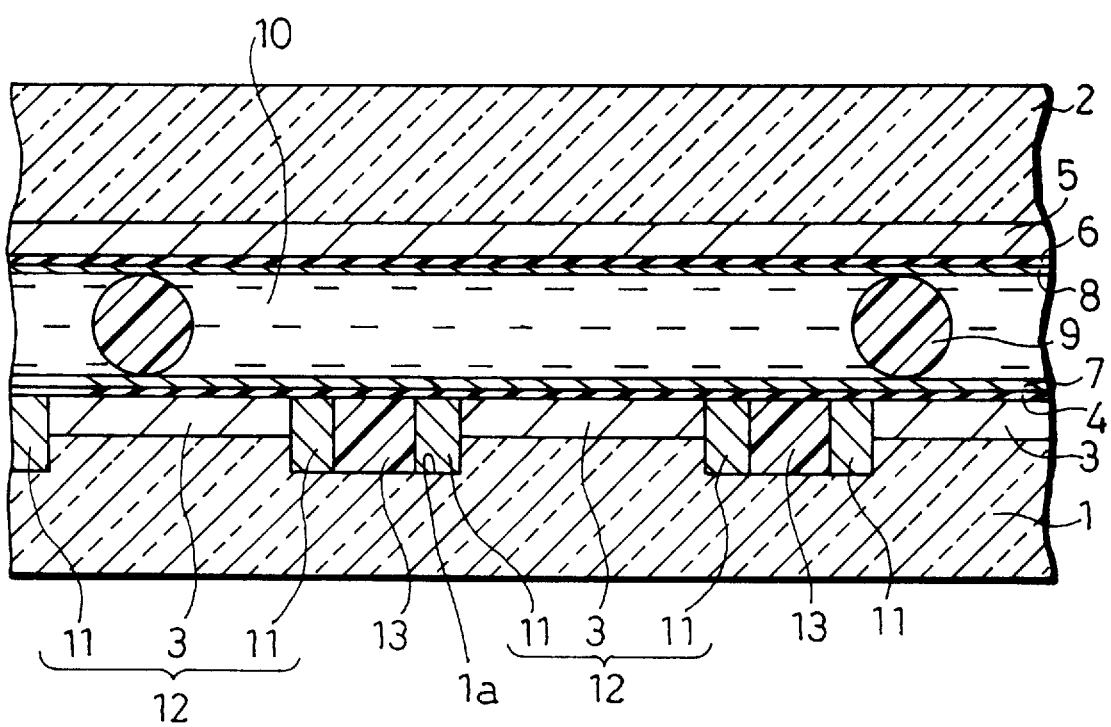
FIG. 5 is a sectional view showing the structure of essential sections of a liquid crystal display element according to Embodiment 2 of the present invention.

The following description will explain Embodiment 2 of the present invention with reference to FIGS. 5 and 6. For the sake of explanation, the elements of this embodiment having the same function as those in Embodiment 1 will be designated by the same reference numbers and the explanation thereof will be omitted here.

The difference between a liquid crystal display element of this embodiment and the liquid crystal display element of Embodiment 1 is as follows.

In this embodiment, as shown in FIG. 5, recessions 1a are formed on a surface of the light-transmissive substrate 1, that faces the light-transmissive substrate 2. Therefore, on the light-transmissive substrate 1, the conductive lines 11 and the light-blocking member 13 are buried between adjacent signal electrodes 3 so as to form a substantially a plane surface with the signal electrodes 3.

The conductive lines 11 of this embodiment may have the same structure as that of conductive lines 11 of Embodiment 3, to be described later.

On the other hand, although not shown in any of the drawings, recessions like the recessions 1a are formed on the light-transmissive substrate 2, and conductive lines and a light-blocking member similar to the conductive lines 11 and the light-blocking member 13 are buried between adjacent scanning electrodes 5 so as to form a substantially a plane surface with the scanning electrodes 5.

Next, the following description will explain the fabrication of an electrode substrate according to the fabrication process of the liquid crystal display element mentioned above.

Figure 6A:
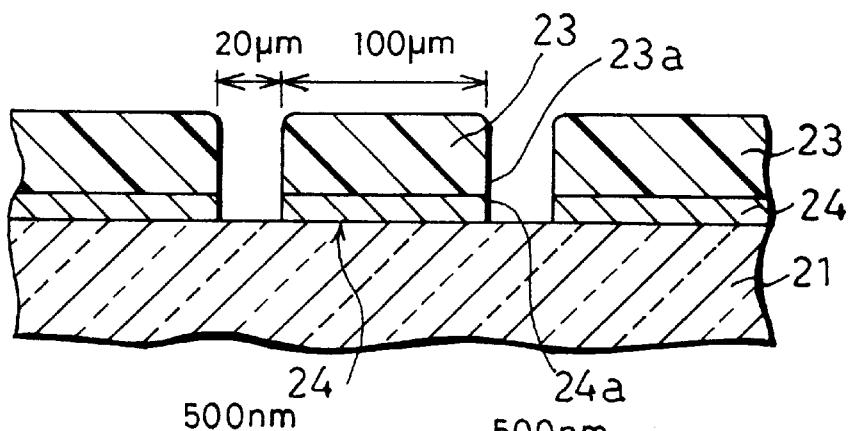

First, as illustrated in FIG. 6(a), ITO as an electrode material is deposited in a thickness of 500 nm on the light-transmissive substrate 21 (light-transmissive substrate (1, 2). Then, the photoresist 23 is deposited by spincoating, and the ITO is patterned to form stripe patterns. As a result, transparent electrodes 24 (signal electrodes 3 and scanning electrodes 5) are formed in stripes.

In this embodiment, the pattern width of the transparent electrode 24 is 100 μm, the length of the transparent electrode 24 in a pixel area is 96 mm, and the interval between adjacent transparent electrodes 24 is 20 μm.

Subsequently, like Embodiment 1, ultraviolet rays are applied to the entire surface of the photoresist 23 on the transparent electrodes 24, and then a post-bake is performed. This process eliminates the unevenness of the longitudinal side face 24a of the transparent electrode 24 and the longitudinal side face 23 a of the photoresist 23, thereby preventing pattern errors.

Figure 6B:
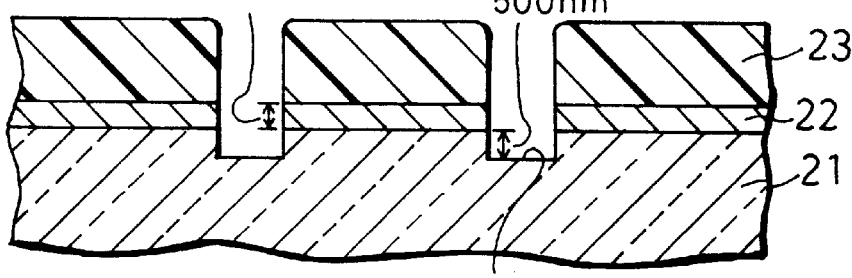

Next, as illustrated in FIG. 6(b), the light-transmissive substrate 21 is etched to a depth of 500 nm using buffered hydrofluoric acid (i.e., a solution formed by mixing HF (hydrogen fluoride) and $NH_4F$ (ammonium fluoride) in a ratio of 1:6). The conditions including the etchant and etching time vary according to the type of the light-transmissive substrate 21.

Recessions 21a (recessions 1a) are formed between the transparent electrodes 24 on the light-transmissive substrate 21 by performing etching in the above-mentioned manner.

Figure 6C:
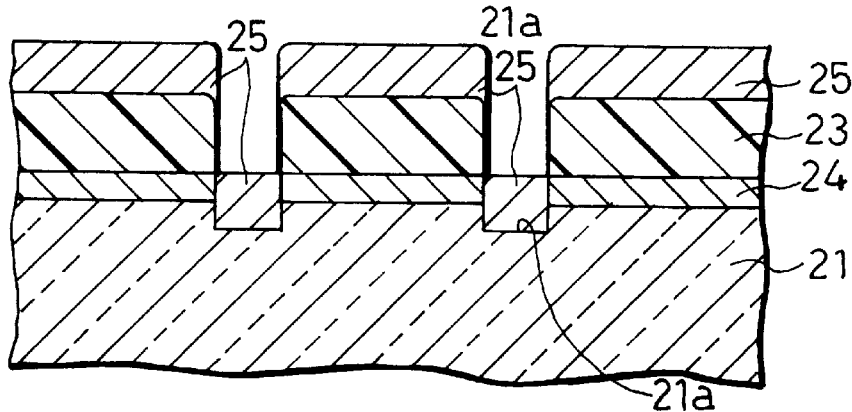

Subsequently, as shown in FIG. 6(c), a metal similar to the one used in Embodiment 1 is deposited on the photoresist 23 and the light-transmissive substrate 21 by evaporation so that the height of the surface of the metal is substantially the same as that of the transparent electrode 24. As a result, a conductive material film 25 is formed. More specifically, the thickness of the conductive material film 25 is controlled to be substantially equal to the total (1 μm) of the depth (500 nm) of the recession 21a and the thickness (500 nm) of the transparent electrode 24. In this case, it is necessary to control the surface of the conductive material film 25 not to be higher than that of the transparent electrode 24.

Figure 6D:
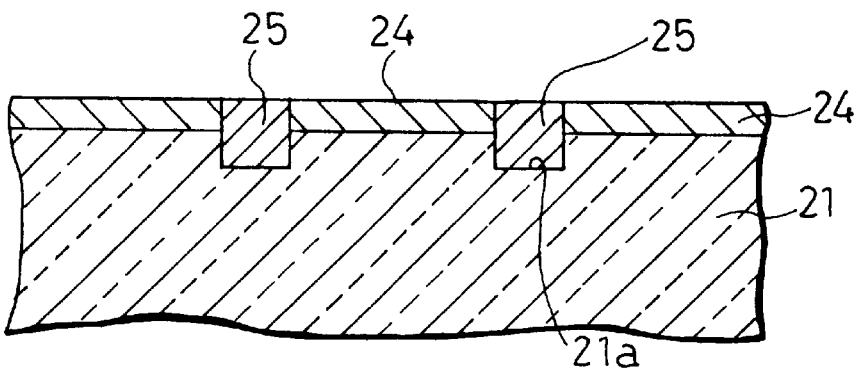

Thereafter, the photoresist 23 is removed by immersing the light-transmissive substrate 21 having the metal film 25 formed thereon into an aqueous solution containing 3 percent by weight of sodium hydroxide and applying an ultrasonic wave to lift off the conductive material film 25 on the photoresist 23. Consequently, as shown in FIG. 6(d), the conductive material film 25 is partly buried in the light-transmissive substrate 21 so that the conductive material film 25 is in contact with only the side faces of adjacent transparent electrodes 24.

Next, as shown in FIG. 6(e), the photoresist 26 is deposited on the transparent electrode 24 and conductive material film 25 by spincoating, and then the photoresist 26 is patterned to form stripe patterns with a 10-μm etching width of the conductive material film 25.

Then, the conductive material film 25 is etched using a phosphoric-acid-based etching agent as an etchant. As a result, as shown in FIG. 6(f), conductive lines 27 (conductive lines 11) which are separated between adjacent transparent electrodes 24 are formed in stripes.

Thereafter, the application of ultraviolet rays to the entire surface of the photoresist 26 and post-bake are performed. Consequently, the unevenness of a longitudinal side face 27d of the metal electrode 27 and a longitudinal side face 26a of the photoresist 26 is eliminated, thereby preventing pattern errors.

Thereafter, the silicone 28 is deposited on the light-transmissive substrate 21 and photoresist 26 using the electron-beam evaporation device as shown in FIG. 6(g). At this time, the amount of silicone 28 to be deposited is controlled so that the surface of the deposited silicone 28 is substantially level with the surfaces of the conductive line 27 and transparent electrode 24. Namely, it is necessary to control the thickness of silicone 28 to be substantially equal to the total (1 $\mu$m) of the depth (500 nm) of the recession 21a and the thickness (500 nm) of the transparent electrode 24. In this case, it is preferred to control the amount of silicone 28 to be deposited so that the surface of the silicone 28 is not higher than that of the transparent electrode 24.

Subsequently, the photoresist 26 is removed by immersing the light-transmissive substrate 21 having the silicone 28 deposited thereon in an aqueous solution containing 3 percent by weight of sodium hydroxide and applying an ultrasonic wave to lift off the silicone 28 on the photoresist 26. As a result, light-blocking members 29 (light-blocking members 13) made of silicone 28 are formed as shown in FIG. 6(h).

The light-blocking member 29 thus formed fills the space between hybrid electrodes 30 formed by the transparent electrode 24 and the conductive lines 27 so that only the longitudinal side faces of the light-blocking member 29 are in contact with the longitudinal side faces of the adjacent conductive lines 27. Consequently, the surfaces of the light-blocking members 29 and the surfaces of the hybrid electrodes 30 form a substantially plane surface.

Next, an insulating film (insulating film 4, 6) and a polyimide alignment film (alignment film 7, 8) are formed successively on the light-transmissive substrate 21, and a uniaxial aligning treatment is applied to the polyimide alignment film by rubbing. By placing the above-mentioned electrode substrate (the light-transmissive substrate 21 having the hybrid electrodes 30 formed thereon) to face another piece of electrode substrate fabricated in the same manner as above and by injecting the ferroelectric liquid crystal therebetween, a liquid crystal display element is fabricated.

When a voltage was applied to the hybrid electrodes 30 of the resultant liquid crystal display element, a short circuit of the conductive lines did not occur between the electrodes substrates, and there was little rounding in the waveform of a signal applied to the pixel area. In this liquid crystal display element, since the non-display areas were shielded from light by the conductive lines 27 and the light-blocking members 29, a high-contrast uniform display was provided.

As described above, in this embodiment, the conductive lines 27 are partly buried in the light-transmissive substrate 21, and the recessions 21a are formed on a surface of the light-transmissive substrate 21 on which the conductive lines 27 are formed. Hence, even when the thickness of the transparent electrode 24 is not increased, the thickness of the metal electrode 27 to be formed between the transparent electrodes 24 can be increased by an amount corresponding to the depth of the recessions 21a, i.e., an amount buried in the light-transmissive substrate 21. Therefore, the resistance can be made lower than that of Embodiment 1.

Moreover, in this embodiment, although the pattern width of the conductive line 27 is 5 $\mu$m that is a half of that of Embodiment 1, the thickness of the conductive line 27 is two times more than that of Embodiment 1. Therefore, in this embodiment, in order to obtain a resistance similar to that of Embodiment 1, the widths of the conductive lines 27 and light-blocking member 29, i.e., the interval between adjacent hybrid electrodes 30, can be decreased to two third of that of the structure of Embodiment 1. Consequently, the interval between adjacent transparent electrodes 24 is reduced by an amount corresponding to an increase in the thickness of the conductive line 27. It is thus possible to improve the numerical aperture of the resultant liquid crystal display element and realize a better display.

The method of fabricating an electrode substrate of this embodiment includes the steps of: forming a transparent electrode material film on the light-transmissive substrate 21; forming stripe patterns using the photoresist 23 on the electrode material film; etching the electrode material film to form the transparent electrodes 24 in stripe patterns; forming the conductive material film 25 on the light-transmissive substrate 21 having the transparent electrodes 24 formed thereon without removing the photoresist 23 from the transparent electrodes 24; removing the photoresist 23 together with the conductive material film 25 formed thereon; forming stripe patterns using the photoresist 26 on the conductive material film 25 remaining between the transparent electrodes 24; and forming conductive lines 27 to produce stripe patterns by etching the conductive material film 25 so that the conductive lines 27 are parallel to and in contact with one of adjacent transparent electrodes 24.

In this fabrication method, since the transparent electrodes 24 are formed in stripes using the photoresist 23 and then the conductive lines 27 are formed by depositing the conductive material film 25 on the light-transmissive substrate 21 without removing the photoresist 23, and lifting off the conductive material film 25, pattern errors can never occur. Moreover, in this fabrication method, since the conductive line 27 can be formed between adjacent transparent electrodes 24 so that only a side face of the conductive line 27 is in contact with a side face of one of adjacent transparent electrodes 24, it is possible to significantly lower the electrode resistance of the transparent electrodes 24 without causing a short circuit. It is therefore possible to reduce a temperature variation in the cell due to the rounding of the waveform of a drive voltage to be applied to a pixel area and the generation of heat, and increase the surface potential significantly.

Hence, in a liquid crystal display element including the electrode substrates fabricated by the above-mentioned process, there is not a section where the conductive line and the transparent electrode overlap each other unlike a structure in which the conductive line is formed on the transparent electrode. Therefore, the unevenness of surface due to the formation of the transparent electrodes 24 and the conductive lines 27 is significantly reduced compared to the conventional structure. Consequently, disorderly alignment of liquid crystal due to the unevenness is reduced, and the display quality is significantly improved. It is thus possible to provide a good display with uniform characteristics.

This fabrication method further includes the step of carrying out a post-bake by applying ultraviolet rays to the photoresist 23 before forming the conductive material film 25. It is therefore possible to eliminate the unevenness of a longitudinal side face 23a of the photoresist 23 and a longitudinal side face 24a of the transparent electrode 24. This structure enables the formation of the conductive line 27 between adjacent transparent electrodes 24 so that the side faces 24a of the transparent electrodes 24 are in contact with the side faces of the conductive line 27, without producing a gap between the transparent electrodes 24 and the conductive line 27.

In addition, this fabrication method further includes the step of forming the recessions 21a on a surface of the light-transmissive substrate 21 whereon the conductive lines 27 are to be formed, before forming the conductive material film 25. In this method, since the thickness of the conductive lines 27 can be increased by an amount corresponding to the depth of the recessions 21a, it is possible to further lower the resistance without increasing the thickness of the transparent electrodes 24.

Embodiment 3

Figure 7:
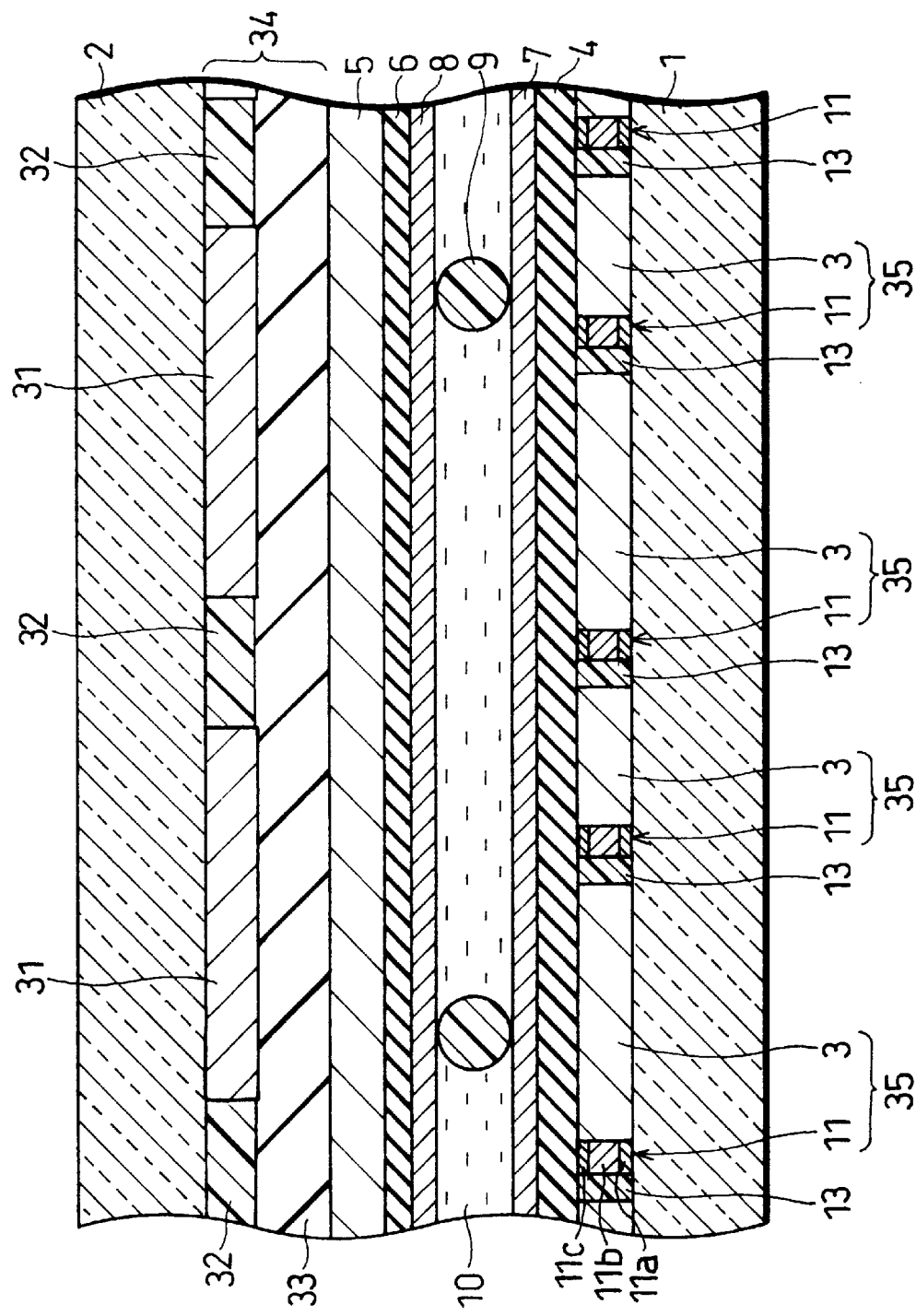
FIG. 7 is a sectional view showing the structure of essential sections of a liquid crystal display element according to Embodiment 3 of the present invention.
Figure 8:
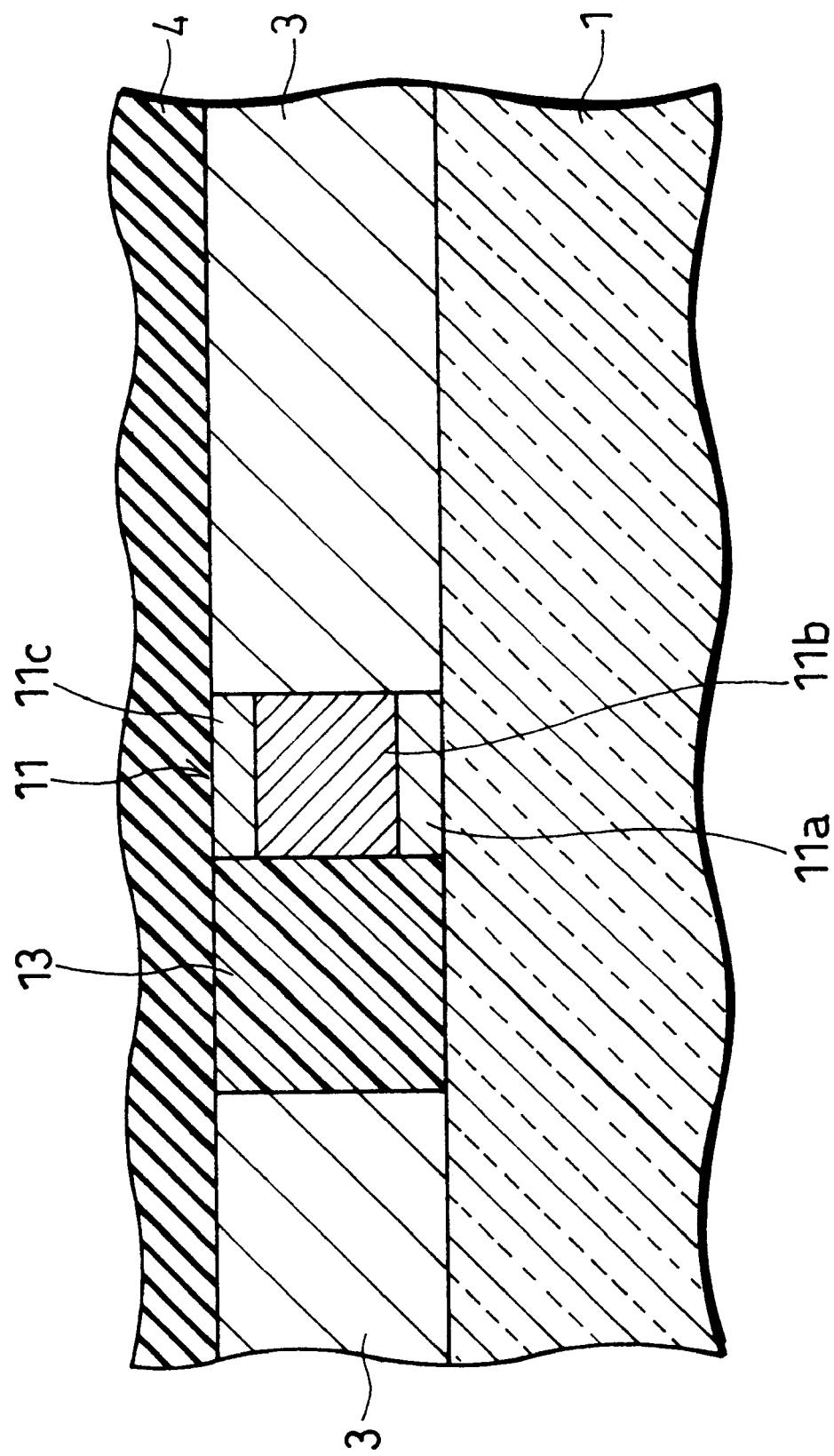
FIG. 8 is an enlarged sectional view showing a structure in the vicinity of conductive lines of the liquid crystal display element of FIG. 7.

The following description will explain an embodiment of the present invention with reference to FIGS. 7 to 9. For the sake of explanation, the elements having the same function as those in Embodiments 1 and 2 will be designated by the same reference numbers and the explanation thereof will be omitted. In particular, the difference between this embodiment and Embodiment 1 will be explained.

The difference between a liquid crystal display element of this embodiment and the liquid crystal display element of Embodiment 1 is as follows.

In the liquid crystal display element of this embodiment, as shown in FIG. 7, a color-filter layer 34 including color filters 31, black matrices 32 and an overcoat film 33 is formed on a surface of the light-transmissive substrate 2, that faces the light-transmissive substrate 1. The color-filter layer 34 is constructed by placing the red-green-blue color filters 31 and the black matrices 32 alternately parallel to and in contact with each other and placing the overcoat film 33 to cover the color filters 31 and the black matrices 32. Further, transparent scanning electrodes 5 made of, for example, ITO are arranged to form stripe patterns on the color-filter layer 34.

On the other hand, the transparent signal electrodes 3 made of, for example, ITO are arranged to form stripe patterns on a surface of the light-transmissive substrate 1, which faces the light-transmissive substrate 2, so that the signal electrodes 3 cross at right angles with the scanning electrodes 5.

In this embodiment, on the light-transmissive substrate 1, the conductive line 11 is formed between adjacent signal electrodes 3 so that only a longitudinal side face of the conductive line 11 is in contact with a longitudinal side face of one of the adjacent signal electrodes 3. Thus, the signal electrode 3 and the conductive line 11 are conductively in contact with each other on the longitudinal side face of the signal electrode 3.

In this embodiment, the conductive line 11 is formed only on one side of each signal electrode 3. In this case, a hybrid electrode 35 is formed by a signal electrode 3 and conductive line 11 located on one side of the signal electrode 3. A light-blocking member 13 with an insulating property made of, for example, silicone is placed between the hybrid electrodes 35 so that the longitudinal side faces of the light-blocking member 13 and the longitudinal side faces of the hybrid electrodes 35 are in contact with each other and the space between the hybrid electrodes 35 is filled with the light-blocking member 13. The signal electrodes 3, conductive lines 11 and light-blocking members 13 are placed adjacently so that their surfaces form a substantially plane surface. Thus, there is no unevenness of surfaces of the respective elements.

Although not shown in any of the drawings, on the light-transmissive substrate 2, conductive lines similar to the conductive lines 11 are placed parallel to each other between adjacent scanning electrodes 5 so that only a longitudinal side face of each conductive line 11 is in contact with a longitudinal side face of one of the adjacent scanning electrodes 5. Moreover, a light-blocking member similar to the light-blocking member 13 is placed between the hybrid electrodes formed by the scanning electrodes 5 and the conductive lines so that the space between the hybrid electrodes is filled with the light-blocking member.

In this embodiment, like Embodiment 1, it is possible to eliminate the unevenness of surface due to the formation of the conductive lines, and prevent the disorderly alignment of liquid crystal due to the unevenness, thereby achieving a significant improvement of the display quality.

Moreover, in this embodiment, as shown in FIG. 8, the conductive line 11 has a three-layer structure in which a first layer 11a, a second layer 11b, and a third layer 11c are placed in this order on the light-transmissive substrate 1. The first layer 11a and the third layer 11c are made of ITO or Ta (tantalum), and the second layer 11b is formed from a so-called low-resistant metal such as Cu, Al, and an alloy thereof. The first layer 11a and third layer 11c can be formed from the same conductive material, or different conductive materials. The lower face of each conductive line 11 is in contact with the light-transmissive substrate 1, and a side face thereof is in contact with the signal electrode 3.

Although not shown in any of the drawings, the conductive line formed on the light-transmissive substrate 2 has a three-layer structure like the conductive line 11. The lower face of the conductive line formed on the light-transmissive substrate 2 is in contact with the color-filter layer 34, and a side face thereof is in contact with the scanning electrode 5.

In general, so-called low-resistant metals such as Cu, Au and alloys thereof can not have good adhesion properties with respect to glass and resin materials (for example, polyester resin materials, acrylic resin material, and styrene resin materials) used for forming color filters or color-filter layer. Therefore, if the conductive line is formed by only using such a low-resistant metal, a peeled-off layer may occur at the boundary between the conductive line and the glass substrate or the color-filter layer (the boundary with a color filter if the color-filter layer does not include an overcoat film).

When a thin film of ITO or Ta which has good adhesion properties with respect to the glass substrate, color filter, color-filter layer, etc. as well as low-resistant metals is deposited as a base (under layer) of a layer made of a low-resistant metal, it is possible to prevent a peeled-off layer between the low-resistant metal layer and other layer which is in contact with the low-resistant metal layer.

As described above, in the liquid crystal display element of this embodiment, the conductive line 11 includes a layer made of at least one kind of metal selected from Cu, Al, and alloys thereof, i.e., the second layer 11b. In this structure, it is possible to efficiently lower the electrode resistance of the liquid crystal display element at low costs.

In addition, the conductive line 11 includes at least two layers, wherein one layer which is in contact with the light-transmissive substrate 1, 2 or the color-filter layer 34, i.e., the first layer 11a, is made of at least one metal selected from ITO or Ta. In this structure, the adhesion between the conductive lines 11 and the light-transmissive substrate 1, 2 or the color-filter layer 34 can be improved. It is thus possible to prevent disconnection of lines and conductive defects due to a peeled-off layer at the boundary between the conductive lines 11 and the light-transmissive substrate 1, 2 or the color-filter layer 34.

The color-filter layer 34 includes a color filter having no overcoat layer.

As described above, when ITO or Ta is used as the first layer 11a of the conductive line 11 and a low-resistant metal, for example, Cu, Al, and an alloy thereof is used as the second metal layer, it is possible to prevent a peeled-off layer at the boundary between the conductive line 11 and other layer in contact with the conductive line 11, and sufficiently lower the electrode resistance by the low-resistant metal.

Namely, when only a low-resistant metal is used as the conductive line 11, since the adhesion of the conductive line 11 and other layer in contact with the conductive line 11 is not good, a peeled-off layer may occur.

On the other hand, if the conductive line 11 is formed from only a metal, for example, Ta and ITO, having good adhesion properties with respect to the glass substrate, color-filter layer, etc., the conductivity becomes lower compared to the structure in which the conductive line 11 is formed from a low-resistant metal such as Cu, Al and an alloy thereof for the reason below. For example, the resistivity of Ta is $13.1 \times 10^{-6}$ Ω·cm and the resistivity of ITO is about $2 \times 10^{-4}$ Ω·cm though the value varies depending on its composition, and thus the resistivity of these materials is higher than the resistivity of Cu ($1.70 \times 10^{-6}$ Ω·cm) and Al ($2.74 \times 10^{-6}$ Ω·cm).

Whereas in this embodiment, the conductive line 11 includes the first layer 11a made of ITO or Ta on a side in contact with the light-transmissive substrate 1, and the second layer 11b made of a low-resistant metal on the first layer 11a. It is therefore possible to lower the resistance and improve the adhesion.

In general, since the conductive lines are exposed to various chemicals during, for example, etching and development of the photoresist, conduction defects and disconnection of lines are likely to occur due to the oxidation and etching of the surface of the conductive lines. Additionally, the heating process at high temperatures advances the oxidation, and increases the resistance.

Moreover, since the low-resistant metals such as Cu, Al and the alloys thereof have extensibility, they are likely to have scratches during the rubbing process. As a result, conduction defects or disconnection of lines occur at the portions scratched in rubbing.

However, ITO and Ta have much higher hardness compared to the low-resistant metals, excellent chemical resistance against acids and alkaline, and heat resistance. In the liquid crystal display element of this embodiment, therefore, when the topmost layer of the conductive line 11, i.e., the third layer 11c, is made of ITO or Ta, it is possible to prevent an increase in the resistance due to the oxidation of the surface of the conductive line 11, and conduction defects and disconnection of lines at the damaged portions of the surface of the conductive line 11.

In this embodiment, the thicknesses of the first layer 11a and the third layer 11c are not particularly limited for the reasons below.

Although ITO and Ta have excellent adhesion properties with respect to, for example, the light-transmissive substrate 1 and the color-filter layer 34, their resistance is higher than that of low-resistant metals such as Cu, Al, and alloys thereof. Therefore, if the thickness of the layer (first layer 11a and third layer 11c) made of at least one conductive material selected from ITO and Ta is too thick, the thickness of the conductive line 11 required for obtaining a desired resistance becomes too thick. Therefore, when forming the conductive line 11 with a predetermined thickness, if the thicknesses of the first layer 11a and the third layer 11c are increased, the thickness of the second layer 11b needs to be decreased by an amount corresponding to the increase in the thicknesses of the first layer 11a and third layer 11c.

Moreover, in order to lower the resistance to a predetermined value, the thickness of the conductive line 11 required to have the predetermined resistance increases because the resistance of the first layer 11a and the third layer 11c is higher than that of the second layer 11b. As a result, the size of the liquid crystal panel increases.

On the other hand, if the thickness of the first and third layers 11a, 11c is too thin, the adhesion between the layers 11a, 11c, and the light-transmissive substrate 1 or the color-filter layer 34 cannot be improved sufficiently. Consequently, a peeled-off layer may occur, and the chemical resistance and heat resistance may not be improved sufficiently. It is therefore preferred to decrease the thicknesses of the first layer 11a and third layer 11c to values that can achieve a sufficient improvement of adhesion. By forming the first and third layers 11a, 11c to have a thickness not less than 0.005 µm, for example, the adhesion to the light-transmissive substrate 1 or the color-filter layer 34 can be sufficiently improved without preventing a decrease in the resistance or the size of the liquid crystal display element.

Furthermore, in general, when forming a metal layer using thin film forming techniques such as evaporation and sputtering, it takes a long time to form a metal layer with a thickness exceeding 1 µm, resulting in a lowering of the productivity. For the formation of a metal layer with a thickness exceeding 1 µm, it is considered to employ a plating method which can easily form a thick film. However, if the film thickness is too thick, it is difficult to control the film thickness, resulting in unevenness of surfaces. The unevenness of surfaces may produce vicious effects on the alignment of liquid crystal.

For the reasons mentioned above, preferred thicknesses of the first layer 11a and third layer 11c are within a range of from 0.005 µm to 1 µm.

As metals for the second layer 11b, it is possible to use any metals if their resistance is lower than the resistance of a metal used for the first layer 11a. Examples of such a low-resistant metal include Al, Cu, Au (gold whose resistivity is $2.20 \times 10^{-6}$ Ω·cm), Ag (silver whose resistivity is $1.59 \times 10^{-6}$ Ω·cm), Ni (nickel whose resistivity is $7.04 \times 10^{-6}$ Ω·cm), Mo (molybdenum whose resistivity is $5.33 \times 10^{-6}$ Ω·cm), and alloys thereof. Considering adhesion properties with respect to Ta and ITO, resistivity and fabrication cost, Cu, Al and alloys thereof are particularly preferred among these low-resistant metals.

An electrode substrate of the liquid crystal display element of this embodiment can be fabricated through the following fabrication steps.

Figure 9A:
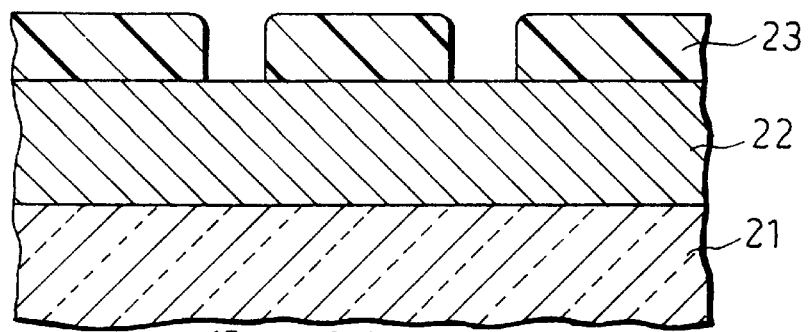
FIGS. 9(a) to 9(h) are flow diagrams showing the steps of fabricating an electrode substrate of the liquid crystal display element of FIG. 7.

First, as illustrated in FIG. 9(a), an ITO film 22 as the transparent conductive film is deposited in a thickness of 200 nm over a light-transmissive substrate 21 (light-transmissive substrates 1, 2) by sputtering or EB evaporation.

When forming a color-filter layer (color-filter layer 34) on the light-transmissive substrate 21, the color-filter layer is first formed on the light-transmissive substrate 21, and then the ITO film 22 is formed on the color-filter layer.

The color filters of the color-filter layer can be formed by various known conventional techniques such as pigment dispersion, dying, electro-deposition, and printing. The arrangement of color filters is not particularly limited, and can be selected from, for example, a striped arrangement, a mosaic arrangement, and delta (triangle) arrangement according to its application.

Next, after applying a photoresist 23 (TSMR-8800 of Tokyo Ohka Kogyo Co., Ltd) onto the ITO film 22 by spincoating, the photoresist 23 is patterned to form stripe patterns by a photolithography using a photomask for forming ITO electrodes (transparent electrodes) and an ultraviolet-ray exposure device.

Figure 9B:
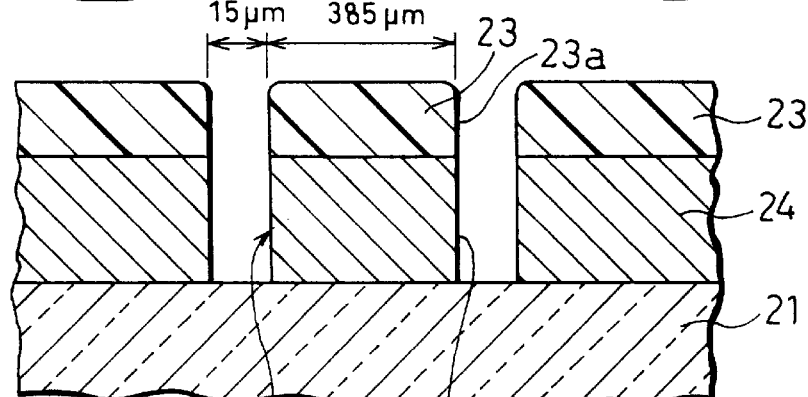

Subsequently, the ITO film 22 is etched by immersing the light-transmissive substrate 21 having the ITO film 22 and the photoresist 23 formed thereon in a hydrobromic acid whose temperature has been adjusted at 35° C. for 10 minutes. As a result, as illustrated in FIG. 9(b), transparent electrodes 24 (signal electrodes 3 and scanning electrodes 5) are produced in stripes from the ITO film 22. In the above-mentioned process, a post-bake of the photoresist 23 is not performed. The transparent electrode 24 is 385 μm in pattern width, and 192 mm in length in the pixel area. The width of the etched ITO film 22, i.e., the interval between adjacent transparent electrodes 24, is 15 μm.

Thereafter, a post-bake is performed by applying ultraviolet rays to the entire surface of the photoresist 23 on the transparent electrodes 24. Next, the light-transmissive substrate 21 having the photoresist 23 thereon is washed with pure water, and then dried.

Figure 9C:
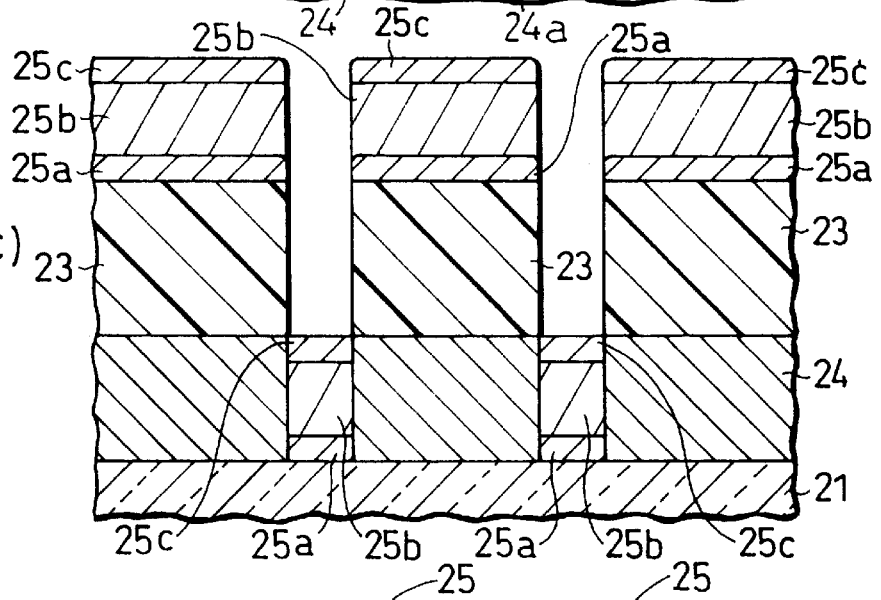

Thereafter, as illustrated in FIG. 9(c), a 20-nm-thick first film 25a made of ITO or Ta, a 160-nm-thick second film 25b made of Cu, Al or an alloy thereof, and a 20-nm-thick third film 25c made of ITO or Ta are formed in this order on the light-transmissive substrate 21 and the photoresist 23 by sputtering or EB evaporation.

Figure 9D:
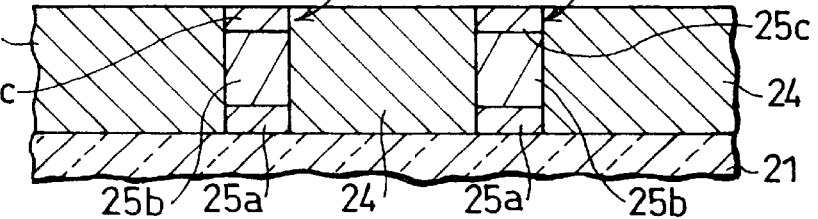

Next, the photoresist 23 is lifted off together with the first film 25a, second film 25b and third film 25c. As a result, as illustrated in FIG. 9(d), the conductive material film 25 composed of the first film 25a, second film 25b and third film 25c is formed between adjacent transparent electrodes 24 so that only the longitudinal side faces of the conductive material film 25 is in contact with the longitudinal side faces of the transparent electrodes 24.

Figure 9E:
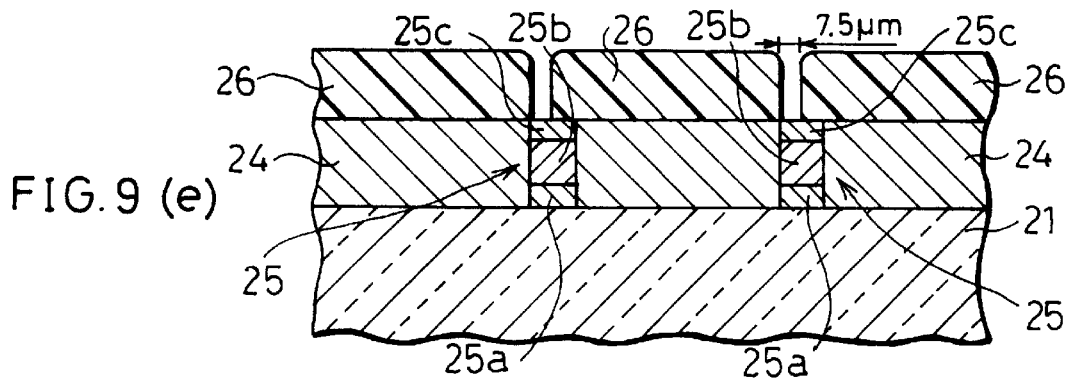

Thereafter, as shown in FIG. 9(e), the photoresist 26 is deposited on the transparent electrode 24 and the conductive material film 25 by spincoating. Then, the photoresist 26 is patterned to form stripe patterns with a 7.5-μm etching width of the conductive material film 25 by photolithography using the photomask and the ultraviolet-ray exposure device.

Figure 9F:
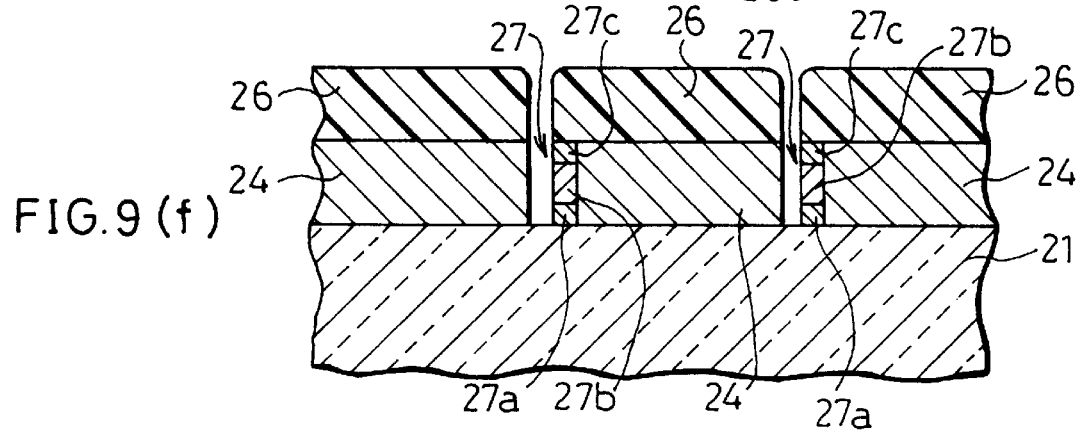

Then, the conductive material film 25 is etched using a phosphoric-acid-based etchant as the etchant. As a result, as shown in FIG. 9(f), the conductive lines 27 (conductive lines 11) are arranged in stripes so that each conductive line 27 is arranged between adjacent transparent electrodes 24 to be parallel to and in contact with one of the adjacent transparent electrodes 24. The conductive line 27 has a three-layer structure in which a first layer 27a (first layer 11a) made of the first film 25a, a second layer 27b (second layer 11b) made of the second film 25b, and a third layer 27c (third layer 11c) made of the third film 25c are placed in this order on the light-transmissive substrate 21. In this process, a post-bake of the photoresist 26 is not performed.

Figure 9G:
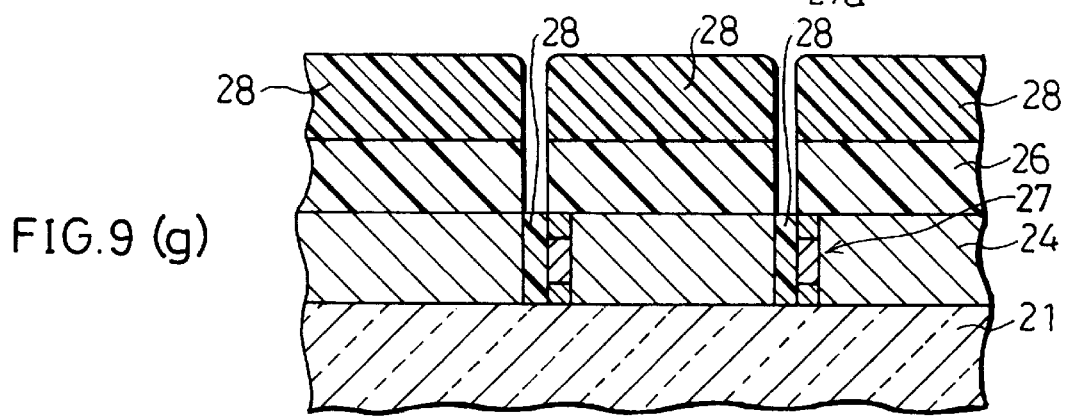

Thereafter, a post-bake is performed by applying ultraviolet rays to the entire surface of the photoresist 26. Subsequently, as shown in FIG. 9(g), silicone 28 is deposited on the light-transmissive substrate 21 and the photoresist 26 by evaporation. In this case, the amount of silicone 28 to be deposited is controlled to be substantially equal to the thickness of the conductive line 27, i.e., the thickness (200 nm) of the transparent electrode 24. Here, care must be taken to prevent the thickness of silicone 28 from exceeding the thickness of the transparent electrode 24.

Figure 9H:
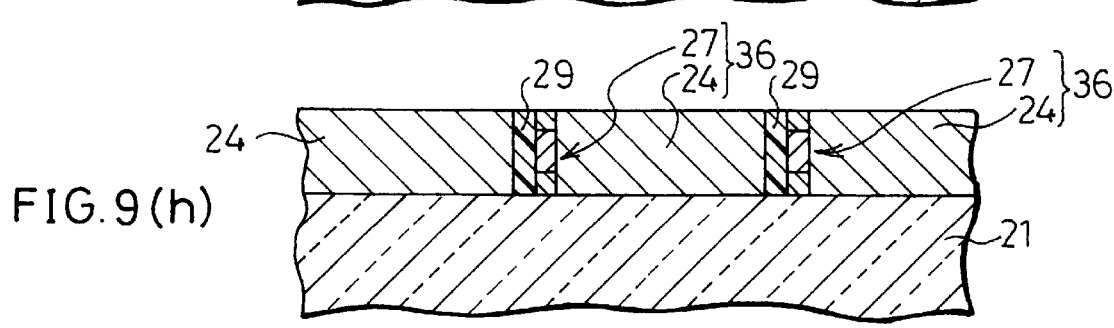

Next, the photoresist 26 is lifted off together with the silicone 28 formed thereon. As a result, light-blocking members 29 (light-blocking members 13) made of silicone 28 are formed as shown in FIG. 9(h). Each light-blocking member 29 thus formed fills the space between hybrid electrodes 36 formed by the transparent electrodes 24 and the conductive lines 27 so that only the longitudinal side faces of the light-blocking member 29 are in contact with the longitudinal side faces of the adjacent conductive line 27 and transparent electrode 24. The hybrid electrodes 36 and the light-blocking members 29 form substantially a plane surface.

Thereafter, an insulating film (insulating film 4, 6) is formed of $SiO_2$ and SiN on the light-transmissive substrate 21 whereon the hybrid electrodes 36, etc. are formed. Then, after forming a polyimide alignment film (alignment film 7, 8) on the insulating film, a uniaxial aligning treatment is applied to the polyimide alignment film by rubbing. By placing the above-mentioned electrode substrate (the light-transmissive substrate 21 having hybrid electrodes 36 formed thereon) to face another piece of electrode substrate fabricated in the same manner as above with spacers therebetween and by injecting the ferroelectric liquid crystal therebetween, a liquid crystal display element is fabricated.

In the structure of this embodiment, for example, the conductive line 27 and the transparent electrode 24 do not overlap each other. It is therefore possible to reduce the unevenness of surface due to the formation of the conductive lines 27, i.e., the unevenness of the surface of the conductive line 27 and the surface of the transparent electrode 24. As a result, disorderly alignment of liquid crystal due to the unevenness is prevented, thereby improving the display quality significantly. Moreover, in this structure, since the conductive line 27 does not protrude from the surface of the transparent electrode 24, the electrode resistance can he lowered significantly without causing a short circuit. Accordingly, a temperature variation in the cell due to the generation of heat and the rounding of the waveform of a drive signal applied to a pixel area is reduced, and a lowering of the surface potential is suppressed.

Consequently, as shown in FIG. 7, when a gradation display is provided by changing the width of the signal electrodes 3 and the width of the scanning electrodes 5, good still images and moving images can be displayed without causing visible defects such as gray-scale defects.

Additionally, in this embodiment, as shown in FIG. 9(h), since the space between the hybrid electrodes 36 is filled with the light-blocking member 29, a high-contrast display can be achieved.

Moreover, in this embodiment, since a contact layer (first layer 27a) of the conductive line 27 shown in FIG. 9(f) which is in contact with the light-transmissive substrate 21 or the color-filter layer (color-filter layer 34) is made of Ta or ITO, the adhesion between the conductive line 27 and the light-transmissive substrate 21 or the color-filter layer can be improved.

Furthermore, in this embodiment, since the topmost layer (third layer 27c) of the conductive line 27 is made of Ta or ITO, it is possible to prevent the surface of the conductive line 27 from being damaged by oxidation and rubbing.

In this embodiment, the color-filter layer (color-filter layer 34) can be formed as the need arises. Namely, it is not necessarily to include the color-filter layer.

In addition, like Embodiment 2 shown in FIG. 5, in a liquid crystal display element of this embodiment, it is preferred to adopt a structure in which recessions are formed on a surface of the light- transmissive substrate 1 (light-transmissive substrate 21) on which the conductive lines 11

(conductive lines 27) are to be formed, and the conductive lines 11 are partly buried in the recessions. In this structure, it is possible to further lower the resistance by an amount corresponding to an increase in the thickness of the conductive line 11.

Embodiment 4

Figure 10:
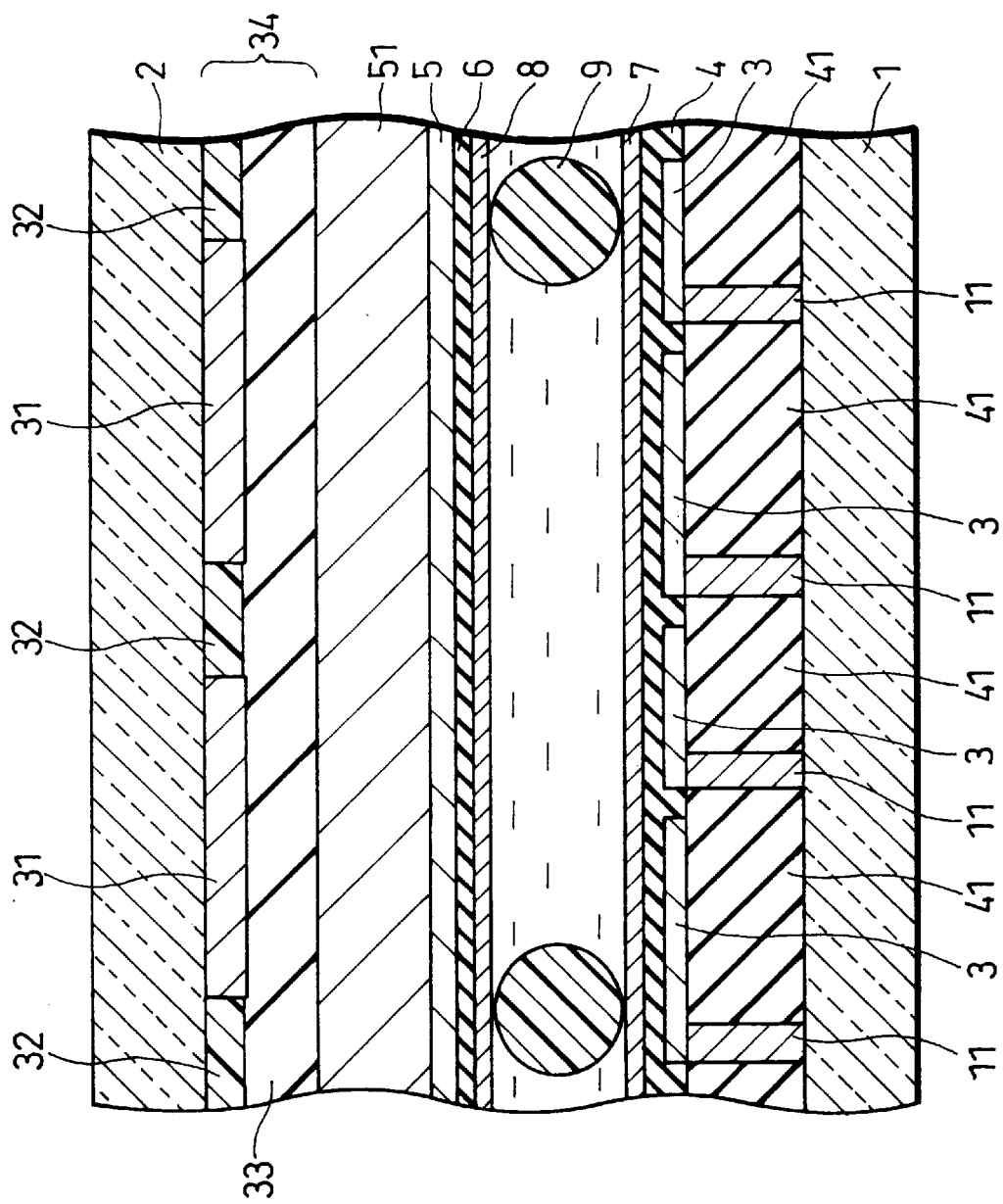
FIG. 10 is a sectional view showing the structure of essential sections of a liquid crystal display element according to Embodiment 4 of the present invention.
Figure 11:
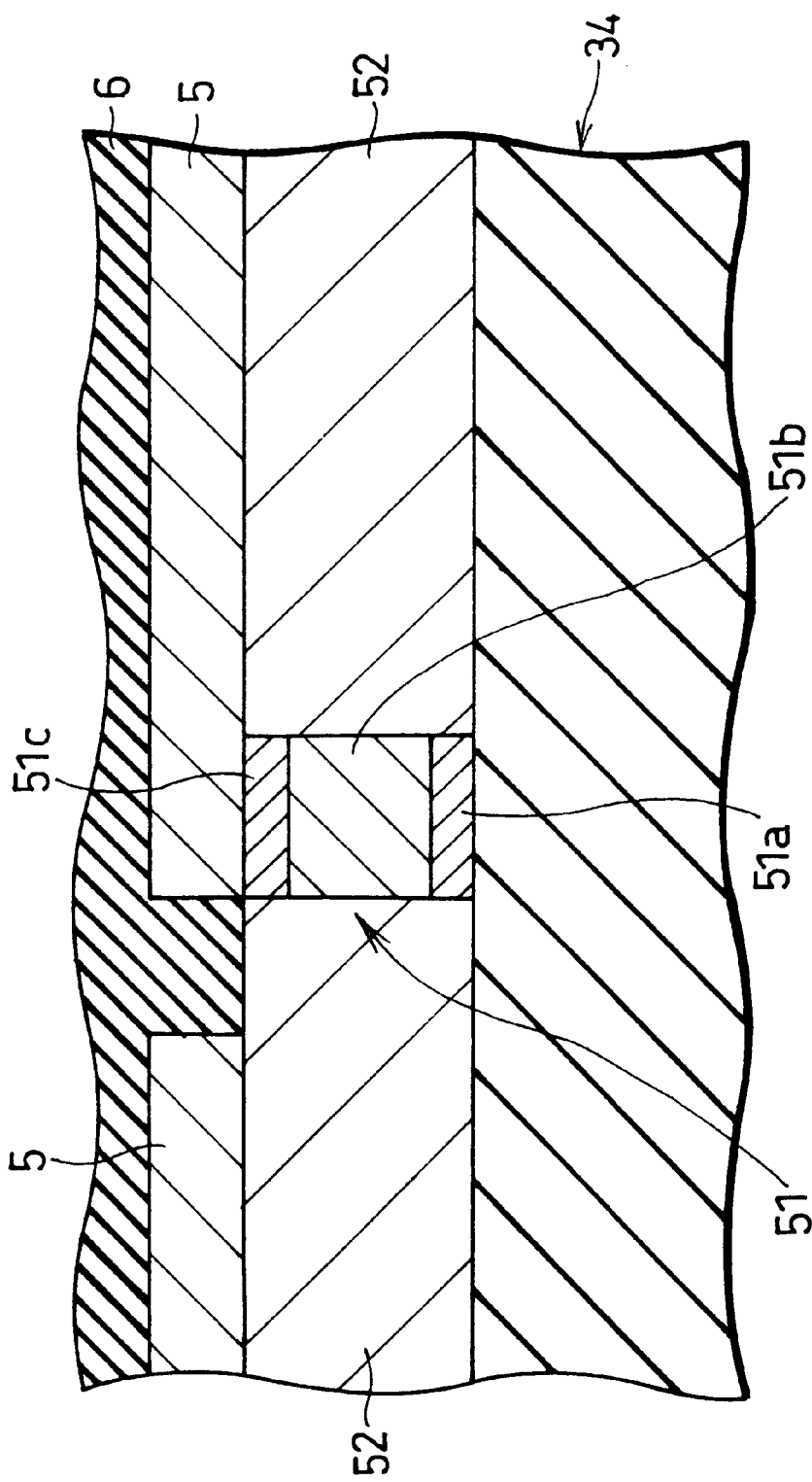
FIG. 11 is an enlarged sectional view showing a structure in the vicinity of conductive lines of the liquid crystal display element of FIG. 10.

The following description will explain Embodiment 4 of the present invention with reference to FIGS. 10 to 12. For the sake of explanation, the elements having the same function as those in Embodiments 1 to 3 will be designated by the same reference numbers and the explanation thereof will be omitted. In particular, the difference between this embodiment and Embodiment 1 will be explained.

The difference between a liquid crystal display element of this embodiment and the liquid crystal display element of Embodiment 1 is as follows.

In the liquid crystal display element of this embodiment, as shown in FIGS. 10 and 11, conductive lines 11 for lowering the resistance of the signal electrodes 3 are arranged to form parallel stripe patterns on a surface of the light-transmissive substrate 1, that faces the light-transmissive substrate 2. An insulating film 41 made of a transparent insulating material is placed in the space between adjacent conductive lines 11 so that the surface of the insulating film 41 and the surface of the conductive line 11 form a plane surface. Moreover, the signal electrodes 3 are arranged parallel to each other to produce stripe patterns on the plane surface formed by the conductive lines 11 and insulating films 41 so that the signal electrodes 3 and the conductive lines 11 are parallel to each other. The signal electrodes 3 are in contact with the conductive lines 11. Thus, the conductive lines 11 and the signal electrodes 3 are in conductively contact with each other at the lower surfaces of the signal electrodes 3 along a longitudinal direction.

Moreover, a transparent insulating film 4 made of, for example, $SiO_2$ and SiN is formed on the signal electrode 3, and an alignment film 7 which has undergone a uniaxial aligning treatment such as rubbing is placed on the insulating film 4.

On the other hand, a color-filter layer 34 including color filters 31, black matrices 32 and an overcoat film 33 is formed on a surface of the light-transmissive substrate 2, that faces the light-transmissive substrate 1. The color-filter layer 34 is constructed by placing red-green-blue color filters 31 and the black matrices 32 alternately parallel to and in contact with each other, and covering the color filters 31 and the black matrices 32 with the overcoat film 33.

Conductive lines 51 for lowering the electrode resistance of the scanning electrodes 5 are arranged to produce parallel stripe patterns on the color-filter layer 34. An insulating film 52 made of a transparent insulating material is placed between adjacent conductive lines 51 so that the surface of the insulating film 52 and the surfaces of the conductive lines 51 form a plane surface. Moreover, the scanning electrodes 5 are arranged parallel to each other to produce stripe patterns on the plane surface formed by the conductive lines 51 and the insulating films 52 so that the scanning electrodes 5 and the conductive lines 51 are parallel to each other. The scanning electrodes 5 are in contact with the conductive lines 51.

Furthermore, a transparent insulating film 6 made of, for example, $SiO_2$ and SiN is placed on the scanning electrode 5. Additionally, an alignment film 8 which has undergone a uniaxial aligning treatment such as rubbing is formed on the insulating film 6. The light-transmissive substrates 1 and 2 are fastened to each other so that the signal electrodes 3 cross at right angles with the scanning electrodes 5.

In this embodiment, as shown in FIG. 11, the conductive line 51 has a three-layer structure in which a first layer 51a, a second layer 51b, and a third layer 51c are placed in this order on the light-transmissive substrate 1, i.e., on the color-filter layer 34. The first layer 51a and the third layer 51c are made of ITO or Ta, and the second layer 51b is formed of a so-called low-resistant metal such as Cu, Al, and an alloy thereof. The first layer 51a and third layer 51c can be formed of the same conductive material, or different conductive materials.

For the same reasons as those mentioned in Embodiment 3, it is preferred to arrange the thicknesses of the first layer 51a and third layer 5ic to fall within a range of from 0.005 μm to 1 μm. Although not shown in any of the drawings, the conductive line 11 formed on the light-transmissive substrate 1 has a three-layer structure like the conductive line 51.

Figure 12A:
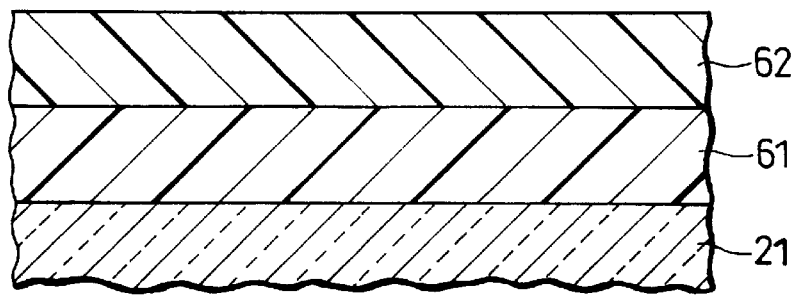
FIGS. 12(a) to 12(f) are flow diagrams showing the steps of fabricating an electrode substrate of the liquid crystal display element of FIG. 10.
Figure 12B:
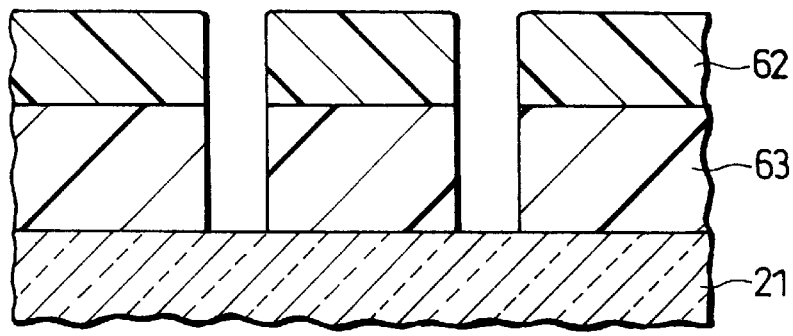
Figure 12C:
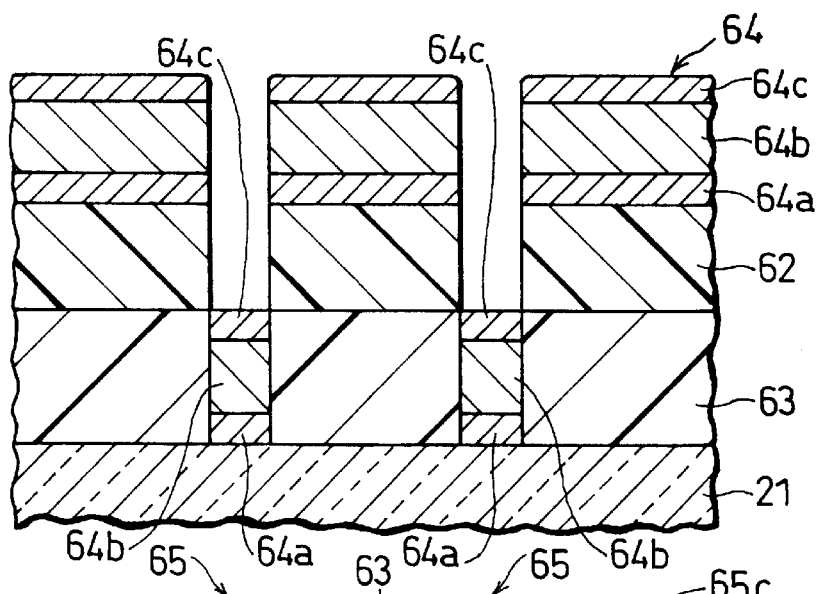
Figure 12D:
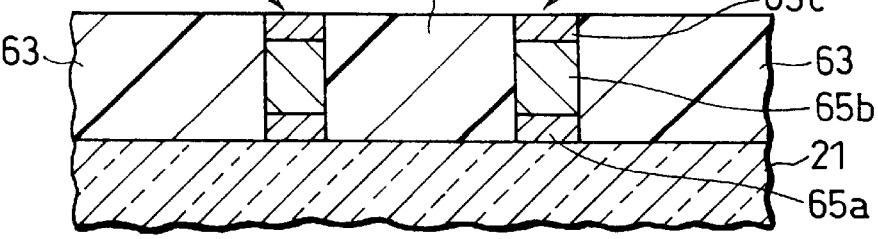
Figure 12E:
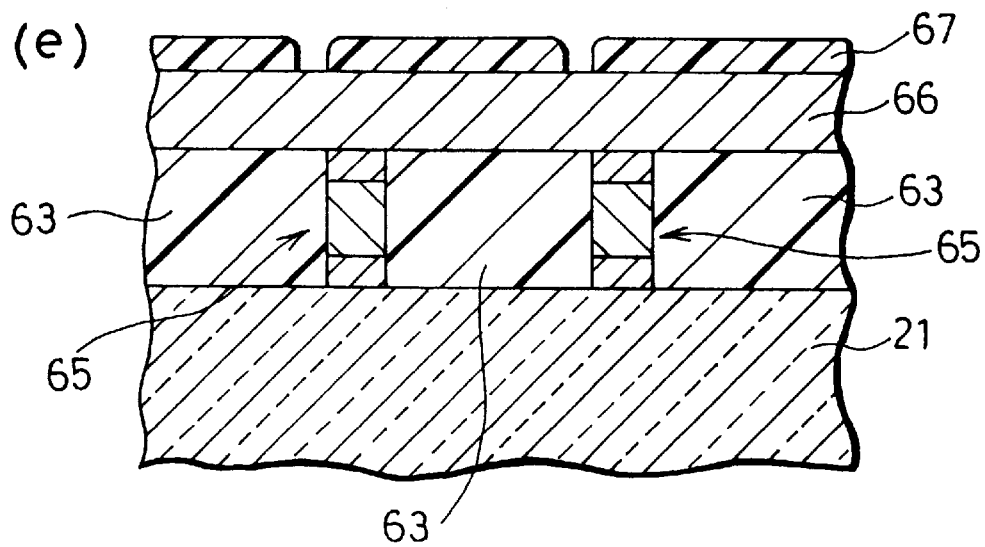
Figure 12F:
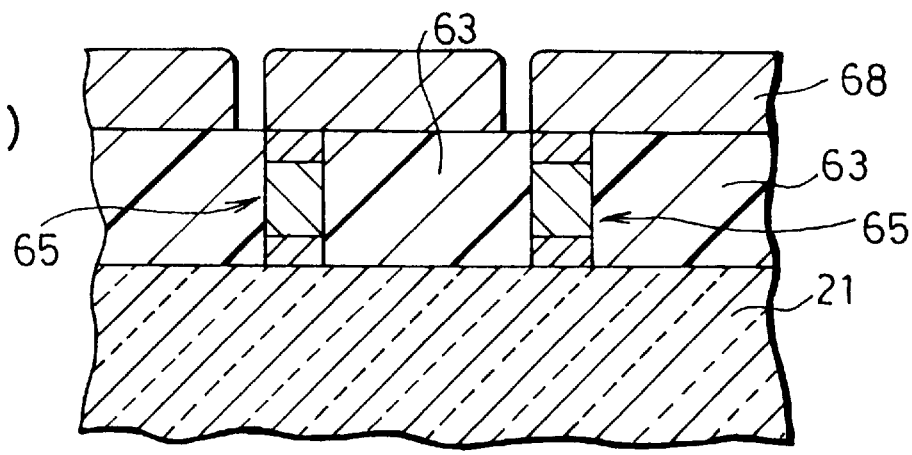

The liquid crystal display element of this embodiment includes: a pair of light-transmissive substrates 1, 2 (21) placed to face each other; a liquid crystal layer 10 formed between the light-transmissive substrates 1, 2; conductive lines 11 (65) arranged to form stripe patterns on, for example, a surface of the light-transmissive substrate 1, that faces the light-transmissive substrate 2; an insulating film 41 (63) placed between the conductive lines 11 so that a surface of the insulating film 41 forms a plane surface with a surface of the conductive line 11; and signal electrodes (transparent electrodes 68) arranged to form stripe patterns on the plane surface so that the signal electrodes 3 are parallel to and in contact with the conductive lines 11 (see FIG. 12(f)).

In this structure, since the conductive line 27 and the insulating film 63 are formed on the light-transmissive substrate 21 so that the surface of the insulating film 27 forms a plane surface with the surface of the conductive line 27, it is possible to reduce the unevenness of surface due to the formation of the conductive lines. It is thus possible to prevent disorderly alignment due to the unevenness, improve the display quality significantly, and lower the electrode resistance of the transparent electrodes 24 to a great degree without causing a short circuit. As a result, a temperature variation in a cell due to the generation of heat and the rounding of the waveform of a drive signal applied to the pixel area is reduced, and a lowering of the surface potential is suppressed. It is thus possible to realize a liquid crystal display element capable of providing good displays with uniform characteristics.

In this embodiment, as described above, since the second layer 51b is made of a metal with resistance which is lower than that of ITO or Ta (tantalum) used for forming the first layer 51a and third layer 51c, it is possible to obtain a liquid crystal display element which has improved adhesion between the conductive line 51 and the layer in contact with the conductive line 51 and excellent conductivity, and provides good displays of uniform characteristics.

The liquid crystal display element of this embodiment can be fabricated through the following process. First, as illustrated in FIG. 12(a), a positive photosensitive resin material 61 as an insulating material is placed on the light-transmissive substrate 21 (light-transmissive substrate 1, 2) using techniques such as spincoating, screen printing and roll coating, and then post-baked.

When forming a color-filter layer (color-filter layer 34) on the light-transmissive substrate 21, the color-filter layer is first formed on the light-transmissive substrate 21, and then the photosensitive resin material 61 is placed on the color-filter layer. In this case, if a film of the photosensitive resin material 61 is substituted for the overcoat film of the color-filter layer, there is no need to separately form the overcoat film, thereby reducing the number of fabrication steps. Examples of the photosensitive resin material 61 include polyester resin materials, acrylic resin materials, and styrene resin materials. However, the photosensitive resin material 61 is not necessarily limited to these materials.

Thereafter, a photoresist 62 is applied to the photosensitive resin material 61 by spincoating, and then exposed to light from the light-transmissive substrate 21 side through a photomask. Subsequently, development, washing, drying and post-bake are carried out to form 240-nm-thick insulating films 63 (insulating films 41, 52) in stripes from a photosensitive resin material 61 as shown in FIG. 12(b).

By forming the insulating films 63 from the photosensitive resin material 61, it is possible to simultaneously perform the step of patterning the photoresist 62 to form stripe patterns and the step of etching the photosensitive-resin material 61 to form stripe insulating films 63. Hence, the time taken for fabrication and the number of fabrication steps decrease, resulting a lowering of the fabrication cost.

Thereafter, a conductive material film 64 is formed as shown in FIG. 12(c) while leaving the photoresist 62 on the insulating films 63. At this time, first, ITO or Ta is deposited on the light-transmissive substrate 21 and the photoresist 62 by sputtering or EB evaporation to form a 20-nm-thick first film 64a.

Subsequently, a 200-nm-thick second film 64b made of Cu, Al or an alloy thereof, and a 20-nm-thick third film 64c made of ITO or Ta are deposited on the first film 64a.

Examples of the method for depositing the second film 64b include sputtering evaporation, EB evaporation, and plating methods. In this embodiment, the plating methods are preferred because a thick second film 64b can be easily formed without causing a peeled-off layer and cloudiness of the metal by plating. Examples of the plating methods include electroplating and non-electroplating.

When forming the second film 64b by such a plating method, the second film 64b can be formed without removing the first film 64a on the photoresist 62. However, by forming the second film 64b by, for example, electroplating after lifting off the first film 64a on the photoresist 62, it is possible to selectively deposit the second film 64b on the first film 64a formed between the insulating films 63.

When depositing the second film 64b and third film 64c by sputtering or EB evaporation, the photoresist 62 is lifted off together with the first film 64a, second film 64b and third film 64c thereon. Consequently, as shown in FIG. 12(d), a conductive line 65 (conductive line 11, 51) is formed between adjacent insulating films 63 so that the surfaces of the conductive line 65 forms a plane surface with the surfaces of the insulating films 63. The conductive line 65 (conductive line 11, 51 ) has the three-layer structure in which the first layer 65a (first layer 11a, 51a) of the first films 64a, second layer 65b (second layer 11b, 51b) of the second films 64b, third layer 65c (third layer 11c, 51c) of the third films 64c are placed in this order on the light-transmissive substrate 21.

Next, as illustrated in FIG. 12(e), an ITO film 66 as a transparent conducting film is deposited on the entire surface of the insulating films 63 and the conductive lines 65 by sputtering or EB evaporation. Furthermore, the ITO film 66 is coated with the photoresist 67 by spincoating. The photoresist 67 is patterned to form stripe patterns which are parallel to the conductive lines 65 and separated on the insulating films 63 by photolithography using a photomask for forming the ITO electrodes (transparent electrodes) and an ultraviolet-ray exposure device.

Subsequently, the ITO film 66 is etched by immersing the light-transmissive substrate 21 having the ITO film 66 and the photoresist 67 formed thereon in a hydrobromic acid whose temperature has been adjusted at 35° C. for 10 minutes.

Thereafter, by removing the photoresist 67, transparent electrodes 68 (signal electrodes 3, scanning electrodes 5) made of the ITO film 66 are formed in stripes on the insulating films 63 and the conductive lines 65 so that the transparent electrodes 68 are parallel to and in contact with the conductive lines 65 as shown in FIG. 12(f).

Next, an insulating film (insulating film 4, 6) is formed from $SiO_2$, SiN, etc. on the light-transmissive substrate 21 having the transparent electrodes 68 formed thereon. Additionally, a polyimide alignment film (alignment film 7, 8) is formed on the insulating film, and a uniaxial aligning treatment is applied to the polyimide alignment film by rubbing. By placing the above-mentioned electrode substrate to face another piece of electrode substrate fabricated in the same manner as above with spacers therebetween and by injecting the ferroelectric liquid crystal therebetween, a liquid crystal display element is fabricated.

This liquid crystal display element can be constructed by forming an insulating light-blocking film made of, for example, Si between the transparent electrodes 68 so as to form a plane surface with the transparent electrodes 68. For example, if the light-blocking film is formed by the lifting-off process mentioned in Embodiment 1, it is possible to fabricate a liquid crystal display element in which the unevenness of the surface of the electrode substrate is further reduced.

In the structure of this embodiment, since there is no unevenness of surface due to the formation of the conductive lines 65, it is possible to realize a liquid crystal display element capable of providing good displays of uniform characteristics. Therefore, the disorderly alignment of liquid crystal caused by such unevenness is prevented, and the display quality is significantly improved. Moreover, in this structure, it is possible to significantly decrease the electrode resistance without causing a short circuit, reduce a temperature variation in the cell due to the generation of heat and the rounding of the waveform of a drive signal applied to the pixel area, and suppress a lowering of the surface potential.

Consequently, as shown in FIG. 10, even when a gray-scale display is provided by changing the width of the signal electrodes 3 and the width of the scanning electrodes 5, it is possible to display good still images and moving images without causing visible defects such as gray-scale defects.

Furthermore, in this embodiment, since the contact layer (first layer 65a) of the conductive line 65 shown in FIG. 12(d) which is in contact with the light-transmissive substrate 21 or the color-filter layer (color-filter layer 34) is made of Ta or ITO, the adhesion between the conductive line 65 and the light-transmissive substrate 21, the color-filter layer or the insulating film 63 is improved. Ta and ITO have excellent adhesion properties with respect to almost all materials used as materials for typical color-filter layers or photosensitive resin materials.

Additionally, in this embodiment, since the topmost layer (third layer 65c) of the conductive line 65 is made of Ta or ITO, it is possible to prevent the surface of the conductive line 65 from being damaged by oxidation and rubbing.

In this embodiment, the color-filter layer (color-filter layer 34) can be formed as the need arises. Namely, it is not necessarily to include the color-filter layer.

Furthermore, like Embodiment 2, in this embodiment, it is preferred to adopt a structure in which recessions are formed on a surface of the light-transmissive substrate 1 (light-transmissive substrate 21), whereon the conductive lines 11 (conductive lines 65) are to be formed, and part of each conductive line 11 is buried in the recession. In this structure, the resistance can further be reduced by an amount corresponding to an increase in the film thickness of the conductive lines 11.

A method of fabricating an electrode substrate of this embodiment includes the steps of: forming an insulating material film (made of the photosensitive resin material 61) on the light-transmissive substrate 21; forming stripe patterns using the photoresist 62 on the insulating material film; etching the insulating material film to form insulating films 63 in stripe patterns; forming the conductive material film 64 on the light-transmissive substrate 21 having the insulating films 63 formed thereon without removing the photoresist 62; forming a conductive line 65 made of the conductive material film 64 between the separated insulating films 63 by removing the photoresist 62 together with the conductive material film 64 formed thereon; forming a transparent electrode material film (ITO film 66) on the insulating film 63 and the conductive line 65; forming stripe patterns using the photoresist 67 on the electrode material film so that the patterns of the photoresist 67 are parallel to the conductive lines 65 and separated from each other on each of the discrete insulating films 63; and etching the electrode material film to form transparent electrodes 68 in stripes.

In this fabrication method, the insulating films 63 are formed in stripes using the photoresist 62, and the conductive material film 64 is formed on the light-transmissive substrate 21 without removing the photoresist 62, and then the conductive line 65 is formed by the lifting-off process. Therefore, pattern errors can never occur. Moreover, since the conductive line 65 and the insulating film 63 are formed so that the surface of the insulating film 63 and the surface of the conductive line 65 form a plane surface, it is possible to prevent the unevenness of surface due to the formation of the conductive lines 65. It is thus possible to prevent disorderly alignment due to the unevenness, and a short circuit. As a result, a liquid crystal display element capable of displaying good images of uniform characteristics is realized.

In the above-mentioned fabrication method, since the photosensitive resin material 61 is used as the insulating material for forming the insulating material film, the step of forming stripe patterns using the photoresist 62 on the insulating material film and the step of etching the insulating material film to form the insulating films 63 in stripes can be performed simultaneously. It is therefore possible to decrease the fabrication time, the number of fabrication steps, and the fabrication cost.

Moreover, in this fabrication method, the conductive line 27 is formed to include a layer made of at least one kind of metal selected from copper, aluminum, and alloys thereof, and a plating method is employed as a method for forming the conductive material film 64. Since the plating method is used for forming the conductive material film 64, the conductive material film 64 can be formed easily without causing a peeled-off layer and cloudiness on the surface thereof. It is thus possible to easily form the conductive material film with a predetermined thickness.

Embodiment 5

The following description will explain Embodiment 5 of the present invention with reference to FIGS. 13 to 17. For the sake of explanation, the elements having the same function as those in Embodiments 1 to 4 will be designated by the same reference numbers and the explanation thereof will be omitted.

Figure 13:
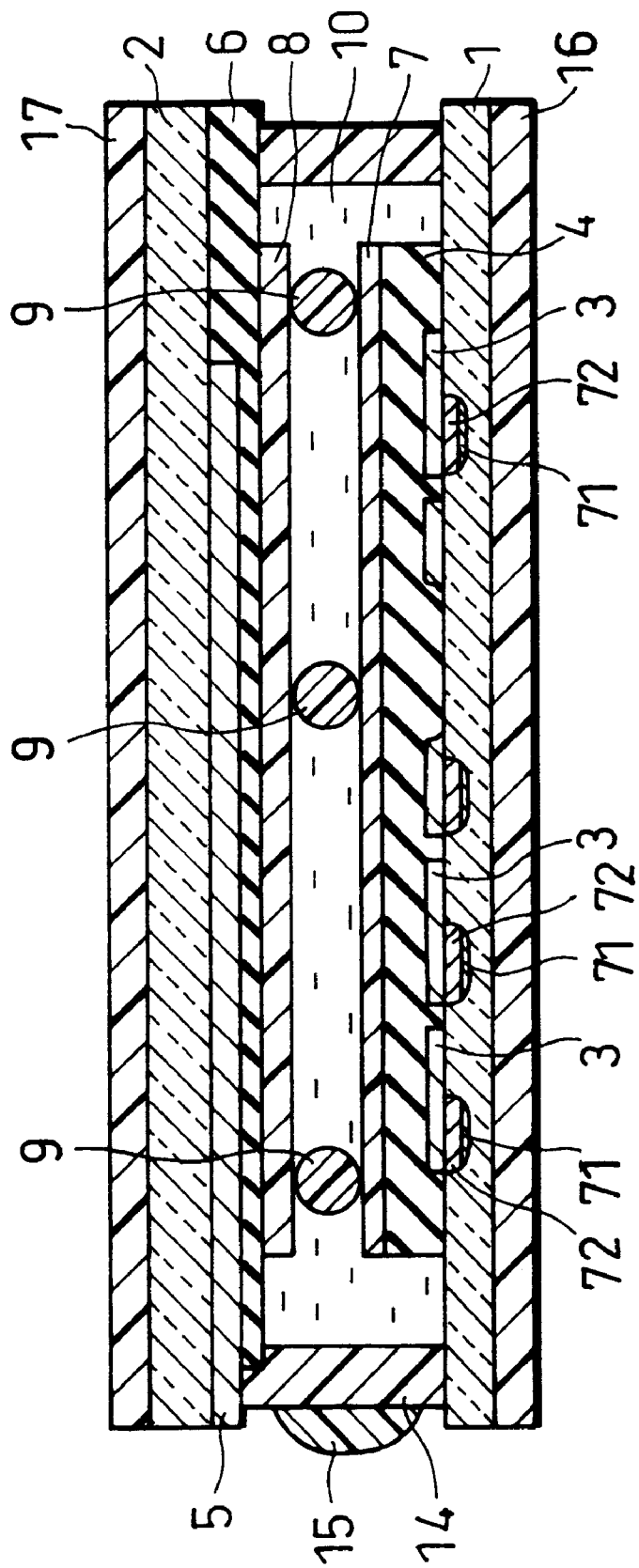
FIG. 13 is a sectional view showing the structure of a liquid crystal display element according to Embodiment 5 of the present invention.

As illustrated in FIG. 13, a liquid crystal display element of this embodiment includes two pieces of light-transmissive substrates 1, 2 which are placed to face each other. On a surface of the light-transmissive substrate 1, the signal electrodes 3 (transparent conductive films) are arranged parallel to each other, and the transparent insulating film 4 is layered on the signal electrodes 3. On the other hand, on a surface of the light-transmissive substrate 2, the transparent scanning electrodes 5 (transparent conductive films) are arranged parallel to each other so that the scanning electrodes 5 and the signal electrodes 3 cross each other at right angles. The scanning electrodes 5 are covered with the transparent insulating film 6. The alignment films 7 and 8 are formed on the insulating films 4 and 6, respectively.

The light-transmissive substrate 1 having the signal electrodes 3, insulating film 4 and alignment film 7 formed thereon and the light-transmissive substrate 2 having the scanning electrodes 5, insulating film 6 and alignment film 8 thereon are placed to face each other with a predetermined space (cell gap) therebetween and fastened together by a sealing material 14. The space between the light-transmissive substrates 1, 2 is filled with a liquid crystal material such as ferroelectric liquid crystal, thereby forming the liquid crystal layer 10. The liquid crystal layer 10 is sealed in the space by introducing the liquid crystal through an inlet port formed in the sealing material 14, and closing the inlet port with a closing material 15. The light-transmissive substrates 1 and 2 are sandwiched between polarizing plates 16 and 17 which are placed so that the polarization axes thereof cross at right angles with each other.

Additionally, the light-transmissive substrate 1 has conductive intermediate layers 71 and metal line layers 72 buried under the lower surfaces of the signal electrodes 3. On the other hand, the light-transmissive substrate 2 is provided with conductive intermediate layers and metal line layers buried under the lower surfaces of the scanning electrodes 5 like the conductive intermediate layers 71 and metal line layers 72.

The metal line layers 72 serving as the metal lines are formed on the conductive intermediate layers 71 by a plating method (electroplating). The metal line layers 72 are made flat to form a plane surface with the light-transmissive substrate 1. As the material for the metal line layer 72, although copper is preferred in terms of the cost and resistivity, it is possible to use silver, gold, nickel, etc. However, the use of silver or gold presents a drawback, namely an increase in the cost. Meanwhile, the drawback of nickel is that a film with a thickness of more than 6 $\mu$m needs to be formed in order to obtain a desired wiring resistance because the resistivity of nickel is high. Whereas the resistance of copper is the second lowest among the above-mentioned metals, and the cost of copper is lower than silver or gold.

The conductive intermediate layer 71 is provided in order to strengthen the adhesion between the light-transmissive substrate 1 and the metal line layers 72, and formed by sputtering or evaporation. As described in Embodiment 3, in general, the light-transmissive substrates 1, 2 such as glass do not have high adhesion properties with respect to metal materials (particularly copper) used for forming the metal line layer 72. Therefore, the conductive intermediate layer 71 is made of a metal, metal oxide, and combination of metal and metal oxide, which has good adhesion properties with respect to both of the light-transmissive substrate 1 and the metal line layer 72.

Preferred examples of the metal include nickel and chrome, and suitable examples of the metal oxide include ITO, and tin oxide. A thin film formed by the metal oxide has good adhesion properties with respect to the light-transmissive substrate, but does not have so good adhesion properties with respect to the metal material used for forming the metal line layer 72 by the plating method. On the other hand, a metal thin film formed by sputtering and evaporation has good adhesion properties with respect to the metal material. Therefore, the conductive intermediate layer 71 formed by a combination of the metal and metal oxide can further improve the adhesion between the metal line layer 72 and the light-transmissive substrates 1, 2.

As described above, it is preferred to form the conductive intermediate layer 71 by a metal, metal oxide, or combination thereof. It is therefore possible to select a material which has good adhesion properties with respect to both of the material of the light-transmissive substrate 1 and the material of the metal line layer 72 from metals, metal oxides and combinations thereof. As a result, the fixity of the metal line layer 72 can be further improved.

Additionally, by selecting a material for the conductive intermediate layer 71 according to the material of the light-transmissive substrates 1, 2 and the material of the metal line layer 72, it is possible to achieve good adhesion between the conductive intermediate layer 71 and the light-transmissive substrates 1, 2 and metal line layer 72.

Figure 14:
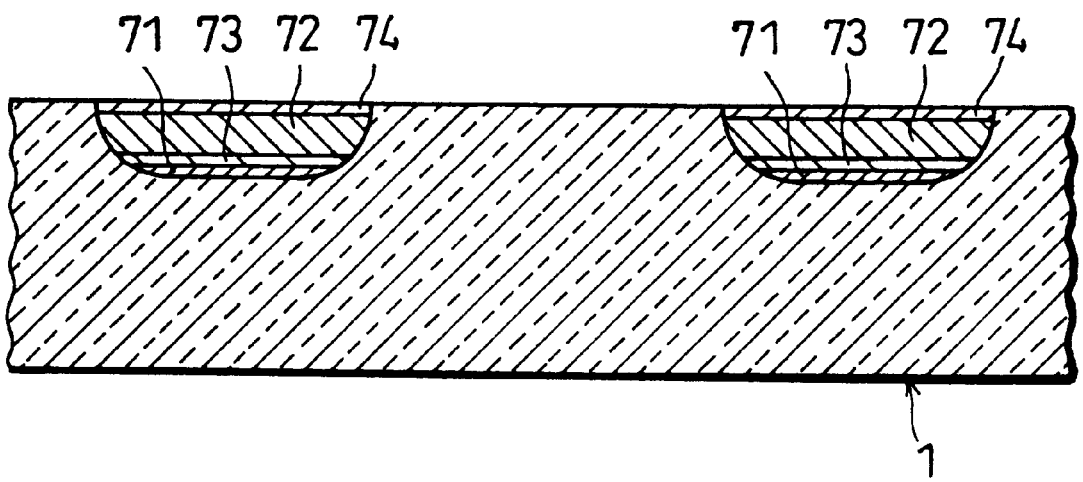
FIG. 14 is a sectional view showing an example of the structure including a conductive intermediate layer and a metal line layer of the liquid crystal element of FIG. 13.

Moreover, as shown in FIG. 14, it is preferred to form coating layers 73, 74 made of a metal which is hard to oxide in the space between the conductive intermediate layer 71 and the metal line layer 72 made of copper and on the surface of the metal line layer 72. Copper is easy to oxide, and therefore the oxidization thereof is prevented by coating copper with the coating layers 73, 74 having oxidation retardant properties.

The coating layer 73 is formed by sputtering or evaporation like the conductive intermediate layers 71. Whereas the coating layer 74 is formed by a plating method like the metal line layers 72. As the material for the coating layers 73, 74, nickel is preferred because nickel can be deposited by either sputtering or electroplating, and the coating layer 73 made of nickel also functions as the conductive intermediate layer 71. Another example of material for the coating layers 73, 74 is silver. However, the suitability of silver for the conductive intermediate layer 71 is lower than nickel, and silver is more expensive than nickel.

Next, the following description will explain the processes of forming the conductive intermediate layers 71 and the metal line layers 72 on the light-transmissive substrate 1. In this embodiment, in order to form the conductive intermediate layers 71 and the metal line layers 72, methods using ion bombardment and lift-off techniques are employed.

The processes of forming the conductive intermediate layer 71 and the metal line layer 72 on the light-transmissive substrate 1 will be explained below. The same processes can be used for the formation of the respective members on the light-transmissive substrate 2, and therefore the explanation for the light-transmissive substrate 2 is omitted here.

In the method using ion bombardment, first, as illustrated in FIG. 15(a), a photoresist 81 is applied to the light-transmissive substrate 1, and patterns 81a parallel to the signal electrodes 3 are produced by applying a predetermined patterning operation to areas where the conductive intermediate layers 71 and the metal line layers 72 are to be formed. Next, as shown in FIG. 15(b), the light-transmissive substrate 1 is etched through the photoresist 81. As a result, grooves 1b having curved tapered faces on both sides are formed on the light-transmissive substrate 1.

Subsequently, as shown in FIG. 15(c), a conductive material 82 is deposited by sputtering or evaporation. At this time, when a combination of a metal and a metal oxide is used as the conductive material 82, a metal oxide film which has higher adhesion properties with respect to the light-transmissive substrate 1 is formed, and then a metal film is formed on the metal oxide film. As a result of the deposition of a film of the conductive material 82, the entire surfaces of grooves 1b are coated with the conductive material 82. The conductive material 82 in the grooves 1b serves as the conductive intermediate layer 71.

Thereafter, the conductive material 82 formed on the tapered faces (side faces) of the grooves 1b is removed by ion bombardment. As a result, as shown in FIG. 15(d), the conductive intermediate layer 71 is flattened. In this fabrication step, the film thickness of the conductive material 82 is entirely reduced by ion bombardment. However, since the conductive material 82 on the side faces of the grooves 1b is thinner than the conductive material 82 deposited on the photoresist 81 and the bottom faces (flat faces) of the grooves 1b, it is removed first.

Next, as shown in FIG. 15(e), the photoresist 81 is removed together with the conductive material 82 thereon by the lift-off technique. Furthermore, as illustrated in FIG. 15(f), the metal line layers 72 are formed by depositing copper, etc. in the grooves 1b by electroplating. Finally, as shown in FIG. 15(g), the signal electrodes 3 are formed on the light-transmissive substrate 1 to cover the metal line layers 72.

In each groove 1b, the conductive intermediate layer 71 as the base layer of the metal line layer 72 is formed on the flat bottom face and part of the side faces of the groove 1b. Consequently, a substantially flat metal line layer 72 is produced though both edges thereof slightly protrude along the side faces of the groove 1b.

In this method, when the conductive intermediate layer 71 formed on the side faces of the grooves 1b is removed by ion bombardment, the surface of the conductive intermediate layer 71 is scraped off, and thus excessive conductive intermediate layer 71 is removed. Therefore, the number of processing steps is less than that of a method using the lift-off technique to be described later. It is thus possible to simplify the fabrication process of an electrode substrate for use in a liquid crystal display element.

However, since ion bombardment scrapes off the entire surface of the conductive material 82 from its surface, if the conductive material 82 is deposited in the same thickness as that formed by the method using the lift-off technique, the conductive intermediate layer 71 becomes thinner. Therefore, in order to form the conductive intermediate layer 71 in a desired thickness, it is necessary to deposit the conductive material 82 thicker than the desired thickness. Moreover, since an ion bombardment device is polluted by ion bombardment, it is necessary to clean and maintain the device.

On the other hand, in the method using the lift-off process, as shown in FIGS. 16(a) and 16(b), like the method using ion bombardment, the photoresist 81 is deposited on the light-transmissive substrate 1 to form the patterns 81a, and then the light-transmissive substrate 1 is etched (see FIGS. 15(a) and 15(b)). As a result, the grooves 1b having curved tapered faces on both sides are formed on the light-transmissive substrate 1.

Next, the photoresist 81 is removed as illustrated in FIG. 16(c), and the photoresist 83 is applied again as shown in FIG. 16(d). Then, the photoresist 83 is patterned so as to remove the photoresist 83 only from the bottom faces of the grooves 1b.

Subsequently, as illustrated in FIG. 16(e), the conductive material 82 is deposited by sputtering or evaporation. Furthermore, as shown in FIG. 16(f), the conductive material 82 is removed by lifting off the conductive material 82 together with the photoresist 83 on the conductive material 82. As a result, the conductive material 82 remains only on the bottom faces of the grooves 1b, thereby forming the conductive intermediate layer 71. Such a conductive intermediate layer 71 has a plate-like shape with raised parts on both sides thereof.

Thereafter, like the method using ion bombardment, the metal line layers 72 are formed by electroplating as shown in FIG. 16(g). Then, as shown in FIG. 16(h), the signal electrodes 3 are formed on the light-transmissive substrate 1 to cover the metal line layers 72.

In each groove 1b, the conductive intermediate layer 71 as the base layer of the metal line layer 72 is produced on the flat bottom face of the groove 1b. Consequently, a substantially flat metal line layer 72 is formed though both edges thereof lying along the side faces of the groove 1b are slightly recessed.

As described above, when the conductive intermediate layer 71 formed on the side faces of the grooves 1b is removed the lift-off technique, since the surface of the conductive material 82 (conductive intermediate layer 71) is not scraped off unlike ion bombardment though the number of processing steps increases compared to the above-mentioned method using ion bombardment. Therefore, there is no need to make the conductive material 82 thick. Moreover, unlike ion bombardment, since a lift-off device is not polluted, it is not necessary to clean and maintain the device. As a result, the material is not wasted, and the maintainability is improved.

In the methods using ion bombardment and lift-off techniques, the metal line layer 72 is formed by electroplating. With the use of electroplating, since plating is made only on the conductors, it is possible to selectively form the metal line layers 72 only on the conductive intermediate layers 71 formed on the bottom faces of the grooves 1b.

Another example of the plating method is non-electroplating. However, it is difficult to selectively plate the conductive intermediate layer 71 by non-electroplating.

By the way, the thickness of the metal line layer 72 is determined by the resistivity of a metal as a material of the metal line layer 72 and a required value of wiring resistance. In the case of a large liquid crystal display element of about 40 inches, a 0.01 to 0.03 Ω/□ sheet resistance is required as to be described later.

Here, the sheet resistance r [Ω/□] is given by $$r = \rho/d$$

where ρ is the resistivity [μΩcm] and d is the thickness [cm] of the metal line layer 72. When ρ and r are determined, a required thickness is given by $$d = \rho/r$$

When the metal line layer 72 is formed using copper as a metal, ρ is 2 μΩcm. Therefore, if this value is made the lower limit of the resistivity ρ, when r is 0.01 Ω/□, d is given by $$d = 2\ [\mu\Omega cm]/0.01\ [\Omega/\square] = 200 \times 10^{-6} [cm] = 2\ [\mu m]$$

according to the above-mentioned equation. When r is 0.03 [Ω/□], d is given by $$d = 2\ [\mu\Omega cm]/0.03\ [\Omega/\square] \approx 0.7\ [\mu m]$$

according to the above-mentioned equation. When another metal line layer 72 is formed using copper as a metal and a plating solution different from that used for the formation of the above-mentioned metal line layer 72, ρ is 6 [μΩm]. Therefore, if this value is made the upper limit of resistivity ρ, when r is 0.01 [Ω/□], d is given by $$d = 6\ [\mu\Omega cm]/0.01\ [\Omega/\square] = 6\ [\mu m]$$

according to the above-mentioned equation. When r is 0.03 [Ω/□], d is given by $$d = 6\ [\mu\Omega cm]/0.03\ [\Omega/\square] = 2\ [\mu m]$$

according to the above-mentioned equation.

A required value of d is within a range of 0.7 to 6 μm according to the above calculations. However, when d is less than 1 μm, the metal line layer 72 can be formed by not only the plating method but also other film formation techniques such as sputtering. In short, when the metal line layer 72 is formed by the plating method, the value of d is within a range of from 1 to 6 μm.

By satisfying the above-mentioned conditions, it is possible to ensure a wiring resistance suitable for a large liquid crystal display element and form the metal line layer 72 with a thickness suitable for plating. Therefore, a large liquid crystal display element with good display quality can be easily provided.

When the value of resistance of the metal line layer 72 is high, the waveform of a drive voltage applied to the liquid crystal (applied voltage) is distorted. Consequently, the liquid crystal cannot be driven in a desired manner. Therefore, as described above, the required value of sheet resistance is determined within a range of 0.01 to 0.03 Ω/□ through the following processes.

First, the distortion of the waveform of the drive voltage is simulated by calculation under certain conditions (display size, cell structure, drive method and values of physical properties of the liquid crystal). For example, when a waveform with less distortion like the one shown in FIG. 17(a) and a waveform with great distortion like the one shown in FIG. 17(b) are obtained by the simulation, the waveforms are actually applied to the liquid crystal cell. As a result, it can be found that the liquid crystal is driven by the waveform shown in FIG. 17(a) but is not driven by the waveform shown in FIG. 17(b).

Figure 17A:
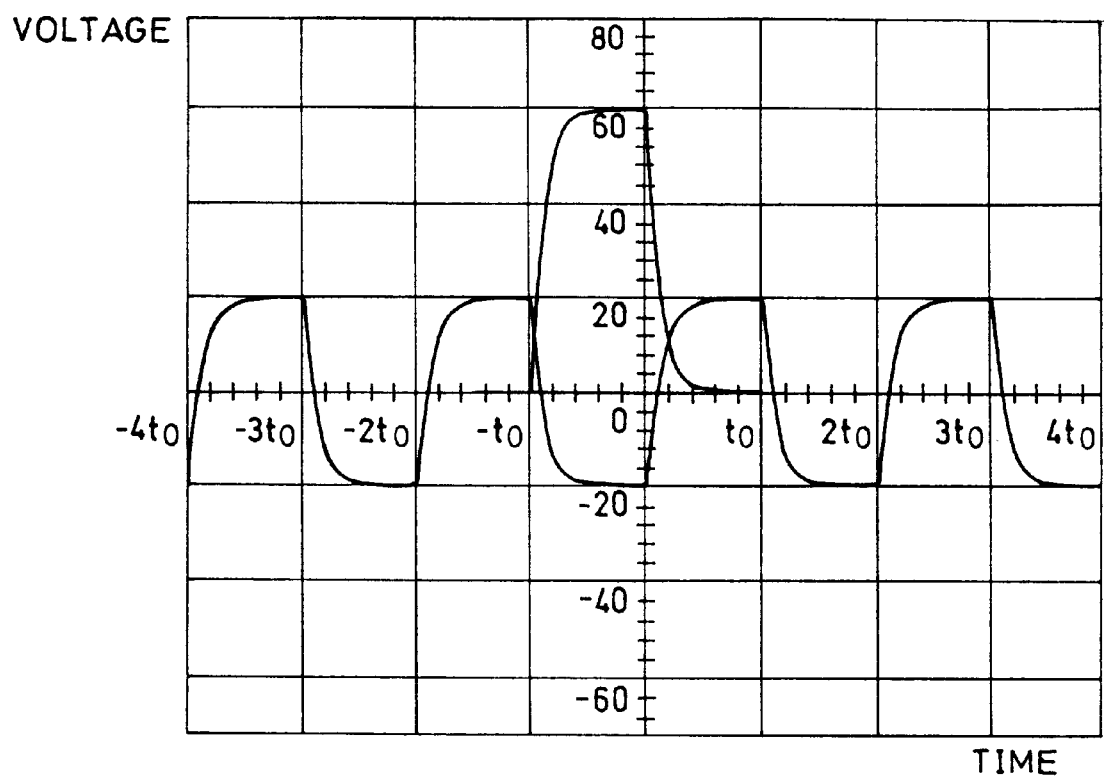
FIGS. 17(a) and 17(b) are waveform charts showing the waveform of a voltage applied to liquid crystal when determining a sheet resistance required for the metal line layer by simulation.
Figure 17B:
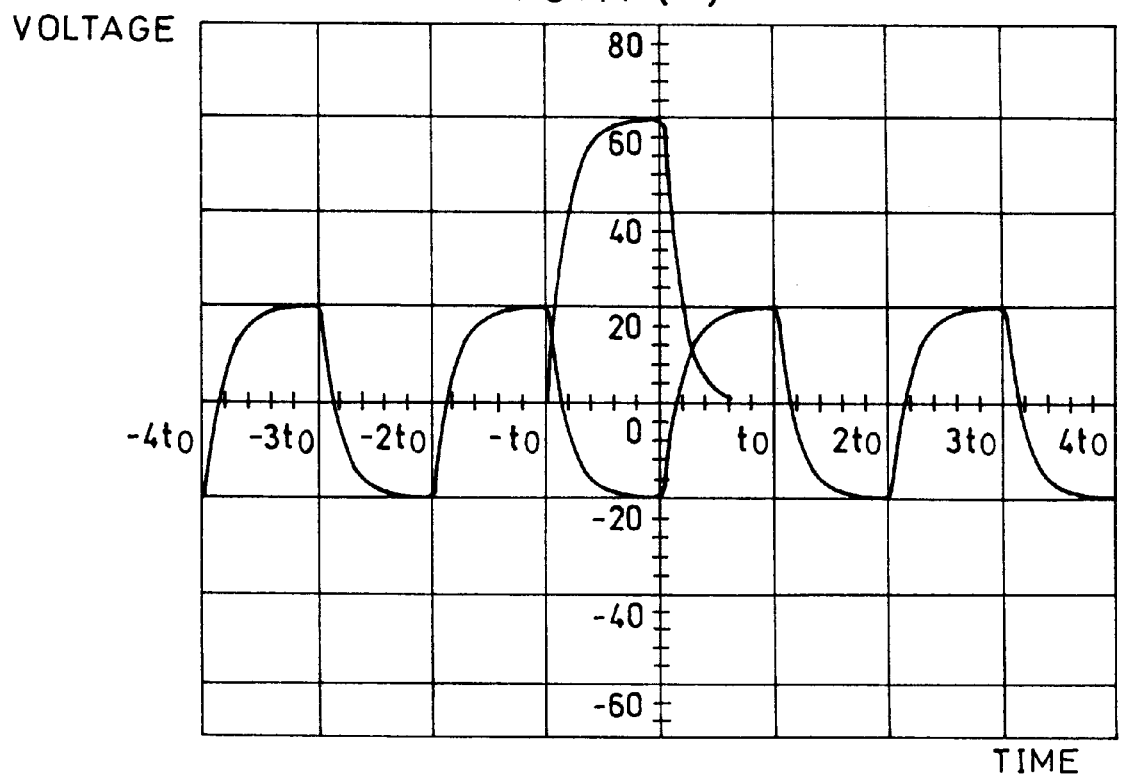
Figure 18:
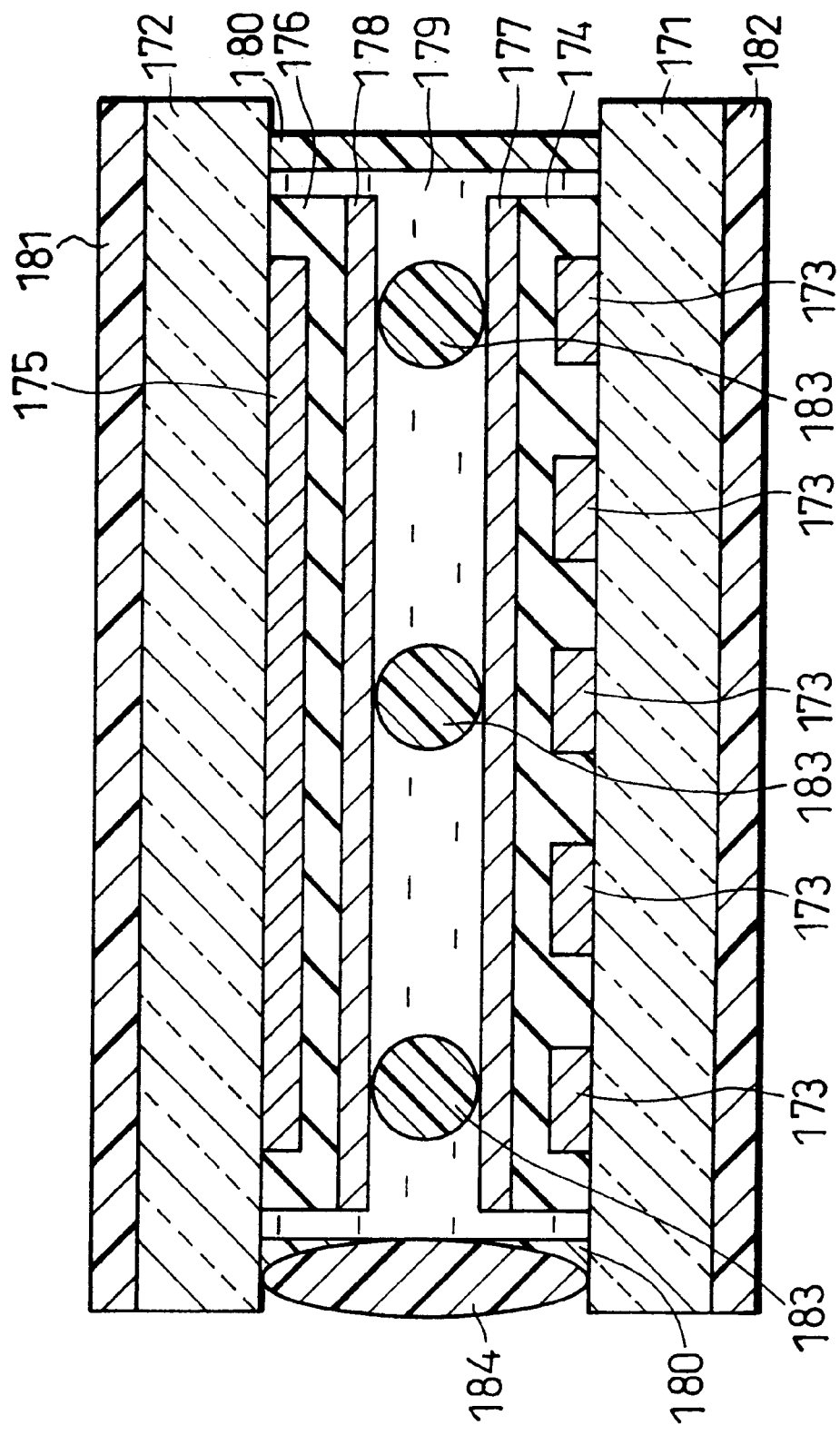
FIG. 18 is a sectional view showing a schematic structure of a conventional liquid crystal display element.
Figure 19:
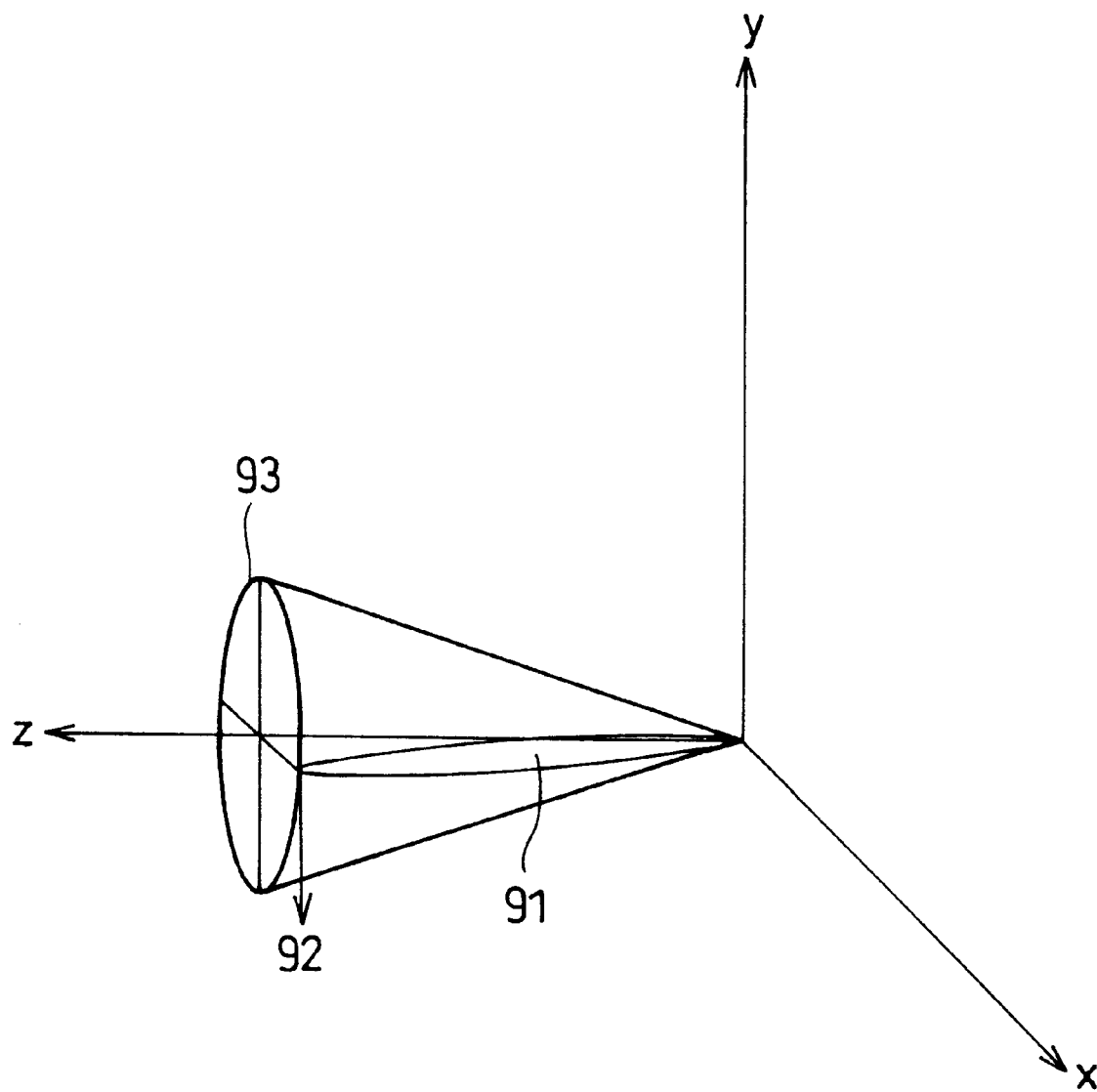
FIG. 19 is a view showing the response of a ferroelectric liquid crystal molecule to an electric field.
Figure 20:
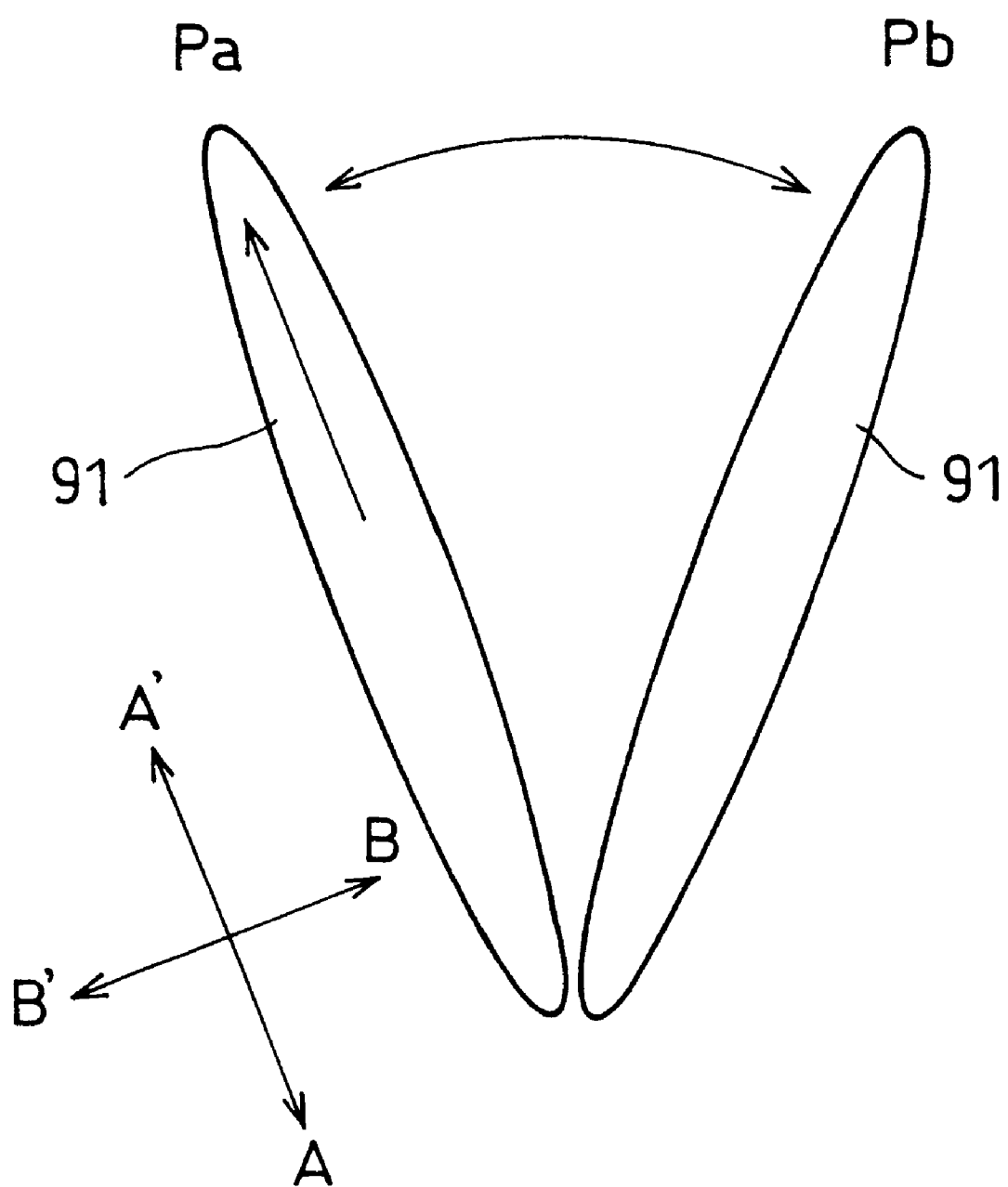
FIG. 20 is a view for explaining a state of switching the ferroelectric liquid crystal molecule.
Figure 21:
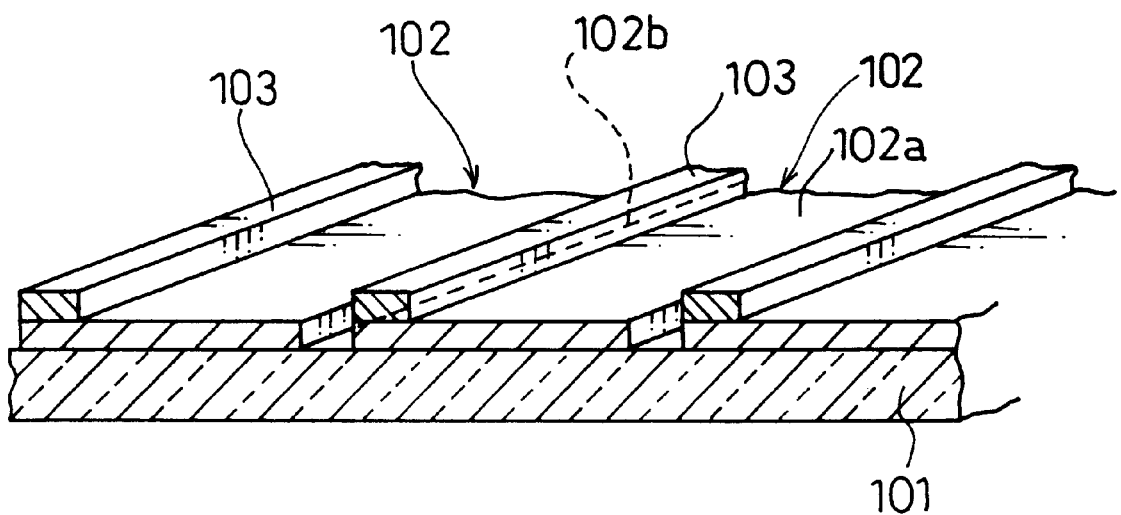
FIG. 21 is a sectional view showing the structure of an electrode substrate of a conventional liquid crystal display element where a conductive line is formed on a transparent electrode so that the conductive line lies along a longitudinal edge of the upper face of the transparent electrode.
Figure 22:
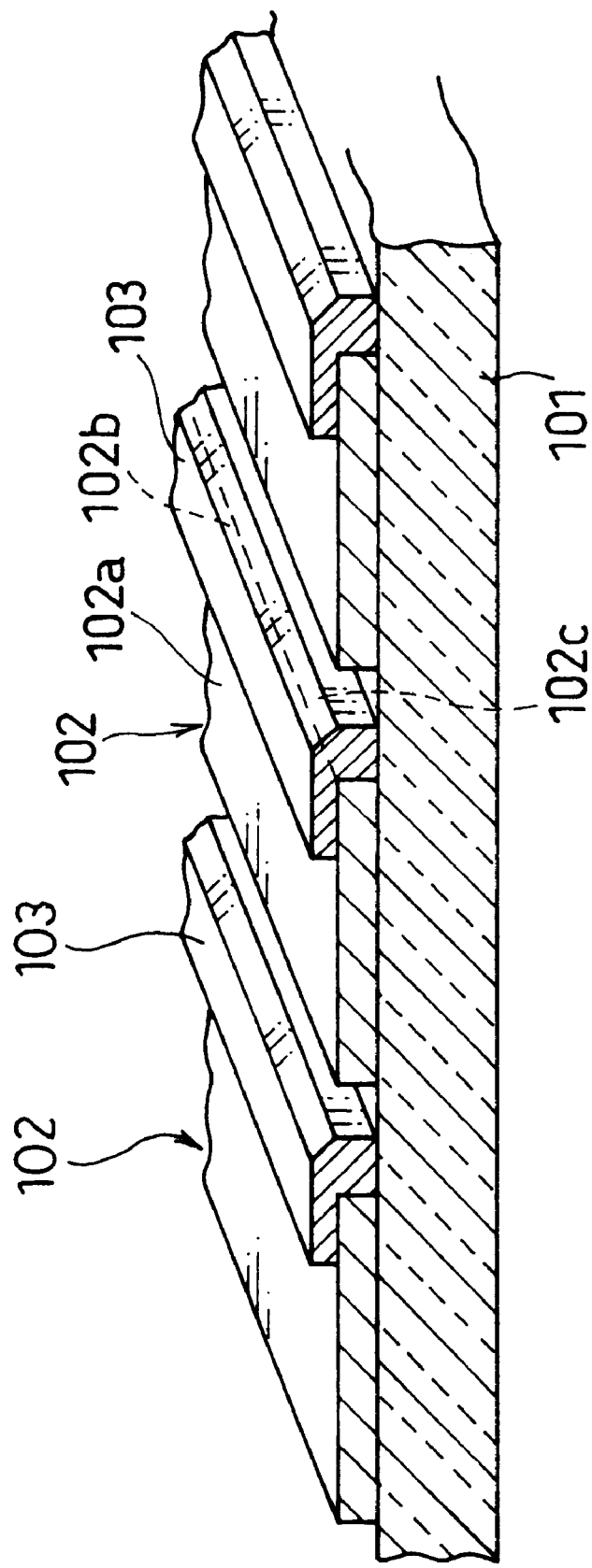
FIG. 22 is a sectional view showing the structure of an electrode substrate of a conventional liquid crystal display element where a conductive line is formed on a transparent electrode so that the conductive line lies along a longitudinal edge of the upper face of the transparent electrode and protrudes from the edge towards a side face of the transparent electrode.
Figure 23:
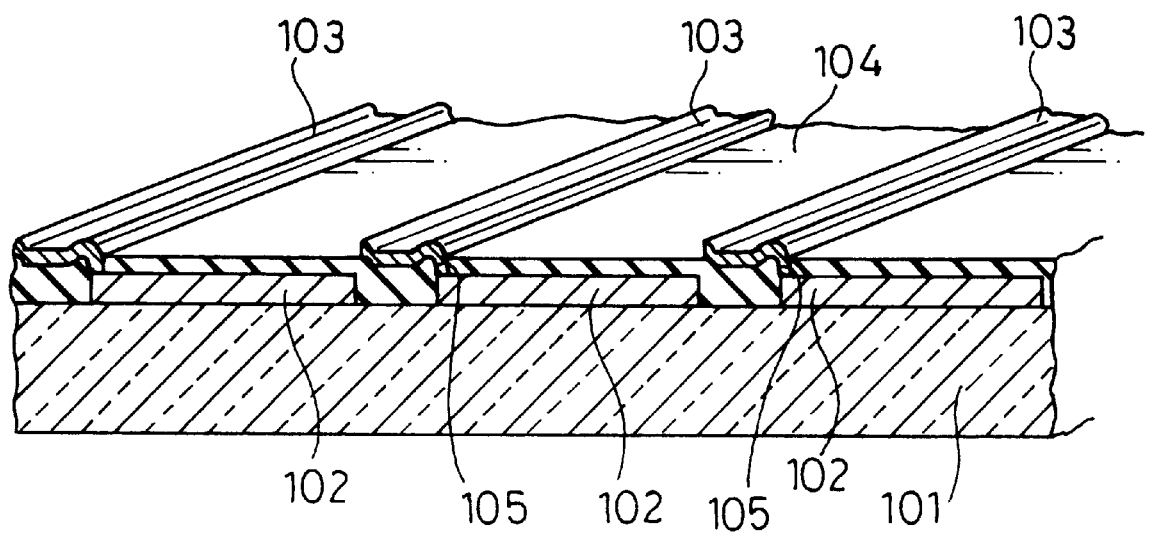
FIG. 23 is a sectional view showing the structure of an electrode substrate of a conventional liquid crystal display element where a transparent electrode formed on a light-transmissive substrate is in conductively contact with a conductive line through a through-hole in an insulating film.
Figure 24:
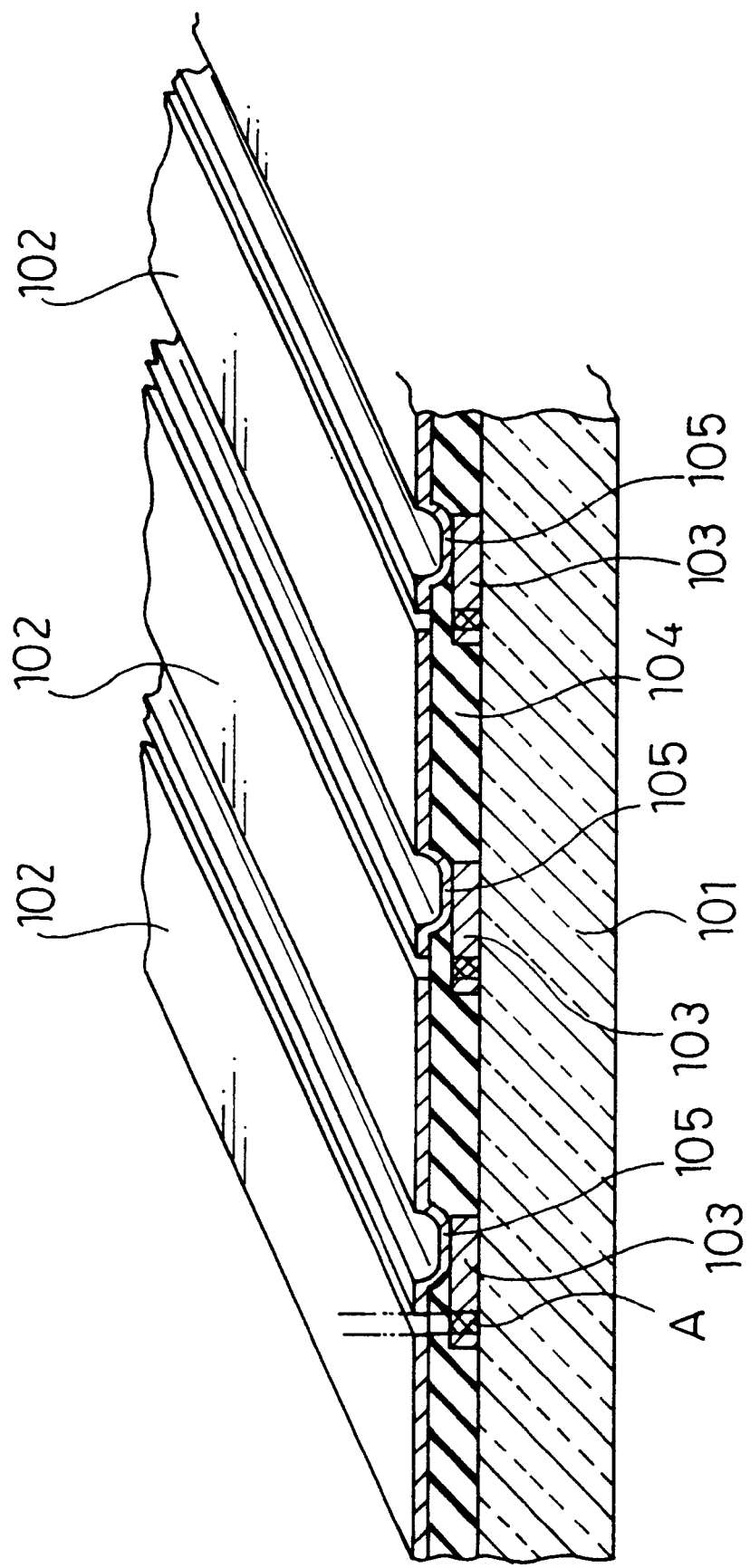
FIG. 24 is a sectional view showing the structure of an electrode substrate of a conventional liquid crystal display element where a conductive line formed on a light-transmissive substrate is in conductively contact with a transparent electrode through a through-hole in an insulating film.

In FIGS. 17(a) and 17(b), the a.c. waveform varying within a range of from −20 V to 20 V represents a voltage applied to the scanning electrode, and the waveform having an amplitude of 60 V in a period between $-t_0$ and $t_0$ is a voltage applied to the signal electrode. Here, $t_0$ is 17.36 μs.

The value of resistance of the metal line layer 72 when the waveform shown in FIG. 17(a) or 17(b) is obtained is calculated according to the above-mentioned simulation. Then, a required value of resistance is selected from a range between the value of resistance of the drivable waveform shown in FIG. 17(a) and the value of resistance of the non-drivable waveform shown in FIG. 17(b). Next, a required value of sheet resistance is calculated based on the dimensions of the metal line layer 72.

As described above, since the calculations in the above-mentioned processes include many variables (the above-mentioned conditions) and are complicated, it is difficult to simply obtain an optimum value of sheet resistance. Therefore, the value of sheet resistance obtained through the above-mentioned processes is defined as an approximate value which allows the liquid crystal display element to be driven normally under various conditions actually used.

Subsequently, the following description will explain specific examples of forming the conductive intermediate layer 71 and the metal line layer 72.

EXAMPLE 1

In this example, the conductive intermediate layers 71 and the metal line layers 72 are formed according to the above-mentioned method using ion bombardment.

First, the photoresist 81 is applied to a light-transmissive substrate 1 made of soda lime glass, and then patterning is performed as shown in FIG. 15(a) to produce the stripe patterns 81a with a width of 9 $\mu$m and a pitch of 120 $\mu$m from the photoresist 81 by exposure. Next, the light-transmissive substrate 1 having the photoresist 81 thereon is immersed in a 15 percent buffered hydrofluoric acid (buffered hydrofluoric acid No. 110 used for semiconductors, available from Daikin Industries, Ltd.) for 15 minutes so as to form grooves 1b with a depth of 5.5 $\mu$m and a width of 20 $\mu$m on the light-transmissive substrate 1 as shown in FIG. 15(b).

The buffered hydrofluoric acid is a mixture of hydrogen fluoride and ammonium fluoride as described in Embodiment 2.

After washing and drying the light-transmissive substrate 1, a 30-nm-thick ITO film as the conductive material 82 is deposited by sputtering, and then a 400-nm-thick copper film is deposited thereon (FIG. 15(c)). Thereafter, the conductive intermediate layer 71 formed in the grooves 1b is flattened by performing argon ion bombardment for 15 minutes at an argon pressure of $3 \times 10^{-3}$ Torr and an output of 300 W (FIG. 15(d)). Further, the photoresist 81 and the conductive material 82 thereon are removed together by the lift-off technique (FIG. 15(e)).

In the electroplating process, first, the light-transmissive substrate 1 is immersed in a diluted hydrochloric acid to remove an oxide film formed on the surface of copper (conductive intermediate layers 71). After washing the light-transmissive substrate 1 with pure water, an activating treatment is applied thereto. Thereafter, the metal line layers 72 are formed (FIG. 15(f)) by performing electroplating for 16 minutes in a copper plating solution C-100EP of Kojundo Chemical Laboratory Co., Ltd. at a plating temperature of 55° C. and a current density of 14.6 mA/cm$^2$. Next, the signal electrodes 3 are formed (FIG. 15(g)) according to a conventional process.

The metal line layer 72 thus formed has slight protrusions at the edges thereof on both sides, and forms a substantially plane surface with the light-transmissive substrate 1. The resistivity of the metal line layer 72 is 2.6 $\mu\Omega$cm, and the sheet resistance is $4.7 \times 10^{-3}$ $\Omega/\square$.

As described above, it is preferred to use a copper plating solution for the plating process. As a result, the metal line layers 72 are formed from copper. The resistance of copper is the second lowest among the above-mentioned metals, and the cost of copper is lower than silver or gold. It is therefore possible to fabricate an electrode substrate for use in a liquid crystal display element at low costs.

When flattening the conductive intermediate layer 71, the flatness of the conductive intermediate layer 71 can be improved by optimizing the conditions for ion bombardment. For example, the longer the ion bombardment time, the more the conductive material 82 is scraped off. Therefore, by increasing the ion bombardment time, the conductive material 82 deposited on the side faces of the grooves 1b can be surely removed.

Comparative Example

Figure 25A:
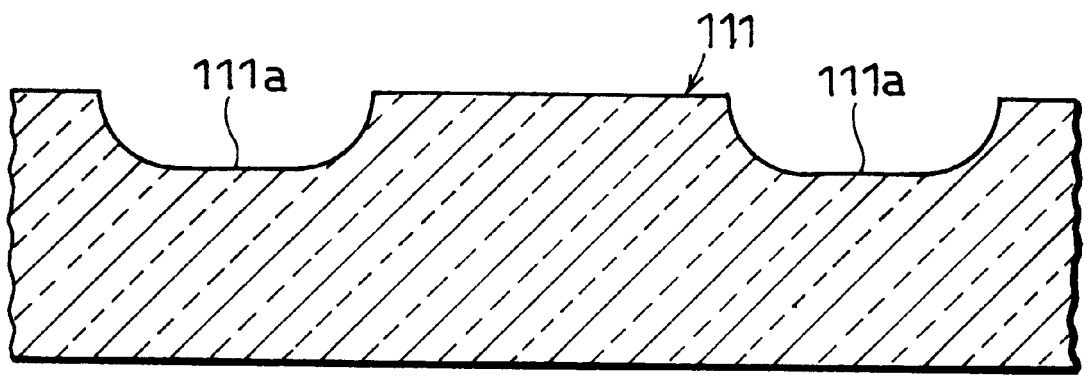
FIGS. 25(a) and 25(b) are flow diagrams showing a process of forming metal lines on a glass substrate of a conventional liquid crystal display element.
Figure 25B:
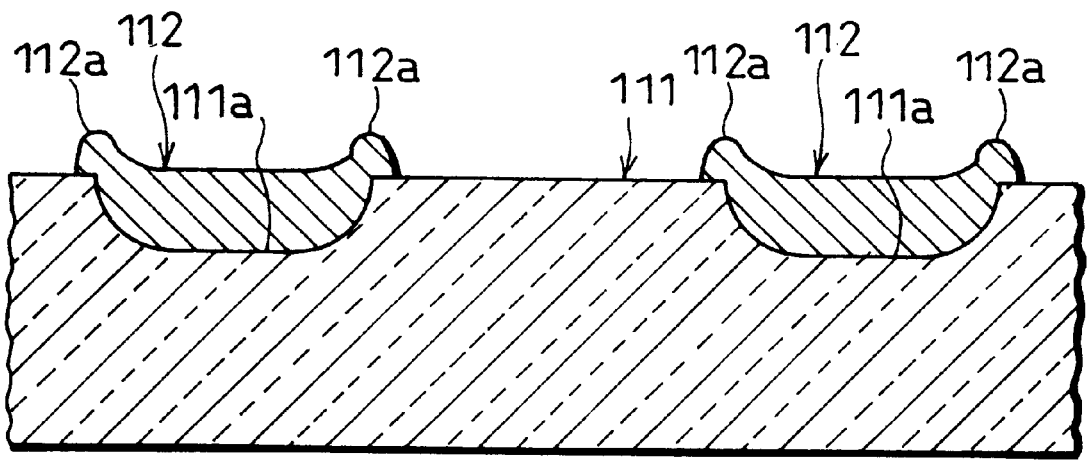

In this comparative example, a conductive intermediate layer is formed under the same conditions as in Example 1, and electroplating is performed using copper under the same conditions as in Example 1 from the state shown in FIG. 15(c) without performing argon ion bombardment. The resultant conductive intermediate layer has greatly raised edges on both sides, i.e., edges protruding greatly from grooves toward the surface of a light-transmissive substrate (see FIG. 25(b)).

EXAMPLE 2

In this example, the conductive intermediate layers 71 and the metal line layers 72 are formed according to the above-mentioned lift-off technique.

First, like Example 1, after forming 6-$\mu$m-deep grooves 1b on the light-transmissive substrate 1 made of soda lime glass (FIG. 16(b)), the photoresist 81 is removed (FIG. 16(c)). Next, a photoresist 83 is applied, and patterning is performed by exposing the photoresist 83 through the mask which is used for patterning the photoresist 81 so that only the bottom faces of the grooves 1b are exposed (FIG. 16(d)). Subsequently, a conductive material 82 is deposited (FIG. 16(e)) in the same manner as in Example 1, and the flat conductive intermediate layers 71 are formed (FIG. 16(f)) by removing unnecessary conductive material 82 by the lift-off technique.

The metal line layers 72 are formed (FIG. 16(g)) by performing electroplating with copper under the same conditions as in Example 1 except that the current density is 18 mA/cm$^2$, and the plating time is 20 minutes. Next, the signal electrodes 3 are formed (FIG. 16(h)) according to a conventional process.

The metal line layer 72 thus formed has slight recessions at the edges on both sides, and forms a substantially plane surface with the light-transmissive substrate 1. The resistivity of the metal line layer 72 is 2.6 $\mu\Omega$cm, and the sheet resistance is $4.3 \times 10^{-3}$ $\Omega/\square$.

EXAMPLE 3

In this example, like Example 1, 2-$\mu$m-deep grooves 1b are respectively formed on two pieces of light-transmissive substrate 1 made of soda lime glass (FIG. 15(b)). Next, ITO (metal oxide) as a conductive material 82 is deposited in a thickness of 100 nm on one of the light-transmissive substrates 1. Similarly, nickel (metal) as a conductive material 82 is deposited in a thickness of 100 nm on the other light-transmissive substrate 1 (FIG. 15(c)). Further, like Example 1, the conductive intermediate layers 71 are formed (FIG. 15(e)) by performing argon ion bombardment and lift-off processes in the same manner as in Example 1.

Then, the metal line layers 72 are formed (FIG. 15(f)) by performing electroplating with copper under the same conditions as in Example 1 except that the current density is 10 mA/cm$^2$ and the plating time is 8 minutes.

The metal line layers 72 thus formed on the respective light-transmissive substrates 1 have a flat surface like the metal line layers 72 formed in Example 1.

The amounts of protrusion and recession of the metal line layers 72 of Examples 1 to 3 and Comparative Example were measured as shown in Table 1. Although the depth of the groove 1b varies among Examples 1 to 3 and Comparative Example, Table 1 shows the values measured when the depth was set at a uniform value of 6 $\mu$m to ease the comparisons.

TABLE 1

|  | Protrusion | Recession |
| --- | --- | --- |
| Example 1 | Not more than 1 $\mu$m | — |
| Comparative Example | About 5 $\mu$m | — |
| Example 2 | — | Not more than 1 $\mu$m |
| Example 3 | Not more than 1 $\mu$m |  |

The invention being thus described, it will be obvious that the same may be varied in many ways. Such variations are not to be regarded as a departure from the spirit and scope of the invention, and all such modifications as would be obvious to one skilled in the art are intended to be included within the scope of the following claims.

What is claimed is:

1. A liquid crystal display element comprising:
   a pair of light-transmissive substrates;
   insulating films formed discretely on said light-transmissive substrates;
   transparent electrodes arranged to form predetermined patterns on said insulating films;
   conductive lines which are conductively in contact with said transparent electrodes, each conductive line including a first layer made of indium tin oxide which is adhesive to said light-transmissive substrate and being arranged between said insulating films so as to form a plane surface with said insulating films; and
   a liquid crystal layer formed between said light-transmissive substrates placed to face each other.

2. The liquid crystal display element as set forth in claim 1,
   wherein said conductive line includes a second layer which is made of a metal material whose resistance is lower than that of said first layer and placed on said first layer.

3. The liquid crystal display element as set forth in claim 2,
   wherein said second layer is made of at least one kind of metal material selected from copper, aluminum, and alloys thereof.

4. The liquid crystal display element as set forth in claim 2,
   wherein said conductive line includes a third layer which is made of a conductive material having higher hardness and oxidation retardant properties than said second layer and placed on said second layer.

5. The liquid crystal display element as set forth in claim 4,
   wherein said third layer is made of at least one of indium tin oxide and tantalum.

6. The liquid crystal display element as set forth in claim 4,
   wherein said third layer has a thickness within a range of from 0.005 $\mu$m to 1 $\mu$m.

7. The liquid crystal display element as set forth in claim 1, further comprising a color-filter layer provided between one of said light-transmissive substrates and said insulating films and conductive lines thereon,
   wherein said first layer of each of said conductive lines on said color-filter layer adheres to said conductive-filter layer instead of to said light-transmissive substrate.

8. The liquid crystal display element as set forth in claim 7,
   wherein said first layer has a thickness within a range of from 0.005 $\mu$m to 1 $\mu$m.

9. The liquid crystal display element as set forth in claim 7,
   wherein said conductive line includes a second layer which is made of a metal material whose resistance is lower than that of said first layer and placed on said first layer.

10. The liquid crystal display element as set forth in claim 9,
    wherein said second layer is made of at least one kind of metal material selected from copper, aluminum, and alloys thereof.

11. The liquid crystal display element as set forth in claim 9,
    wherein said conductive line includes a third layer which is made of a conductive material having higher hardness and oxidation retardant properties than said second layer and placed on said second layer.

12. The liquid crystal display element as set forth in claim 11,
    wherein said third layer is made of at least one of indium tin oxide and tantalum.

13. The liquid crystal display element as set forth in claim 11,
    wherein said third layer has a thickness within a range of from 0.005 $\mu$m to 1 $\mu$m.

14. The liquid crystal display element as set forth in claim 1,
    wherein said first layer has a thickness within a range of from 0.005 $\mu$m to 1 $\mu$m.

15. The liquid crystal display element as set forth in claim 1,
    wherein part of each conductive line is buried in said light-transmissive substrate.

16. The liquid crystal display element as set forth in claim 1,
    wherein said liquid crystal layer is made of a ferroelectric liquid crystal material.

* * * * *

UNITED STATES PATENT AND TRADEMARK OFFICE
CERTIFICATE OF CORRECTION

PATENT NO. : 6,008,877
DATED : December 28, 1999
INVENTOR(S) : Hisashi Akiyama et al.

It is certified that error appears in the above-identified patent and that said Letters Patent is hereby corrected as shown below:

<u>Title page,</u>
Item [73], Assignee, replace "Sharp Kabushiki Kaisha, Osaka, Japan" with
-- Sharp Kabushiki Kaisha, Osaka, Japan; The Secretary of State for Defence in Her Britannic Majesty's Government of the United Kingdom of Great Britian and Northern Ireland, the Defense Evaluation Research Agency, Farnborough Hants, United Kingdom --.

Signed and Sealed this

Third Day of February, 2004

JON W. DUDAS
*Acting Director of the United States Patent and Trademark Office*